United States Patent [19]

Kimura

[11] Patent Number: 5,552,734
[45] Date of Patent: Sep. 3, 1996

[54] LOCAL OSCILLATOR FREQUENCY MULTIPLIER AND MIXING CIRCUIT COMPRISING A SQUARING CIRCUIT

[75] Inventor: Katsuji Kimura, Tokyo, Japan

[73] Assignee: NEC Corporation, Tokyo, Japan

[21] Appl. No.: 329,324

[22] Filed: Oct. 26, 1994

[30] Foreign Application Priority Data

Oct. 27, 1993 [JP] Japan ................................ 5-268936
Dec. 15, 1993 [JP] Japan ................................ 5-343171

[51] Int. Cl.$^6$ .............................. G06F 7/44; G06G 7/12; H03B 19/00
[52] U.S. Cl. ........................ 327/356; 327/359; 327/563; 327/116
[58] Field of Search ........................ 327/116, 119, 327/356, 357, 359, 362, 563; 330/252, 253, 261; 364/841

[56] References Cited

U.S. PATENT DOCUMENTS

| | | | |
|---|---|---|---|
| 5,079,515 | 1/1992 | Tanimoto | 330/261 |
| 5,252,866 | 10/1993 | Kimura | 327/359 |
| 5,444,648 | 8/1995 | Kimura | 364/841 |

FOREIGN PATENT DOCUMENTS

| | | |
|---|---|---|
| 0489221 | 8/1992 | European Pat. Off. . |
| 4-240904 | 8/1992 | Japan . |
| 4-253409 | 9/1992 | Japan . |
| 2261130 | 5/1993 | United Kingdom . |

*Primary Examiner*—David C. Nelms
*Assistant Examiner*—Trong Phan
*Attorney, Agent, or Firm*—Young & Thompson

[57] ABSTRACT

In an electronic circuit operable as a local oscillator frequency multiplier and mixing circuit, a squaring circuit is operated in response to a local oscillator frequency signal of a local oscillator frequency and is connected to a constant current circuit or a transistor circuit responsive to an input high frequency signal of a high frequency so as to obtain a frequency equal to a sum of an integral multiple or double of the local oscillator frequency and the high frequency and a difference between the integral multiple of the local oscillator frequency and the high frequency. The squaring circuit may be formed by four transistors connected in pairs while the transistor circuit may be structured by a cross-connected, emitter-coupled transistor circuit, an unbalanced emitter-coupled transistor circuit, or a pair of transistors. A control signal, such as an AGC control signal, may be given to the transistor circuit or the constant current circuit.

23 Claims, 32 Drawing Sheets

LOCAL OSCILLATOR FREQUENCY MULTIPLIER AND MIXING CIRCUIT COMPRISING A SQUARING CIRCUIT

BACKGROUND OF THE INVENTION

1. Field of the Invention

This invention relates to an electronic circuit which is operable as both a frequency multiplier and a mixer and which is implemented by a semiconductor integrated circuit.,

2. Description of the Related Art

In a radio receiver or a radio transmitter, a frequency multiplier and a mixer are very often used to receive or transmit an input frequency signal (namely, a high frequency signal.) of an input frequency. Specifically, a local oscillator frequency signal of a local oscillator frequency is multiplied by the frequency multiplier into a frequency multiplied signal of a multiplied frequency. The frequency multiplied signal is sent to the mixer which is given the input or high frequency signal. The mixer mixes the high frequency signal with the frequency multiplied signal to produce, as a mixed frequency signal, an intermediate frequency signal which has an intermediate frequency equal to a sum of the input frequency and the multiplied frequency or a difference between the input frequency and the multiplied frequency.

In general, the frequency multiplier and the mixer are formed by individual electronic circuits which are implemented by semiconductor integrated circuits. This brings about an increase of a circuit size and circuit elements.

Recently, proposal has been made by the instant inventor in Japanese Patent Unexamined Publications Nos. 253409/1992 and 240904/1992 as regards an electronic circuit which is operable as both a frequency multiplier and a mixer. Such an electronic circuit comprises a transistor circuit and a constant current circuit connected in cascade to the transistor circuit. In addition, the transistor circuit is composed of first and second pairs each of which comprises transistors having collectors connected through a resistor to each other. The transistor circuit is driven by the local oscillator frequency signal while the constant current circuit is driven by the input or high frequency signal.

With this structure, it is possible to generate, through the transistor circuit, an output signal which includes a sum of a frequency component equal to twice the local oscillator frequency and the input frequency or a difference between the frequency component and the input frequency and which serves as the intermediate frequency signal. This shows that the proposed electronic circuit acts as both a local oscillator frequency multiplier and a mixing circuit, namely, a frequency doubler and a mixer.

In the meanwhile, it has been found out according to the inventor's experimental studies that a wide variety of electronic circuits can be realized to generate the above-mentioned output signal in response to the input or high frequency signal and the local oscillator frequency signal by including a certain circuit. As regards such a certain circuit, an explicit recognition is never made in the above-referenced publications. Moreover, it has been also found out that an additional function is required when the electronic circuit is to be practically used in a receiver or a transmitter.

SUMMARY OF THE INVENTION

It is an object of this invention to provide an electronic circuit which is operable as both a frequency multiplier and a mixer and which is designed in accordance with a predetermined concept.

It is another object of this invention to provide an electronic circuit which can accomplish an additional function also except for the frequency multiplier and the mixer.

A frequency multiplier and mixing circuit to which this invention is applicable is supplied with a local oscillator frequency signal of a local oscillator frequency and an input frequency signal of an input frequency to produce an output signal which includes a frequency component specified by at least one of a sum and a difference between an integral multiple of the local oscillator frequency and the input frequency. According to an aspect of this invention, the circuit comprises a constant current circuit which is supplied with a bias voltage and the input frequency signal superposed on the bias voltage and a squaring circuit connected to said constant current circuit and supplied with said local oscillator frequency signal for squaring the local oscillator frequency signal to produce said output signal.

According to another aspect of this invention, the circuit comprises a squaring circuit supplied with the local oscillator frequency signal for squaring the local oscillator frequency signal to produce a circuit output signal in the form of a differential circuit output signal and a cross-connected emitter-coupled transistor circuit which is connected to the squaring circuit and supplied with the input signal and driven by the differential circuit output signal for producing the output signal in the form of a differential output current.

According to still another aspect of this invention, the circuit comprises a squaring circuit supplied with the local oscillator frequency signal for squaring the local oscillator frequency signal to produce a circuit output signal in the form of a differential circuit output signal and an emitter-coupled transistor circuit which is connected to the squaring circuit and supplied with said input signal and which is driven by the differential circuit output signal for producing the output signal in the form of a differential output current.

According to yet another aspect of this invention, a frequency multiplier and mixing circuit is also tunable in response to a predetermined control signal and comprises a constant current circuit supplied with a bias signal and a selected one of the input signal and the predetermined control signal, a squaring circuit supplied with the local oscillator frequency signal and connected to the constant current circuit for producing a circuit output current, and a transistor circuit supplied with the remaining one of the input signal and the predetermined control signal for producing the output signal controlled by the predetermined control signal.

DESCRIPTION OF PREFERRED EMBODIMENT

Figure 1:
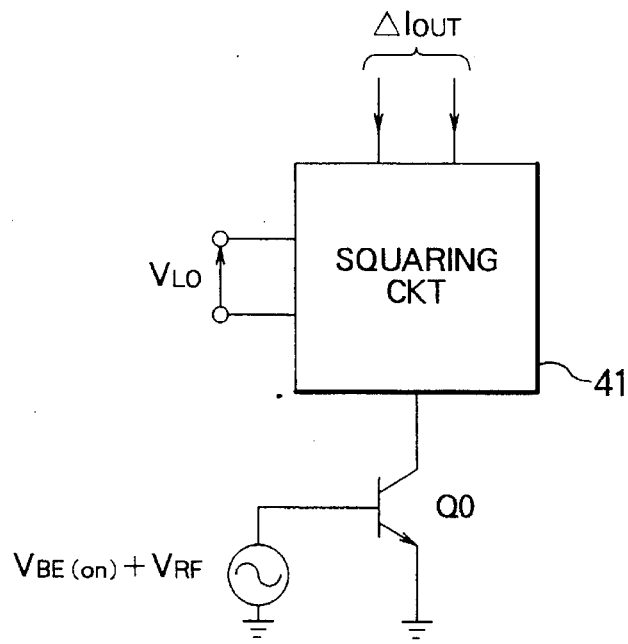
FIG. 1 is a block diagram of an electronic circuit according to a first embodiment of this invention.

Referring to FIG. 1, an electronic circuit according to a first embodiment of this invention is operable as a frequency multiplier and mixing circuit in response to a local signal voltage $V_{LO}$ of a local oscillator frequency $f_{LO}$ and a high or input frequency signal voltage $V_{RF}$ of a high frequency $f_{RF}$ to produce a frequency multiplied and mixed output signal as an output signal. The output signal is produced in the form of a differential output current $\Delta I_{OUT}$ of a frequency which includes a sum and a difference between a frequency component equal to twice the local oscillator frequency $f_{LO}$ and the high frequency $f_{RF}$.

In the illustrated example, the electronic circuit comprises a squaring circuit 41 which is supplied with the local signal voltage $V_{LO}$ to produce the differential output current $\Delta I_{OUT}$ through a pair of output terminals. The squaring circuit 41 is connected to a constant current circuit which is formed by a transistor Q0. The transistor Q0 has an emitter grounded, a collector connected to the squaring circuit 41, and a base supplied with a base voltage $V_{BE(on)}$ together with the high frequency voltage $V_{RF}$ of the high frequency $f_{RF}$. In other words, the high frequency voltage $V_{RF}$ is superposed on the base voltage $V_{BE(on)}$, as shown in FIG. 1.

The differential output current $\Delta I_{OUT}$ is given by:

$$\Delta I_{OUT} = \alpha_{Fn} Io \, f(V_{LO}), \qquad (1)$$

where Io is representative of a collector current which is caused to flow through the collector of the transistor Q0, $f(V_{LO})$, a frequency of the local signal voltage $V_{LO}$, and $\alpha_{Fn}$, a current amplification factor of an npn transistor.

In Equation (1), $f(V_{LO})$ is represented by:

$$f(V_{LO}) = bV_{LO}^2 + \qquad (2)$$

Herein, the squaring circuit 41 must produce a squaring circuit output signal which dominantly includes a frequency component of the second order term specified by Equation (2) and which may simply be called a circuit output signal, although a frequency component of the squaring circuit output signal includes the other frequency components than the second order term. To this end, the squaring circuit 41 has a structure as will be illustrated later in detail.

On the other hand, since the base of transistor Q0 is supplied with the high frequency voltage $V_{RF}$ superposed on the base voltage $V_{BE(on)}$, the collector current Io of the transistor Q0 is given by:

$$Io = Is \exp\left(\frac{V_{BE(on)} + V_{RF}}{V_T}\right) = Ioo \exp\left(\frac{V_{RF}}{V_T}\right), \quad (3)$$

where Is is representative of a saturation current, $$I_{oo} = I_s \exp\left(\frac{V_{BE(on)}}{V_T}\right)$$

and $V_T$, a thermal voltage given by (kT/q), where in turn k represents Boltzmann's constant; T, absolute temperature; and q, the charge of electron.

When Equation (3) is developed or expanded into a series, the collector current is then given by:

$$Io = Ioo\left[1 + \frac{V_{RF}}{V_T} + \frac{1}{2}\frac{V_{RF}^2}{V_T^2} + \frac{1}{6}\frac{V_{RF}^3}{V_T^3}\right] \quad (4)$$

On the assumption that $|V_{RF}| \ll V_T$, the second order term and the other order terms higher than the second order term may be neglected in Equation (4). In this case, Equation (4) may approximately be represented by:

$$Io \approx Ioo\left[1 + \frac{V_{RF}}{V_T}\right] \quad (|V_{RF}| \ll V_T). \quad (5)$$

Under the circumstances, substitution of Equation (5) into Equation (1) gives a product component which is specified by:

$$V_{LO}^2 V_{RF}.$$

This shows that the product component includes a frequency component of a sum and a difference between a double frequency component $2f_{LO}$ equal to twice the local oscillator frequency $f_{LO}$ and a high frequency $f_{RF}$ of the high frequency voltage $V_{RF}$, as will be mentioned later. Such sum and difference frequency components are given by $(2f_{LO}+f_{RF})$ and $(2f_{LO}-f_{RF})$. Under the circumstances, it is readily understood that the electronic circuit illustrated in FIG. 1 serves as a frequency multiplier and mixing circuit, namely, a frequency doubler and mixing circuit.

Figure 2:
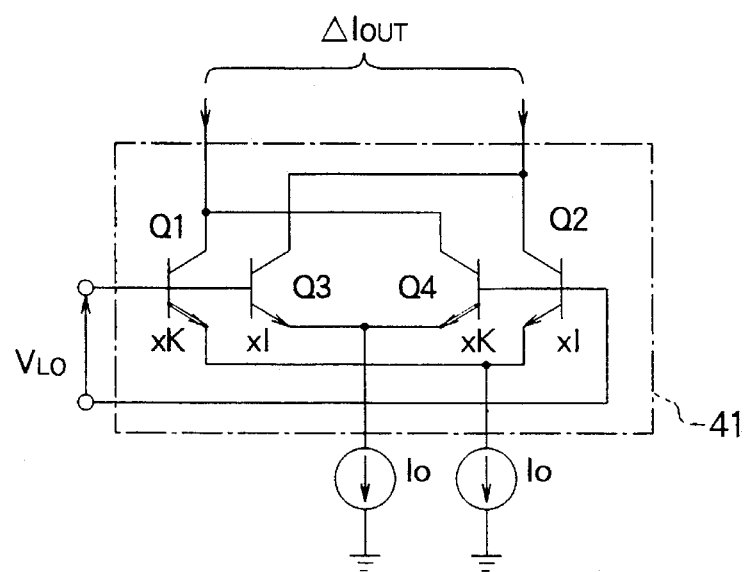
FIG. 2 is a circuit diagram of a squaring circuit which is usable in the electronic circuit illustrated in FIG. 1.

Referring to FIG. 2, illustration is made about an example of the squaring circuit 41 which comprises first, second, third, and fourth transistors Q1 to Q4 each of which has a base, a collector, and an emitter and which are connected to the constant current circuit. The illustrated constant current circuit is specified by a pair of constant current units or sources through which constant currents Io are caused to flow, respectively.

It is to be noted here that each emitter of the first and the fourth transistors Q1 and Q4 has an emitter area which is equal to K times an emitter area of each emitter of the second and the third transistors Q2 and Q3. Therefore, an emitter area ratio is equal to K in the illustrated example. More specifically, the emitters of the first and the second transistors Q1 and Q2 are connected in common to one of the constant current units while the emitters of the third and the fourth transistors Q3 and Q4 are also connected in common to another one of the constant current units. On the other hand, the collector of the first transistor Q1 is connected in common to the collector of the fourth transistor Q4 to form an output terminal while the collector of the second transistor Q2 is connected in common to the collector of the third transistor Q3 to provide another output terminal. In addition, the bases of the first and the third transistors Q1 and Q3 are connected in common to form an input terminal while the bases of the second and the fourth transistors Q2 and Q4 are connected in common to form another input terminal.

Herein, the first and the third transistors Q1 and Q3 form an unbalanced differential unit while the fourth and the second transistors Q4 and Q2 form another unbalanced differential unit because they are defined by the emitter area ratio of K:1.

With this structure, the local signal voltage $V_{LO}$ is given as a squaring circuit input signal across the input terminals formed by the common connected bases while the differential output current $\Delta I_{OUT}$ appears across the output terminals provided by the common connected collectors.

The illustrated circuit of the above-mentioned structure will be called an unbalanced differential circuit which comprises a pair of the unbalanced differential units as mentioned above.

In this event, the local oscillator frequency $f(V_{LO})$ is given by:

$$f(V_{LO}) = -2\left\{\frac{K - \frac{1}{K}}{2\cosh\left(\frac{V_{LO}}{V_T}\right) + K + \frac{1}{K}}\right\}. \quad (6)$$

When Equation (6) is substituted into Equation (1), it is understood that the differential output current $\Delta I_{OUT}$ includes the product component specified by $V_{LO}^2 V_{RF}$. This shows that the differential output current $\Delta I_{OUT}$ includes a sum frequency component $(2f_{LO}+f_{RF})$ equal to a sum of the high frequency $f_{RF}$ and the double frequency $2f_{LO}$ and a difference frequency component $(2f_{LO}-f_{RF})$ equal to a difference between the double frequency $2f_{LO}$ and the high frequency $f_{RF}$. Accordingly, it is possible to implement the frequency multiplier and mixing circuit by the use of the squaring circuit illustrated in FIG. 2.

Figure 3:
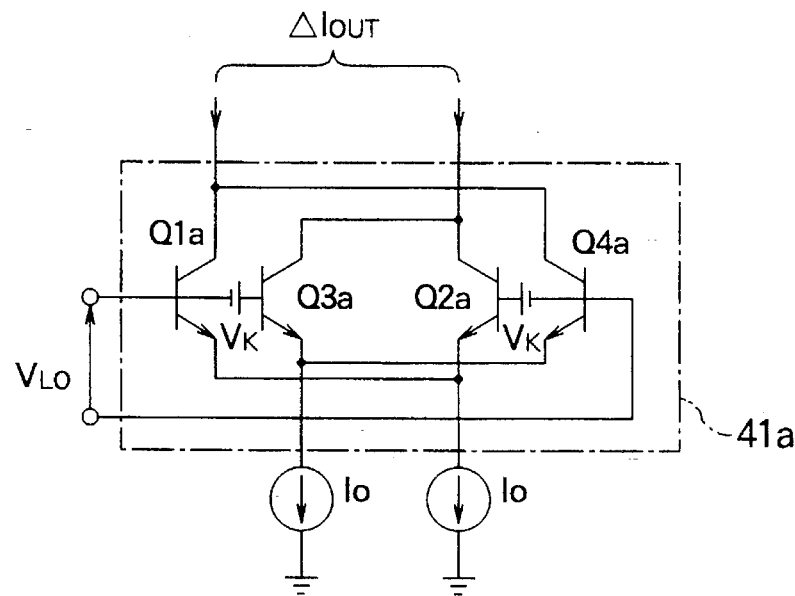
FIG. 3 is a circuit diagram of another squaring circuit which is usable in the electronic circuit illustrated in FIG. 1.

Referring to FIG. 3, a squaring circuit 41a is applicable to the electronic circuit illustrated in FIG. 1, like in FIG. 2, and comprises first through fourth transistors (depicted at Q1a to Q4a in FIG. 3) each of which has the same emitter area. Instead, the same offset voltage $V_K$ is given between the bases of the first and the third transistors Q1a and Q3a and between the bases of the fourth and the second transistors Q4a and Q2a.

In addition, the emitter of the first transistor Q1a is connected in common to the emitter of the second transistor Q2a while the emitter of the third transistor Q3a is connected in common to the emitter of the fourth transistor Q4a. Furthermore, the collectors of the first and the second transistors Q1a and Q2a are connected in common to each other to provide one of the output terminals while the collectors of the third and the second transistors Q3a and Q2a are also connected in common to each other to form the other output terminal. The above-mentioned connections may be referred to as parallel connections. The differential output current $\Delta I_{OUT}$ appears across the one and the other output terminals.

With this structure, the local oscillator frequency $f(V_{LO})$ is represented by:

$$f(V_{LO}) = \tanh\left(\frac{V_{LO} + V_K}{2V_T}\right) - \tanh\left(\frac{V_{LO} - V_K}{2V_T}\right). \quad (7)$$

It is noted here that Equation (7) is equivalent to Equation (6) when $V_K$ of Equation (7) is replaced by $(V_T \ln K)$ of Equation (6). Accordingly, the differential output current $\Delta I_{OUT}$ produced from the squaring circuit 41a of FIG. 3 includes the product components of $(V_{LO})^2 V_{RF}$. This shows that the frequency multiplier and mixing circuit can be implemented by the use of the squaring circuit 41a illustrated in FIG. 3 because the sum frequency component $(2f_{LO}+f_{RF})$ are included in the differential output current $\Delta I_{OUT}$ along with the difference frequency component $(2f_{LO}-f_{RF})$.

Figure 4:
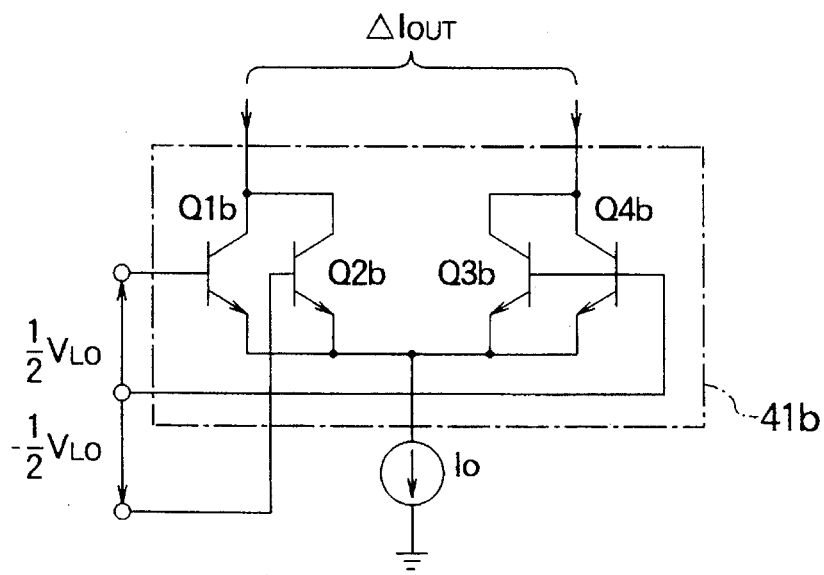
FIG. 4 is a similar diagram of still another squaring circuit which is also usable in the electronic circuit illustrated in FIG. 1.

Referring to FIG. 4, a squaring circuit 41b is also applicable to the electronic circuit illustrated in FIG. 1 and comprises first through fourth transistors (depicted at Q1b to Q4b, respectively) which have emitters connected in common to the constant current circuit (specified by a constant current Io). The collectors of the first and the second transistors Q1b and Q2b are connected in common to one of the output terminals while the collectors of the third and the fourth transistors Q3b and Q4b are also connected in common to the other output terminal. This structure may be referred to as a quadritail cell.

With this structure, the first and the second transistors Q1b and Q2b may be called a first transistor pair while the third and the fourth transistors Q3b and Q4b may be called a second transistor pair.

In the example illustrated in FIG. 4, the local signal voltage $V_{LO}$ is given between the bases of the first and the second transistors Q1b and Q2b (the first transistor pair) while a half of the local signal voltage, namely, $(\frac{1}{2})V_{LO}$ is given between the bases of the third and the fourth transistors Q3b and Q4b (the second transistor pair).

In this case, the local oscillator frequency $f(V_{LO})$ of the local signal voltage $V_{LO}$ is represented by:

$$f(V_{LO}) = 1 - \text{sech}^2\left(\frac{V_{LO}}{4V_T}\right). \qquad (8)$$

In other words, the squaring circuit 41b illustrated in FIG. 4 has a frequency characteristic specified by Equation (8).

Figure 5:
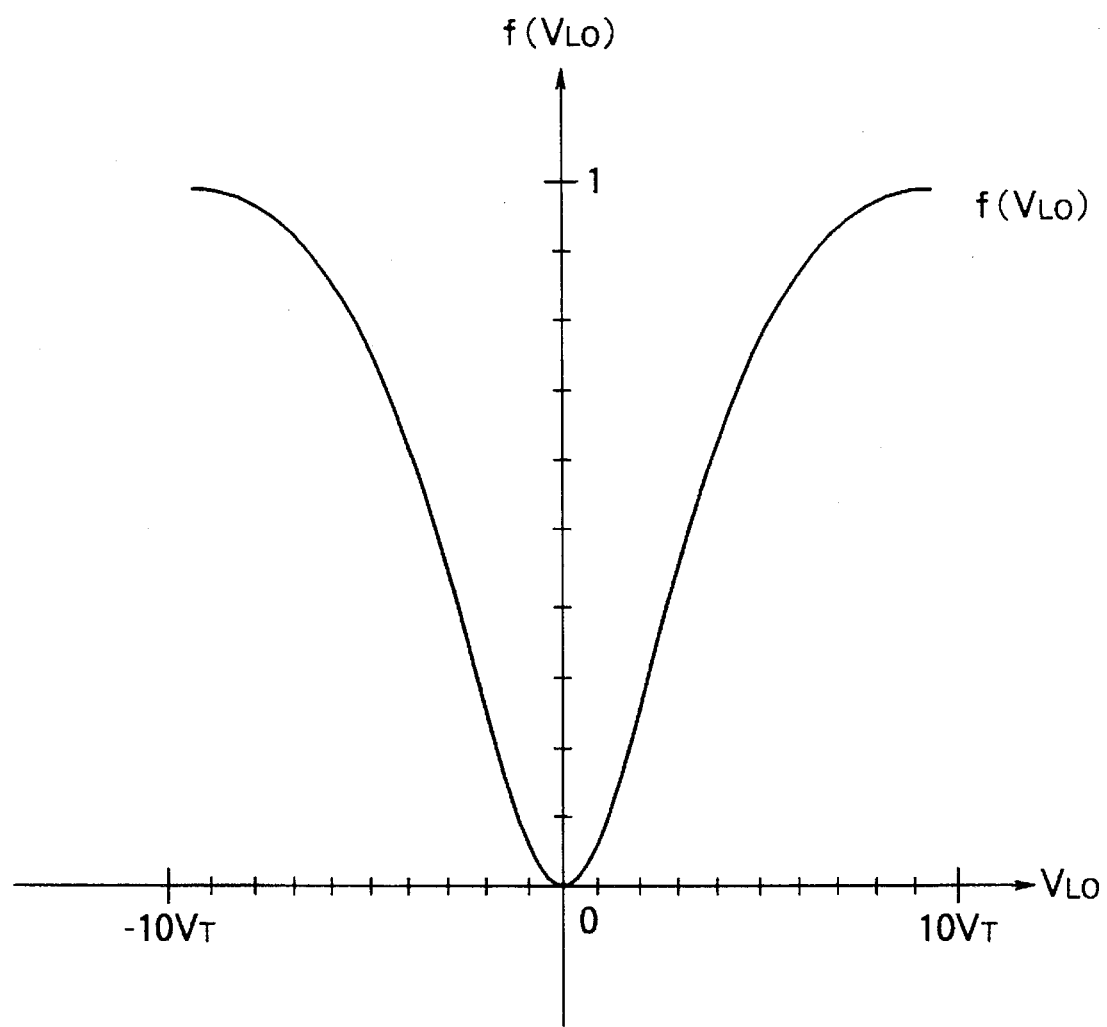
FIG. 5 shows a frequency characteristic of the squaring circuit illustrated in FIG. 4.

Referring to FIG. 5, the frequency characteristic is shown wherein an abscissa and an ordinate represent the local signal voltage $V_{LO}$ and the local oscillator frequency $f(V_{LO})$, respectively. If the local signal voltage $V_{LO}$ is restricted to a range of $|V_{LO}|<2V_T$, a preferable squaring characteristic can be established by the squaring circuit 41b, as is apparent from FIG. 5. Accordingly, the squaring circuit 41b produces the differential output current $\Delta I_{OUT}$ which includes the product component specified by $V_{LO}^2 V_{RF}$. As a result, the frequency components $(2f_{LO}+f_{RF})$ and $(2f_{LO}-f_{RF})$ are produced from the illustrated squaring circuit 41b, like in FIGS. 2 and 3. Thus, the squaring circuit 41b serves to form the frequency multiplier and mixing circuit.

From the above, it is readily understood that the frequency multiplier and mixing circuit can be realized by a combination of a squaring circuit and a constant current circuit for driving the squaring circuit.

Figure 6:
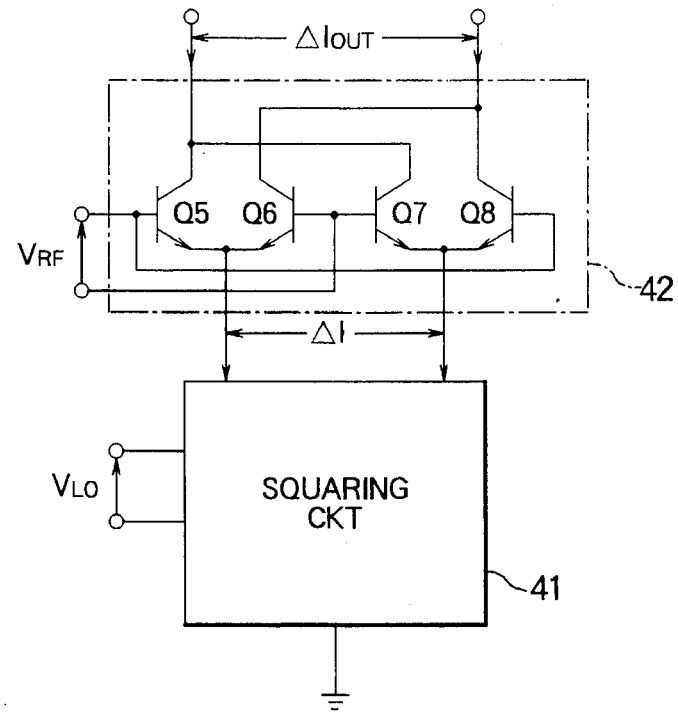
FIG. 6 is a block diagram of an electronic circuit according to a second embodiment of this invention.

Referring to FIG. 6, an electronic circuit according to a second embodiment of this invention comprises a transistor circuit 42 in addition to a squaring circuit 41. It is noted that the transistor circuit 42 is connected across circuit output terminals of the squaring circuit 41 and is driven by a squaring circuit output current $\Delta I$ produced by the squaring circuit 41 which has a pair of circuit input terminals. The local signal voltage $V_{LO}$ is given across the circuit input terminals to produce the squaring circuit output current $\Delta I$ across the circuit output terminals. The squaring circuit output current $\Delta I$ may be called a differential circuit output current.

The transistor circuit 42 has first and second input terminals supplied with a high frequency voltage signal $V_{RF}$ and first and second output terminals across which an output current or a differential output current $\Delta I_{OUT}$ appears. The differential output current $\Delta I_{OUT}$ is similar to that illustrated in FIGS. 2 through 4.

To this end, the illustrated transistor circuit 42 comprises fifth, sixth, seventh, and eighth transistors Q5, Q6, Q7, and Q8 connected in an illustrated manner. More specifically, the fifth and the sixth transistors Q5 and Q6 have emitters connected in common to one of the circuit output terminals of the squaring circuit 41 and may be therefore called a first emitter coupled pair while the seventh and the eighth transistors Q7 and Q8 have emitters connected in common to the other circuit output terminal Of the squaring circuit 41 and may be therefore called a second emitter coupled pair. In addition, the bases of the fifth and the eighth transistors Q5 and Q8 are connected in common to the first input terminal while the bases of the sixth and the seventh transistors Q6 and Q7 are connected in common to the second input terminal. Furthermore, the collectors of the fifth and the seventh transistors Q5 and Q7 are connected in common to the one output terminal while the collectors of the sixth and the eighth transistors Q6 and Q8 are connected in common to the other output terminal. The above-mentioned connections of the collectors may be referred to as cross connections. Taking the above into consideration, the illustrated transistor circuit 42 will be referred to as a cross-connected, emitter-coupled circuit.

With this structure, the output current $\Delta I_{OUT}$ appears in the form of a differential output current, as will be readily understood from FIG. 6, and is represented by:

$$\Delta I_{OUT} = \alpha_{Fn}(\Delta I)\tanh\left(\frac{V_{RF}}{2V_T}\right). \qquad (9)$$

Figure 7:
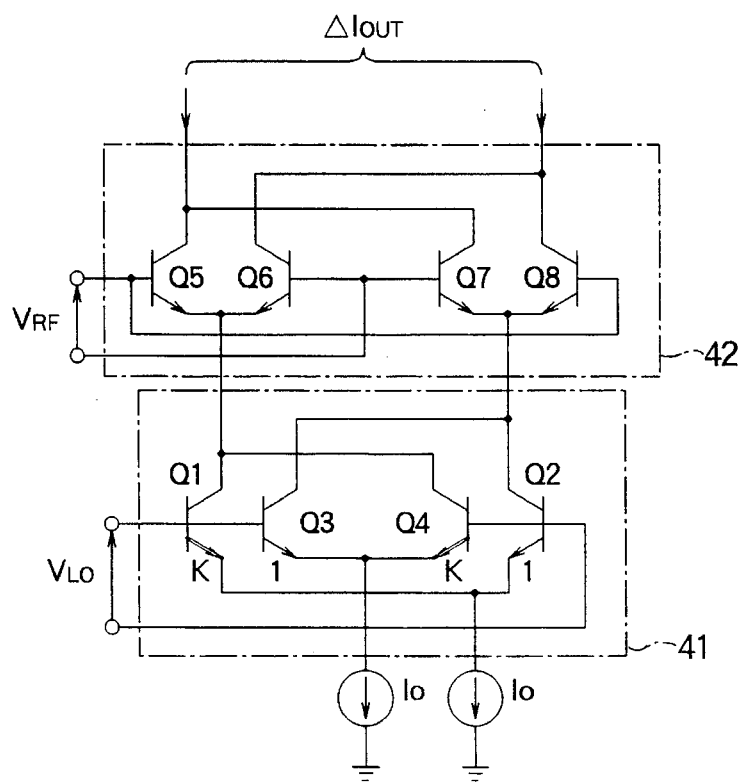
FIG. 7 is a circuit diagram of a squaring circuit which is usable in the electronic circuit illustrated in FIG. 6.

Referring to FIG. 7, the squaring circuit 41 is substantially equivalent to that illustrated in FIG. 2. Therefore, the first and the third transistors Q1 and Q3 have the emitter area ratio equal to K:1 and forms the first unbalanced differential unit. Likewise, the second and the fourth transistors Q2 and Q4 have the emitter area ratio equal to K:1 and forms the second unbalanced differential unit.

With this structure, the circuit output current, namely, a differential circuit output current $\Delta I$ is represented by:

$$\Delta I = \alpha_{Fn} Io \left\{ \tanh\left(\frac{V_{LO}}{2V_T} - \frac{\ln K}{2}\right) - \tanh\left(\frac{V_{LO}}{2V_T} + \frac{\ln K}{2}\right) \right\}. \qquad (10)$$

Equation (10) is rewritten into:

$$\Delta I = -2\alpha_{Fn} Io \left\{ \frac{K - \frac{1}{K}}{2\cosh\left(\frac{V_{LO}}{V_T}\right) + K + \frac{1}{K}} \right\}. \qquad (11)$$

Under the circumstances, substitution of Equation (11) into Equation (9) gives:

$$\Delta I_{OUT} = -2\alpha_{Fn}^2 Io \left\{ \frac{K - \frac{1}{K}}{2\cosh\left(\frac{V_{LO}}{V_T}\right) + K + \frac{1}{K}} \right\} \tanh\left(\frac{V_{RF}}{2V_T}\right). \qquad (12)$$

The output current $\Delta I_{OUT}$ represented by Equation (12) is produced through the output terminals of the transistor circuit 42 when the transistor circuit 42 is driven by the circuit output current $\Delta I$.

Equation (12) is expanded into:

$$\Delta I_{OUT} \approx -\alpha_{Fn}^2 I_0 |V_{LO}|^2 \left\{ \frac{K - \frac{1}{K}}{2 + K + \frac{1}{K}} \right\} \times \quad (13)$$

$$\{1 - \cos\{2\pi(2f_{LO})t\}\} \left\{ \frac{|V_{RF}|}{2V_T} \cos(2\pi f_{RF} t) \right\}.$$

$$(|V_{LO}| < 2V_T, |V_{RF}| \ll 2V_T)$$

From Equation (13), it is readily understood that the differential output current $\Delta I_{OUT}$ includes a component which is defined by a product of the double frequency $2f_{LO}$ of the local oscillator frequency $f_{LO}$ and the high frequency $f_{RF}$ and which is represented in the form of cos $(2 \pi(2f_{LO})t-)\cos(2 \pi f_{RF} t)$. Accordingly, the component is divided into a sum frequency component $(2f_{LO}+f_{RF})$ and a difference frequency component $(2f_{LO}-f_{RF})$. This shows that the electronic circuit illustrated in FIG. 7 is operable as a frequency multiplier and mixing circuit.

Figure 8:
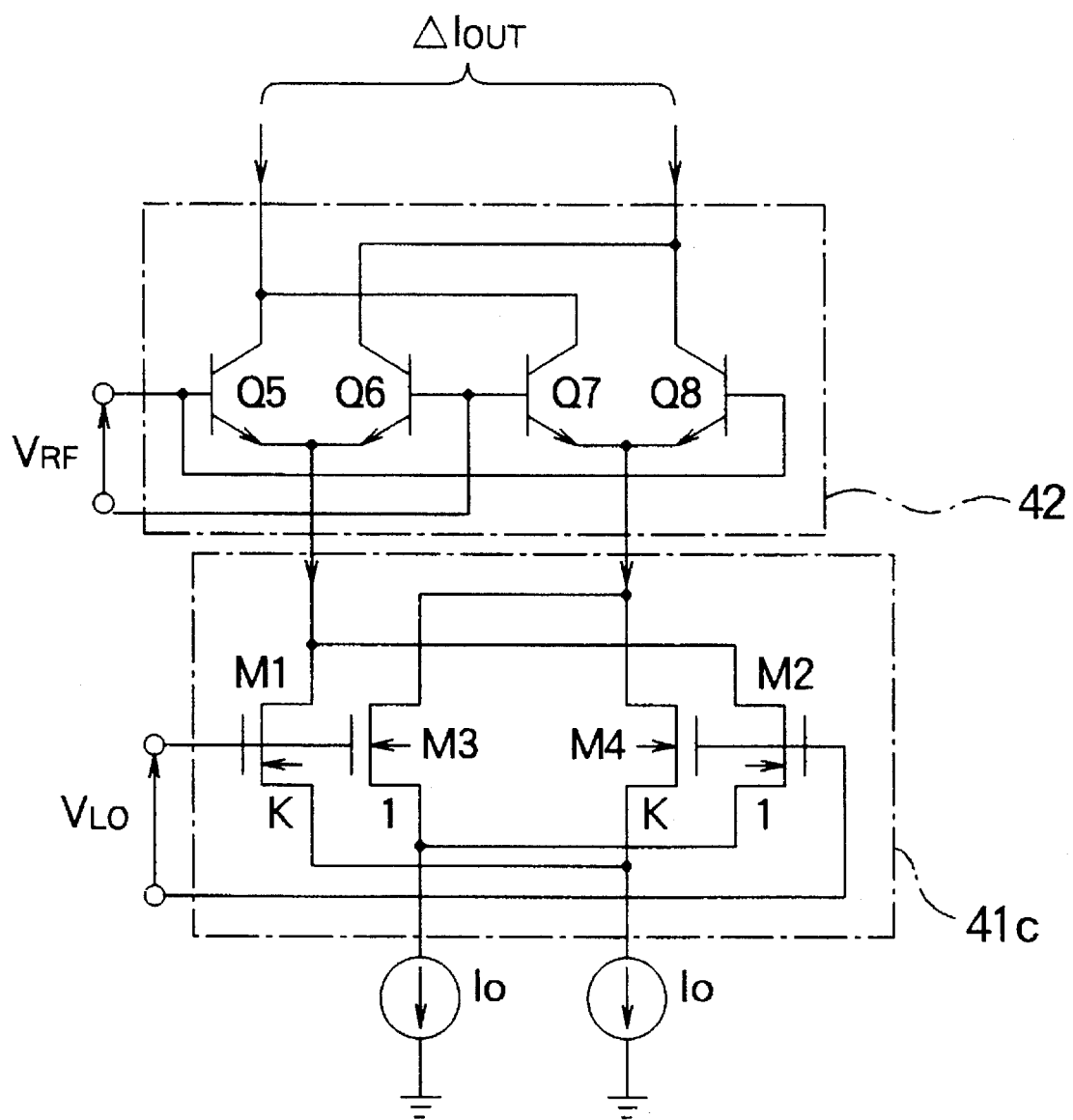
FIG. 8 is a circuit diagram of another squaring circuit which is usable in the electronic circuit illustrated in FIG. 6.

Referring to FIG. 8, a squaring circuit 41c is applicable to the electronic circuit illustrated in FIG. 6 and comprises first through fourth MOS transistors M1 to M4 connected in a manner illustrated in FIG. 7. In the illustrated example, each of the first and the fourth MOS transistors M1 and M4 has a ratio (W/L) of a gate width (W) to a gate length (L) which is equal to K times that of each of the second and the third MOS transistors M2 and M3. Therefore, the gate width to length ratio may be represented by K:1.

The gates of the first and the third MOS transistors M1 and M3 are connected in common to the one circuit input terminal while the second and the fourth MOS transistors M2 and M4 are connected in common to the other circuit input terminal. Inasmuch as the first and the third MOS transistors M1 and M3 are different from each other in the gate width to length ratios, the first and the third MOS transistors M1 and M3 form a first unbalanced differential pair. Likewise, the second and the fourth MOS transistors M2 and M4 form a second unbalanced differential pair.

With this structure, the circuit output current, namely, a differential output current $\Delta I$ is given within a restricted range of the input local signal voltage $V_{LO}$ by:

$$\Delta I = -2 \frac{K-1}{K+1} I_0 + 4 \frac{K(K-1)\beta}{(K+1)^2} V_{LO}^2 \left( |V_{LO}| \leq \sqrt{\frac{I_0}{K\beta}} \right). \quad (14)$$

where $\beta$ is representative of a transconductance parameter and is given by $\mu (C_{OX}/2)(W/L)$ and where in turn $\mu$ is representative of an effective mobility of a carrier; $C_{OX}$, a capacity of a gate oxide film per unit area; W, a gate width; and L, a gate length.

Figure 9:
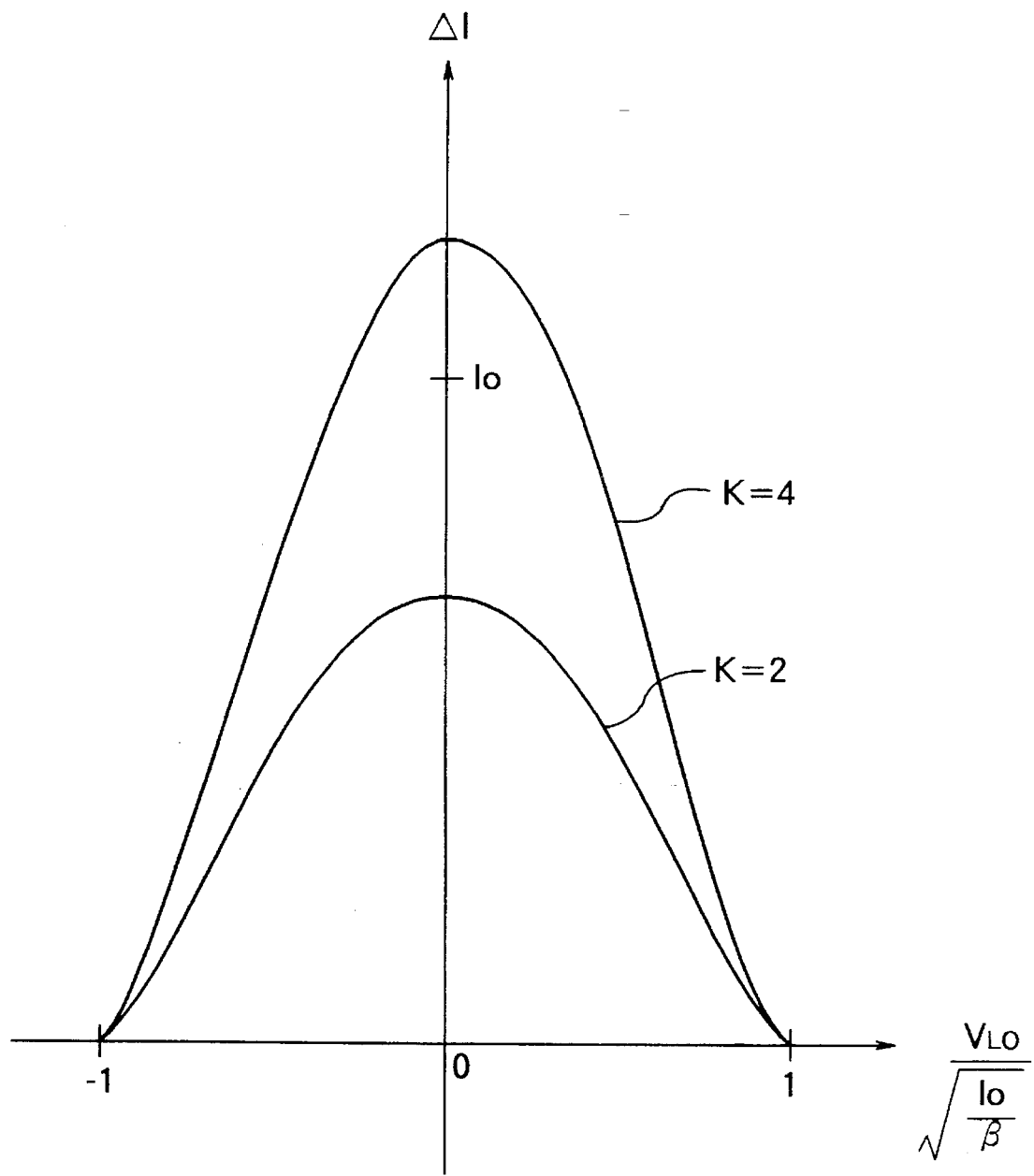
FIG. 9 shows transfer characteristics of the squaring circuit illustrated in FIG. 8.

Referring to FIG. 9, wherein an abscissa and an ordinate represent the input local signal voltage $V_{LO}$ normalized by $\sqrt{I_0/\beta}$ and the circuit output current $\Delta I$, respectively, transfer characteristics of the squaring circuit 41c are specified by curves (K=2) and (K=4). As is apparent from FIG. 8, it is possible to determine a transfer range which has an ideal squaring characteristic by selecting a value of the transconductance parameter $\beta$, namely, a value of the gate width to length ratio and a value of the drive current Io.

With this structure, it is possible to widen the input and output range in comparison with that of the squaring circuit which is formed by bipolar transistors and which is illustrated in FIG. 7.

When the transistor circuit 42 is driven by the differential output current $\Delta I$ of the squaring circuit 41c formed by the first and the second unbalanced differential pairs each of which is composed of the MOS transistors having the gate width to length ratio of K:1, the differential output current $\Delta I_{OUT}$ is given by:

$$\Delta I_{OUT} = \alpha_{Fn} \left\{ 2 \frac{K-1}{K+1} I_0 - 4 \frac{K(K-1)\beta}{(K+1)^2} V_{LO}^2 \right\} \tan\left( \frac{V_{RF}}{2V_T} \right). \quad (15)$$

$$\left( |V_{LO}| \leq \sqrt{\frac{I_0}{K}} \right)$$

Accordingly, the squaring circuit 41c serves to form the frequency multiplier and mixing circuit, like in FIG. 7.

Figure 10:
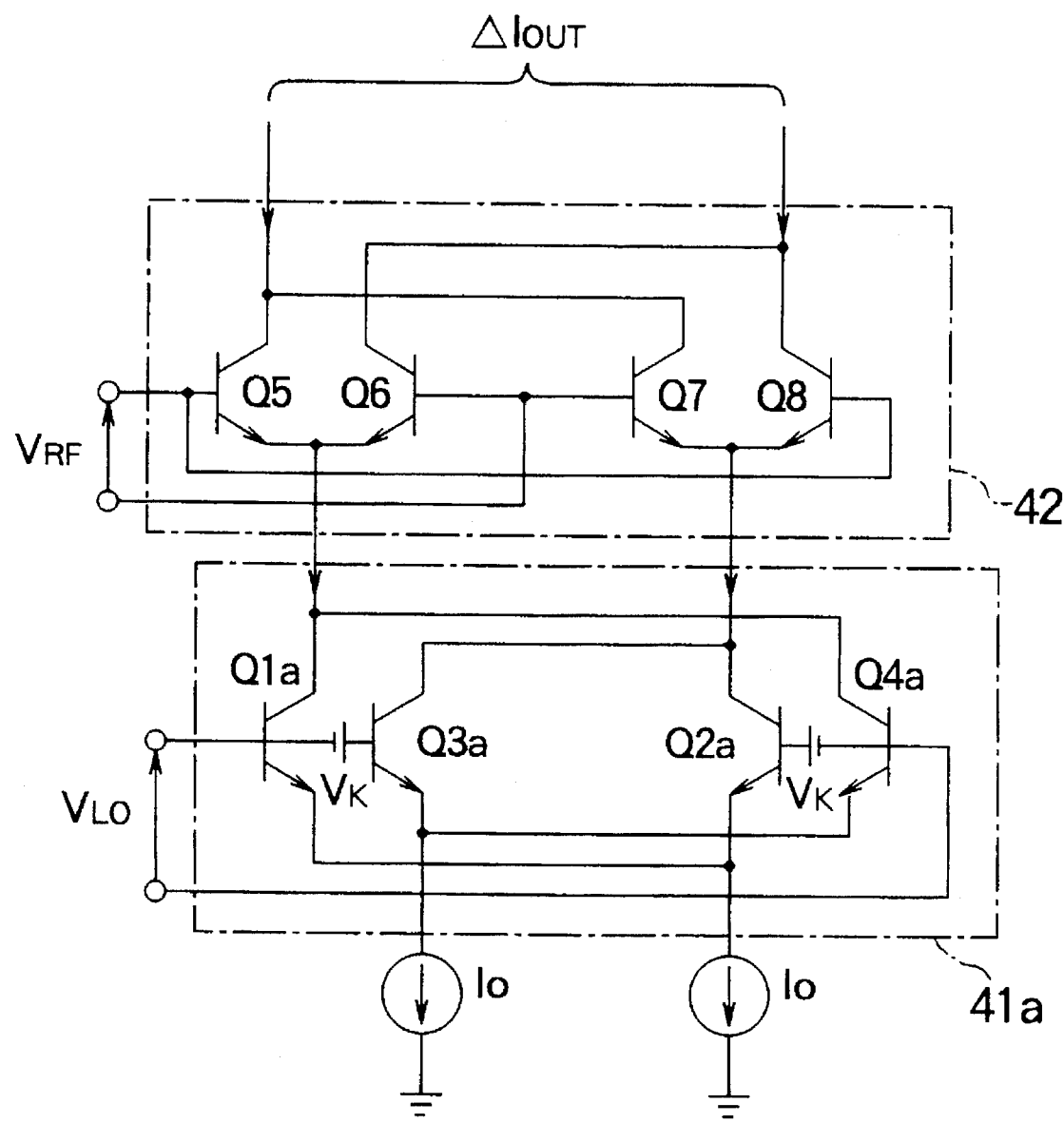
FIG. 10 is a circuit diagram of still another squaring circuit which is usable in FIG. 6.

Referring to FIG. 10, a squaring circuit 41a itself is identical with that illustrated in FIG. 3 and comprises circuit elements and signals depicted at the same reference numerals and symbols. Specifically, the same offset voltage $V_K$ is given between the bases of the first and the third transistors Q1a and Q3a and between the bases of the fourth and the second transistors Q2a and Q4a. Accordingly, the circuit output current $\Delta I$ of the squaring circuit 41a is given by:

$$\Delta I = \alpha_{Fn} I_0 \left\{ \tanh\left( \frac{V_{LO} + V_K}{2V_T} \right) - \tanh\left( \frac{V_{LO} - V_K}{2V_T} \right) \right\}. \quad (16)$$

When the transistor circuit 42 is driven by the circuit output current $\Delta I$, the transistor circuit 42 produces the output current $\Delta I_{OUT}$ which is given by:

$$\Delta I_{OUT} = \alpha_{Fn}^2 I_0 \left\{ \tanh\left( \frac{V_{LO} + V_K}{2V_T} \right) - \tanh\left( \frac{V_{LO} - V_K}{2V_T} \right) \right\} \left( \tan\frac{V_{RF}}{2V_T} \right). \quad (17)$$

From Equation (17), it appears that the electronic circuit illustrated in FIG. 10 is also operable as the frequency multiplier and mixing circuit.

Figure 11:
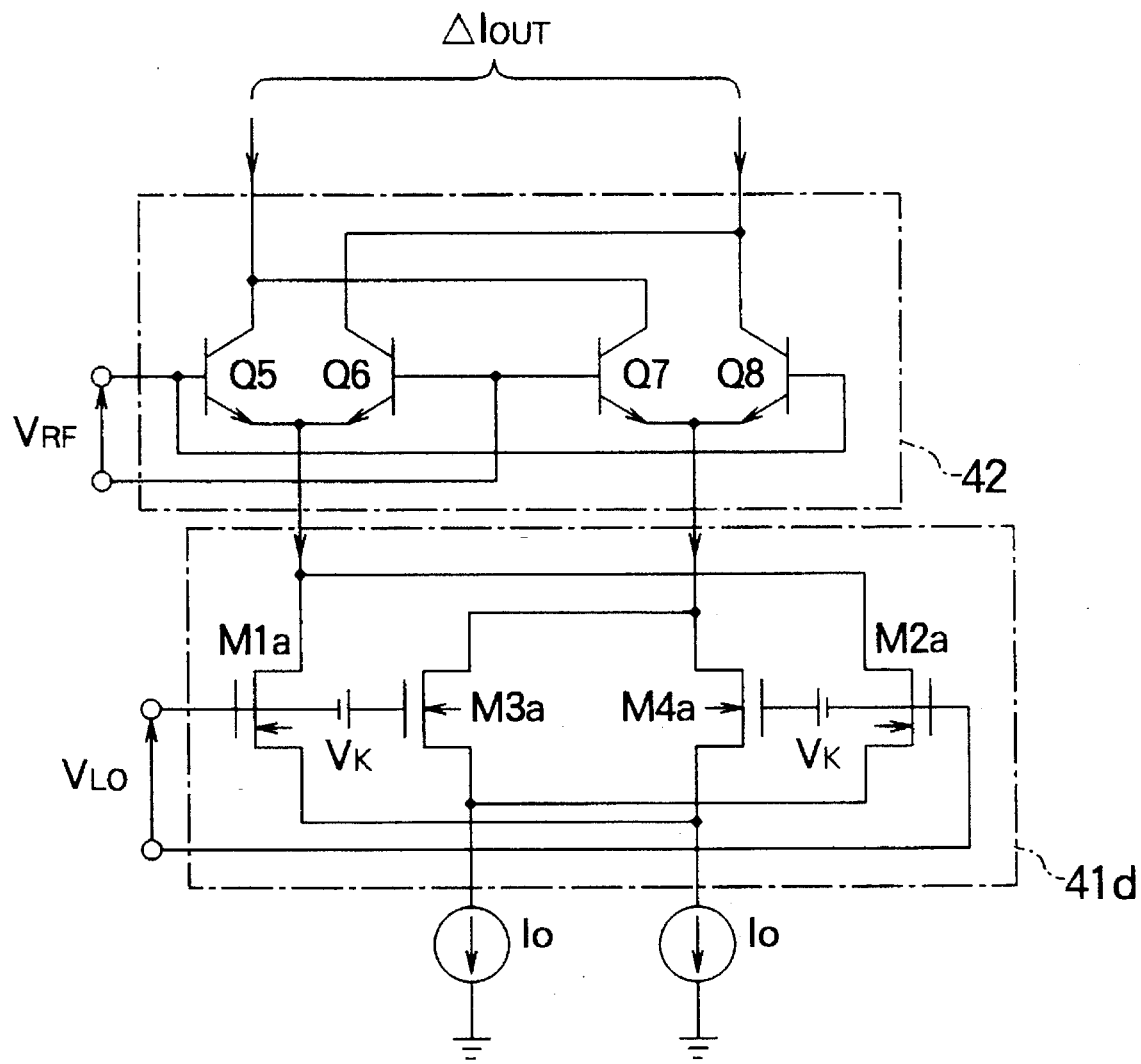
FIG. 11 is a circuit diagram of the electronic circuit which includes yet another squaring circuit usable in the second embodiment.

Referring to FIG. 11, the electronic circuit comprises a transistor circuit 42 identical with that of FIG. 6 and a squaring circuit 41d which is somewhat different from the other squaring circuits 41, 41a, 41b, and 41c. More particularly, the illustrated squaring circuit 41d comprises first through fourth MOS transistors M1a, M2a, M3a, and M4a each of which has a gate, a drain, and a source. The same offset voltage $V_K$ is given between the gates of the first and the third MOS transistors M1a and M3a and between the gates of the fourth and the second MOS transistors M4a and M2a. The gates of the first and the fourth MOS transistors M1a and M4a are connected to first and second ones of the circuit input terminals, respectively. With this structure, it is possible to divide the first through the fourth MOS transistors M1a to M4a into a first unbalanced differential pair of M1a and M3a and a second unbalanced differential pair of M2a and M4a. In the illustrated example, the sources of the first and the fourth MOS transistors M1a and M4a are connected in common to each other and connected to one of the circuit output terminals while the sources of the third and the second MOS transistors M3a and M2a are connected in common to each other and are connected to the other circuit output terminal.

On the other hand, the drains of the first and the second MOS transistors M1a and M2a are connected in common to each other and are connected to one of the constant current sources. Likewise, the drains of the third and the fourth MOS transistors M3a and M4a are connected in common to each other and are connected to another constant current source, as illustrated in FIG. 11.

A circuit output current, namely, a differential circuit output current $\Delta I$ appears across the first and the second circuit output terminals when the local signal voltage $V_{LO}$ is given across the first and the second circuit input terminals. The illustrated squaring circuit 41*d* produces, within a restricted local signal voltage $V_{LO}$, a differential circuit output current $\Delta I$ represented by:

$$\Delta I = \beta(V_{LO}+V_K)\sqrt{\frac{2Io}{\beta}-(V_{LO}+V_K)^2} - \qquad (18)$$

$$\beta(V_{LO}-V_K)\sqrt{\frac{2Io}{\beta}-(V_{LO}-V_K)^2} \cdot \left(|V_{LO}| \leq \sqrt{\frac{Io}{K\beta}} - V_K\right)$$

Equation (18) is approximately rewritten into:

$$\Delta I \approx 2\sqrt{2\beta Io}\ V_K \left\{1-\left(1-\frac{1}{\sqrt{2}}\right)\frac{\beta}{Io}(V_K^2+V_{LO}^2)\right\} \cdot \qquad (19)$$

$$\left(|V_{LO}| \leq \sqrt{\frac{Io}{K\beta}} - V_K\right)$$

From Approximate expression (19), it is understood that the differential circuit output current $\Delta I$ exhibits a squaring characteristic in relation to the local signal voltage $V_{LO}$. Herein, it is to be noted that the above-mentioned approximate expression 19 is excellent to represent the differential circuit output current $\Delta I$ because an error which occurs due to approximation is extremely small.

Figure 12:
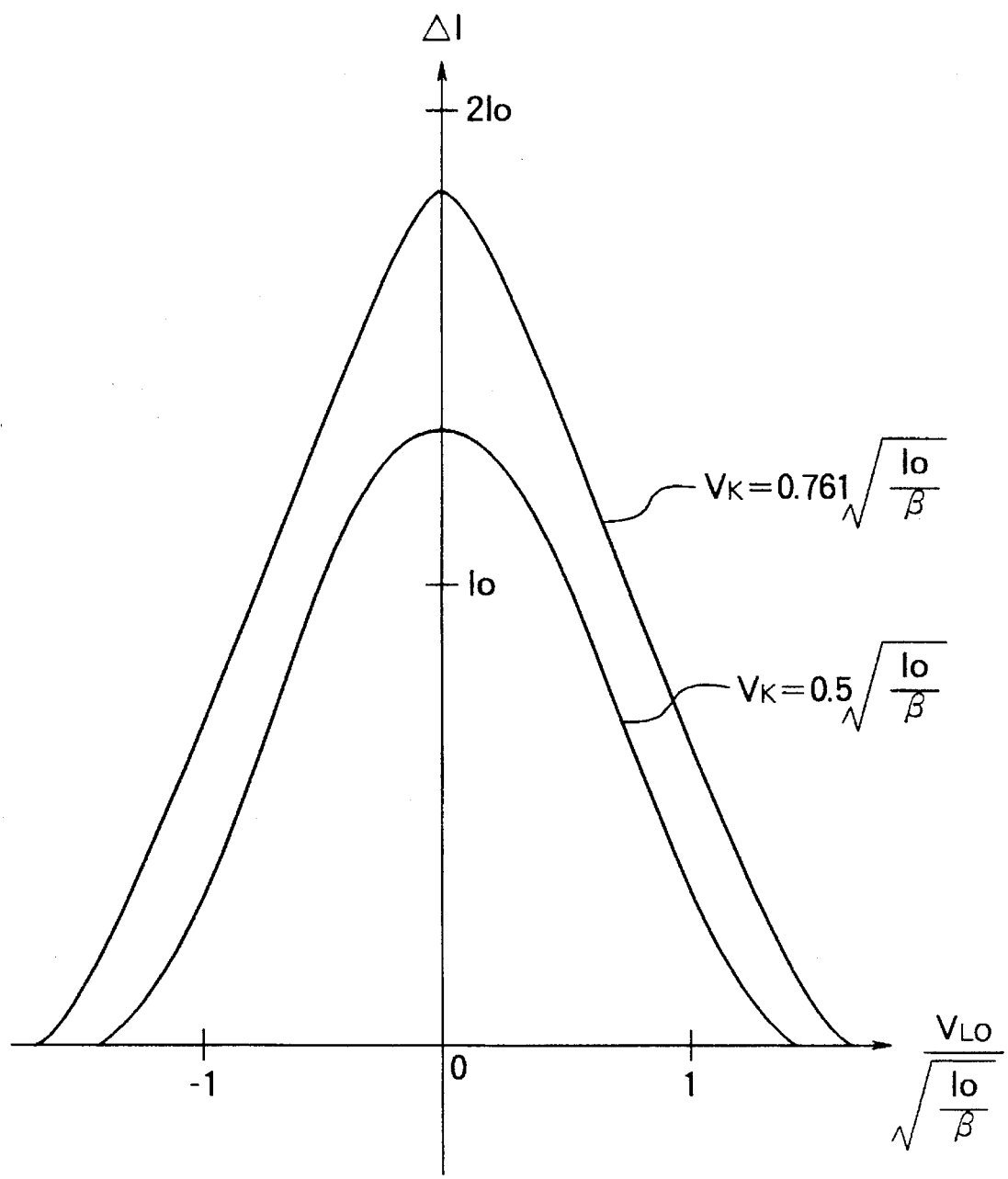
FIG. 12 shows transfer characteristics of the squaring circuit illustrated in FIG. 11.

As shown in FIG. 12, the squaring circuit 41*d* illustrated in FIG. 11 has transfer characteristics as specified by curves, with the offset voltage $V_K$ used as parameters.

Thus, when the transistor circuit 42 is driven by the circuit output current $\Delta I$ produced by the squaring circuit 41*d* illustrated in FIG. 11, the differential output current $\Delta I_{OUT}$ is given by:

$$\Delta I_{OUT} = \left\{\beta(V_{LO}+V_K)\sqrt{\frac{2Io}{\beta}-(V_{LO}+V_K)^2} - \qquad (20)\right.$$

$$\left.\beta(V_{LO}-V_K)\sqrt{\frac{2Io}{\beta}-(V_{LO}-V_K)^2}\right\} \times \alpha_{Fn}\tanh\left(\frac{V_{RF}}{2V_T}\right) \approx$$

$$2\alpha_{Fn}\sqrt{2\beta Io}\ V_K \left\{1-\left(1-\frac{1}{\sqrt{2}}\right)\frac{\beta}{Io}(V_K^2+V_{LO}^2)\right\} \times$$

$$\tanh\left(\frac{V_{RF}}{2V_T}\right) \cdot \left(|V_{LO}| \leq \sqrt{\frac{Io}{K\beta}} - V_K\right)$$

From Equation (20), it is readily understood that the electronic circuit illustrated in FIG. 11 serves as the frequency multiplier and mixing circuit.

Figure 13:
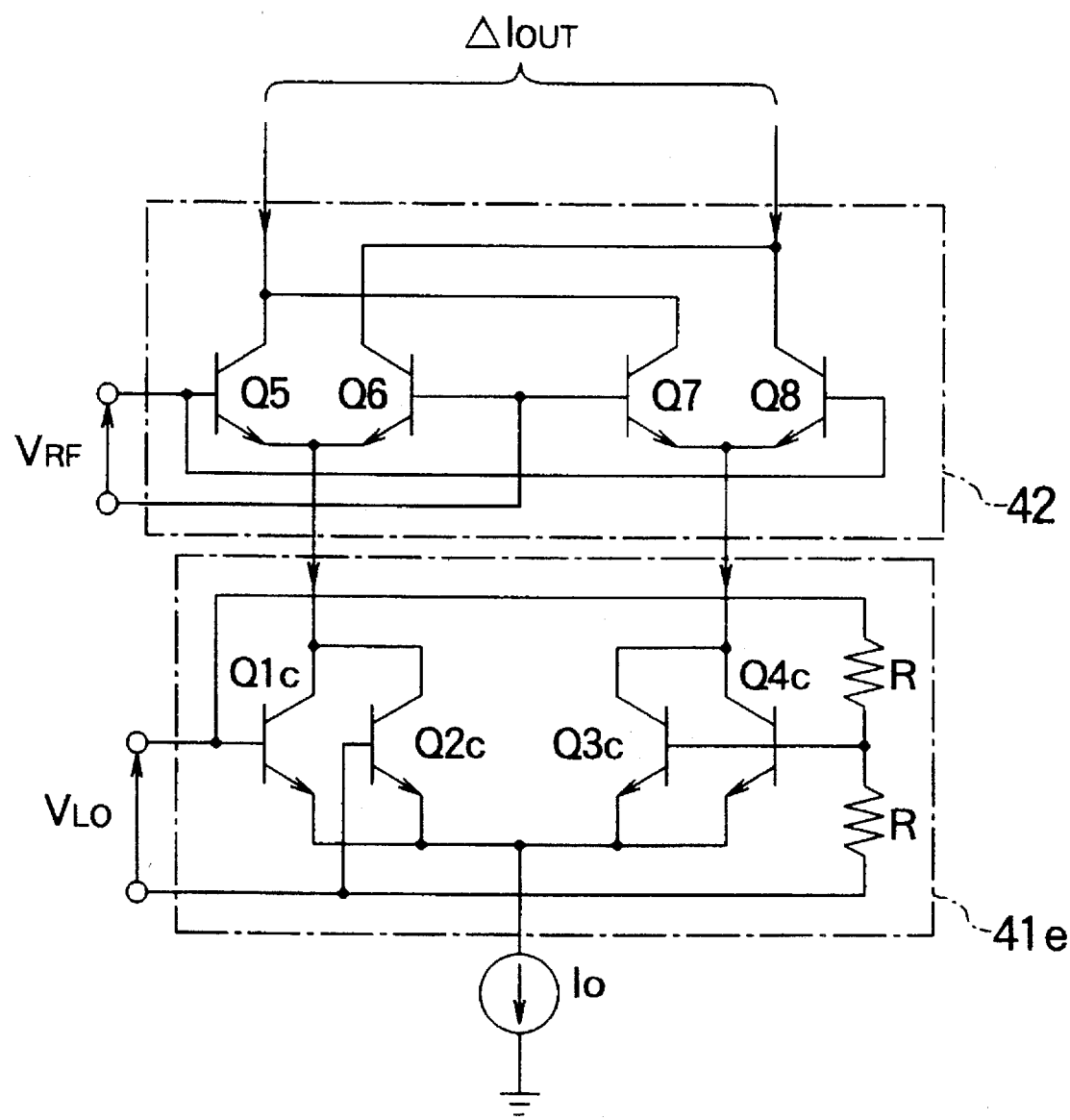
FIG. 13 is a circuit diagram of the electronic circuit which includes another squaring circuit different from the other squaring circuits illustrated in the preceding figures.

Referring to FIG. 13, another squaring circuit 41*e* is combined with the transistor circuit 42 which is identical with that of FIG. 6 and which therefore comprises the fifth through the eighth transistors Q5 to Q8 connected in the manner described in connection with FIG. 6.

On the other hand, the illustrated squaring circuit 41*e* comprises first through fourth transistors Q1*c* to Q4*c* connected in common to one another in their emitters and driven by a single current source Io. In this connection, the illustrated squaring circuit 41*e* may be called a quadritail cell. Specifically, the first and the second transistors Q1*c* and Q2*c* have collectors connected in common to each other and form a first transistor pair. Likewise, the third and the fourth transistors Q3*c* and Q4*c* have collectors connected in common to each other and form a second transistor pair. The base of the first transistor Q1*c* is connected through a resistor R to the bases of the third and the fourth transistors Q3*c* and Q4*c* and is connected also to a first one of the circuit input terminals. On the other hand, the base of the second transistor Q2*c* is connected through another resistor R to the bases of the third and the fourth transistors Q3*c* and Q4*c* and is also connected to a second one of the circuit input terminals. The local signal voltage $V_{LO}$ is given across the first and the second circuit terminals.

With this structure, the circuit output current $\Delta I$ of the illustrated squaring circuit is given by:

$$\Delta I = \alpha_{Fn} Io \left\{1-\text{sech}^2\left(\frac{V_{LO}}{4V_T}\right)\right\}. \qquad (21)$$

When the quadritail cell shown in FIG. 13 is driven by the circuit output current $\Delta I$ represented by Equation (21), the differential output current $\Delta I_{OUT}$ is given by:

$$\Delta I_{OUT} = \alpha_{Fn}^2 Io \left\{1-\text{sech}^2\left(\frac{V_{LO}}{4V_T}\right)\right\}\tanh\left(\frac{V_{RF}}{2V_T}\right). \qquad (22)$$

From Equation (22), it is understood that the electronic circuit shown in FIG. 13 is also operable as the frequency multiplier and mixing circuit.

Figure 14:
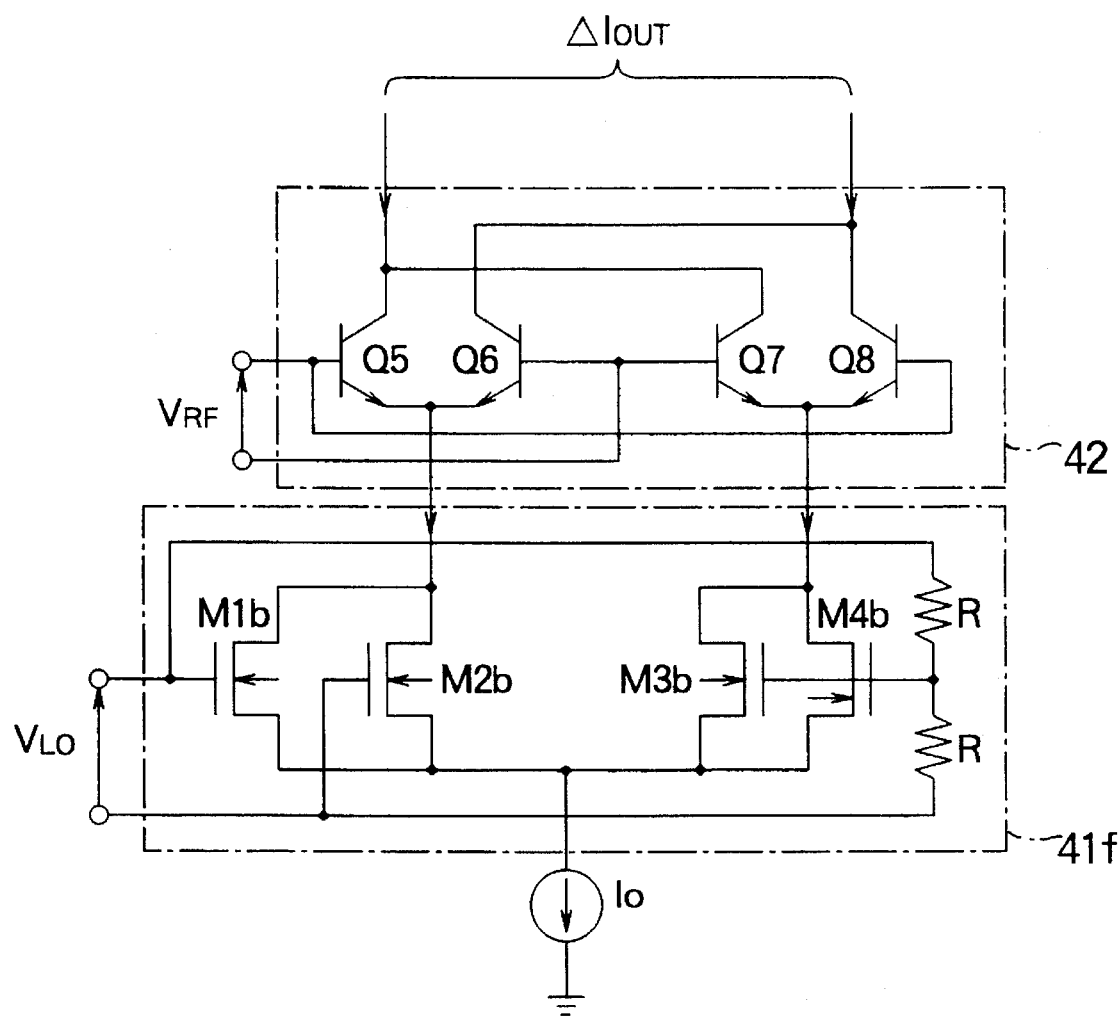
FIG. 14 is a circuit diagram of the electronic circuit which forms the second embodiment of this invention and which includes another squaring circuit.

Referring to FIG. 14, a squaring circuit 41*f* is composed of first through fourth MOS transistors M1*b* to M4*b* which have drains connected in common to one another and which form a MOS quadritail cell driven by a single current source Io. As is apparent from FIG. 14, the squaring circuit 41*f* is similar to the squaring circuit 41*e* illustrated in FIG. 13 except that the MOS transistors M1*b* to M4*b* are used in lieu of the bipolar transistors Q1*c* to Q4*c* in FIG. 13.

The circuit output current $\Delta I$ of the squaring circuit 41*f* is represented by:

$$\Delta I = \frac{\beta}{2} V_{LO}^2 \left(|V_{LO}| \leq \sqrt{\frac{2Io}{3\beta}}\right). \qquad (23)$$

on the condition that a range of the local signal voltage $V_{LO}$ is restricted.

Figure 15:
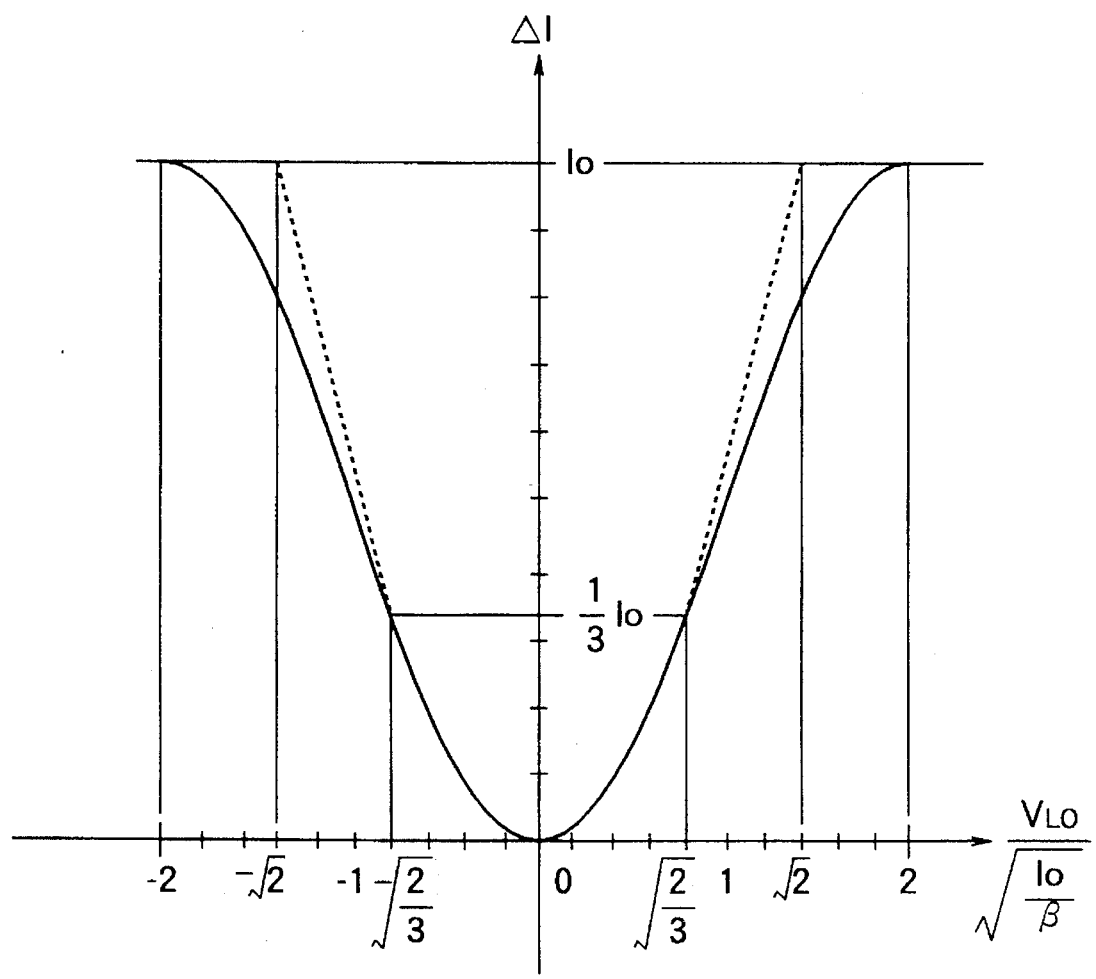
FIG. 15 shows a transfer characteristic of the squaring circuit illustrated in FIG. 14.

In FIG. 15, an input and output characteristic of the squaring circuit 41*f* of FIG. 14 is illustrated. As shown in FIG. 15, the circuit output current $\Delta I$ exhibits an ideal squaring characteristic within a restricted input local signal voltage $V_{LO}$ normalized by $\sqrt{Io/\beta}$. Accordingly, the squaring circuit 41*f* serves to obtain the circuit output current $\Delta I$ which is equal to a squaring of the input local signal voltage $V_{LO}$.

When the transistor circuit 42 shown in FIG. 14 is driven by the circuit output current $\Delta I$, the output current $\Delta I_{OUT}$ is produced from the transistor circuit 42 and is given by:

$$\Delta I_{OUT} = \frac{\beta}{2} V_{LO}^2 \alpha_{Fn}\tanh\left(\frac{V_{RF}}{2V_T}\right)\left(|V_{LO}| \leq \sqrt{\frac{2Io}{3\beta}}\right). \qquad (24)$$

From Equation (24), it is understood that the electronic circuit shown in FIG. 14 serves as the frequency multiplier and mixing circuit. This shows that the frequency multiplier and mixing circuit can be realized by a combination of a squaring circuit and the transistor circuit illustrated in FIG. 6.

Each of the frequency multiplier and mixing circuits illustrated in FIGS. 7, 8, 10, 11, 13, and 14 may be combined with a current mirror circuit in which the circuit output current $\Delta I$ of the squaring circuit is supplied through the current mirror circuit to drive the transistor circuit. This structure is effective to reduce a source voltage, although consumption of a current might be increased.

Figure 16:
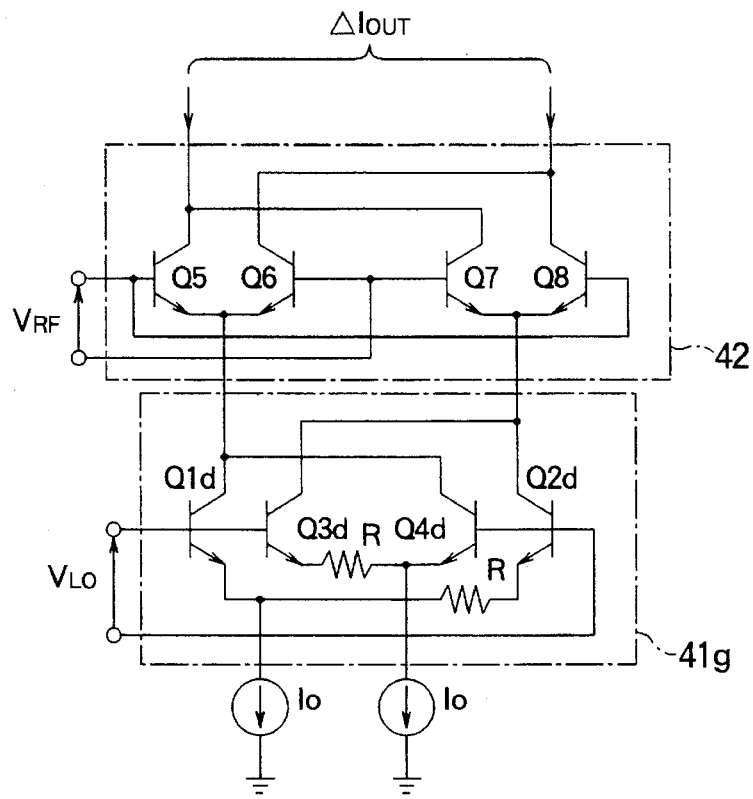
FIG. 16 is a circuit diagram of the electronic circuit which includes another squaring circuit.

Referring to FIG. 16, an electronic circuit according to a modification of the second embodiment of this invention comprises a combination of a squaring circuit 41*g* and the transistor circuit 42 identical with that illustrated in FIG. 6. The squaring circuit 41*g* comprises first through fourth transistors Q1*d* and Q4*d*. The emitters of the second and the third transistors Q2*d* and Q3*d* are connected through resistors R to the emitters of the transistors Q1d and Q4d, respectively, and connected to constant current sources Io and Io, respectively, as shown in FIG. 16. In addition, the bases of the transistors Q1d and Q3d are connected in common to each other to provide one of the circuit input terminals while the bases of the transistors Q2d and Q4d are also connected in common to each other to provide another circuit input terminal. A local signal $V_{LO}$ is given between the circuit input terminals.

Moreover, the collectors of the transistors Q1d and Q4d are connected in common to each other to provide one of the circuit output terminals while the collectors of the transistors Q2d and Q3d are connected to each other to provide another circuit output terminal.

The illustrated electronic circuit is also applicable as the frequency multiplier and mixing circuit.

Figure 17:
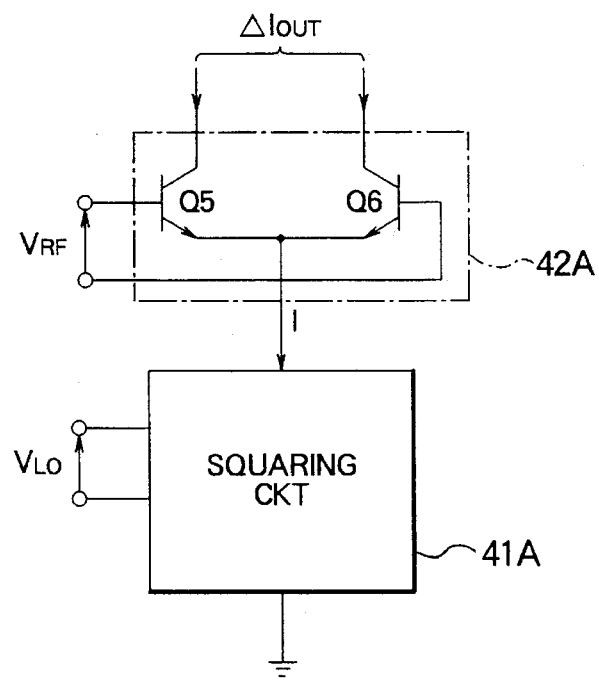
FIG. 17 is a circuit diagram of an electronic circuit according to a third embodiment of this invention.

Referring to FIG. 17, an electronic circuit according to a third embodiment of this invention comprises a squaring circuit 41A supplied with an input local signal voltage $V_{LO}$ of a local oscillator frequency $f_{LO}$ and a transistor circuit 42A supplied with a high frequency signal voltage $V_{RF}$ of a high frequency $f_{RF}$. The illustrated transistor circuit 42A comprises an emitter coupled pair which is formed by fifth and sixth transistors Q5 and Q6 having emitters connected in common to each other and which is driven by a circuit output current I of the squaring circuit 41A instead of the differential circuit output current $\Delta I$.

With this structure, an output current, namely, a differential output current $\Delta I_{OUT}$ appears across the collectors of the fifth and the sixth transistors Q5 and Q6 of the transistor circuit 42A. The differential output current $\Delta I_{OUT}$ is given by:

$$\Delta I_{OUT} = \alpha_{Fn} I \tanh\left(\frac{V_{RF}}{2V_T}\right). \quad (25)$$

The squaring circuit 41A may be composed of either one of the squaring circuits illustrated in FIGS. 2, 3, 4, 7, 11, 14, and 17. In this event, a selected one of the circuit output currents in each of the squaring circuits may be used as a circuit output current I of the squaring circuit 41A of FIG. 17 to drive the transistor circuit 42A. At any rate, the squaring circuit 41A is connected in cascade with the transistor circuit 42A. Under the circumstances, the circuit output current I of the squaring circuit 41A is given by:

$$I = \frac{I_E \pm \Delta I}{2}, \quad (26)$$

where $I_E$ is representative of a total sum value of tail currents.

As mentioned before, the differential circuit output current $\Delta I$ dominantly includes a double frequency component ($2f_{LO}$) equal to twice the local oscillator frequency $f_{LO}$. Therefore, the differential output current $\Delta I_{OUT}$ given by Equation (25) includes a product component of the double frequency component ($2f_{LO}$) and the high frequency $f_{RF}$. Since the product component is specified by $\cos(2\pi(2f_{LO})t)\cos(2\pi f_{RF})$, it is possible to obtain a sum frequency component ($2f_{LO}+f_{RF}$) and a difference frequency component ($2f_{LO}-f_{RF}$) between the double frequency component ($2f_{LO}$) and the high frequency $f_{RF}$. This shows that the electronic circuit illustrated in FIG. 17 is operable as the frequency multiplier and mixing circuit.

Figure 18:
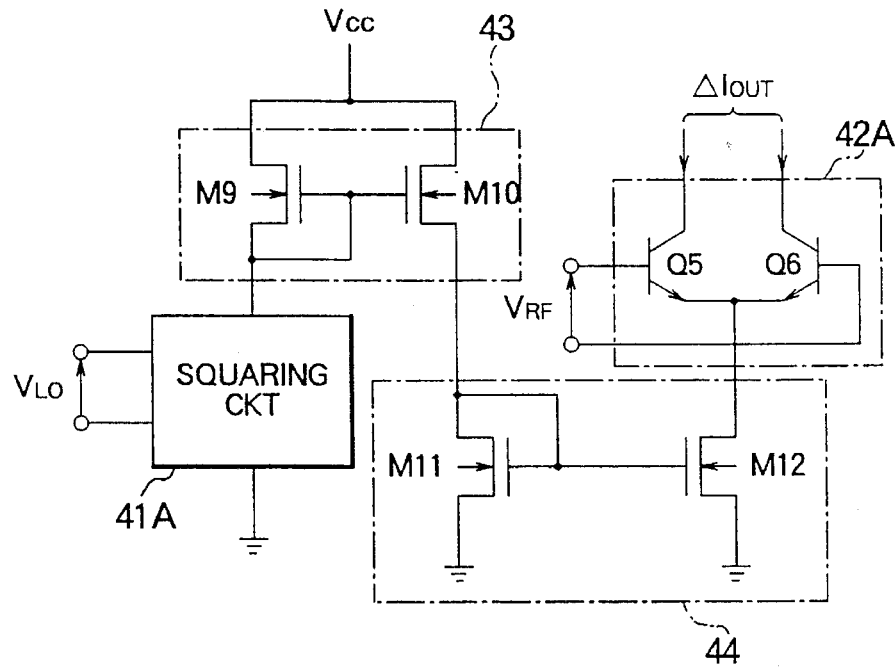
FIG. 18 is a circuit diagram of a modification of the electronic circuit illustrated in FIG. 17.

Referring to FIG. 18, a modification of the electronic circuit according to the third embodiment of this invention comprises first and second current mirror circuits 43 and 44 in addition to the squaring circuit 41A and the transistor circuit 42A both of which are identical with those illustrated in FIG. 17. The first current mirror circuit 43 comprises ninth and tenth MOS transistors M9 and M10 which have gates connected in common to each other. The gate of the ninth MOS transistor M9 is directly connected to the drain thereof to provide a diode connection and is also connected to the squaring circuit 41A while the sources of the ninth and the tenth MOS transistors M9 and M10 are supplied with a source voltage Vcc.

On the other hand, the second current mirror circuit 44 comprises eleventh and twelfth MOS transistors M11 and M12 which have gates connected in common to each other. The source of the eleventh MOS transistor M11 is connected to the gate thereof to form a diode connection like in the ninth MOS transistor M9 and is also connected to the drain of the tenth MOS transistor M10. The source of the twelfth MOS transistor M12 is connected to a point of connection at which the emitters of the fifth and the sixth transistors Q5 and Q6 are connected in common.

With this structure, the tenth MOS transistor M10 causes a current to flow therethrough in proportion to the circuit output current I of the squaring circuit 41A. Likewise, the twelfth MOS transistor M12 causes a current to flow therethrough in proportion to a current caused to flow through the eleventh MOS transistor M11. As a result, the transistor circuit 42A is driven by the current proportional to the circuit output current I of the squaring circuit 41A. This means that the circuit output current I is returned by the first and the second current mirror circuits 43 and 44 to drive the transistor circuit 42A. The illustrated electronic circuit serves as the frequency multiplier and mixing circuit and is effective to decrease the source voltage in comparison with the electronic circuit illustrated in FIG. 17.

Figure 19:
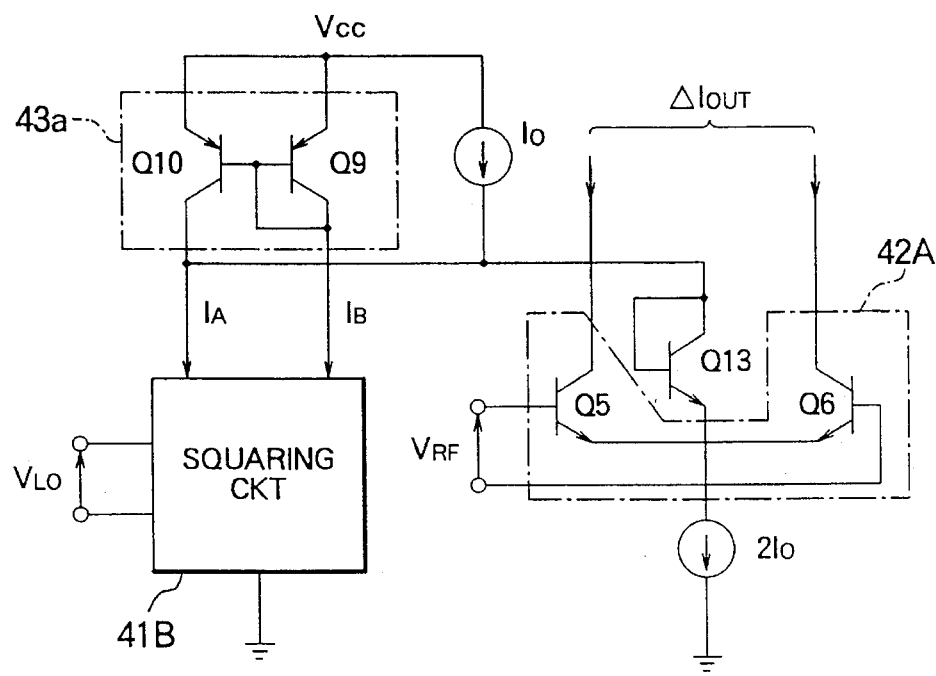
FIG. 19 is a circuit diagram of an electronic circuit according to a fourth embodiment of this invention.

Referring to FIG. 19, an electronic circuit according to a fourth embodiment of this invention comprises a transistor circuit 42A and a squaring circuit 41B which is somewhat different from that illustrated in FIG. 17, as will be mentioned later. In FIG. 19, the transistor circuit 42A is supplied with a high frequency signal voltage $V_{RF}$ and is driven by a constant current source of 2Io into which a circuit output current is caused to flow from the squaring circuit 41B supplied with the local signal voltage $V_{LO}$.

More specifically, the illustrated squaring circuit 41B is connected to a current mirror circuit 43a which comprises ninth and tenth bipolar transistors Q9 and Q10 having bases connected in common to each other. In addition, the base of the ninth bipolar transistor Q9 is connected to the collector thereof to establish a diode connection of the ninth bipolar transistor Q9. In the illustrated example, the collector of the tenth bipolar transistor Q10 is connected through a thirteenth bipolar transistor Q13 to the point of connection to which the emitters of the fifth and the sixth transistors Q5 and Q6 are connected in common. As illustrated in FIG. 19, the collector of the thirteenth bipolar transistor Q13 is connected to both the base thereof and the collector of the tenth bipolar transistor Q10. In addition, the emitter of the thirteenth bipolar transistor Q13 is connected to the point of connection between the emitters of the fifth and the sixth transistors Q5 and Q6. The constant current source of 2Io may cause a differential circuit output current $\Delta I$ to flow therethrough instead of the circuit output current I.

At first, let the circuit output current I be caused to flow through the constant current source of 2Io. The differential output current $\Delta I_{OUT}$ which appears across the collectors of the fifth and the sixth transistors Q5 and Q6 is given by:

$$\Delta I_{OUT} = \alpha_{Fn}(Io - I)\tanh\left(\frac{V_{RF}}{2V_T}\right). \quad (27)$$

On the other hand, let the differential circuit output current ΔI be caused to flow through the constant current circuit of 2Io. In this case, the differential output current $\Delta I_{OUT}$ is represented by:

$$\Delta I_{OUT} = \alpha_{Fn}(Io - \Delta I)\tanh\left(\frac{V_{RF}}{2V_T}\right). \quad (28)$$

From Equations (27) and (28), it is understood that the electronic circuit illustrated in FIG. 19 is operable as a frequency multiplier and mixing circuit.

Thus, it is possible to establish a frequency multiplier and mixing circuit by causing the circuit output current I to flow into the constant current source of 2Io through the thirteenth bipolar transistor Q13.

Figure 20:
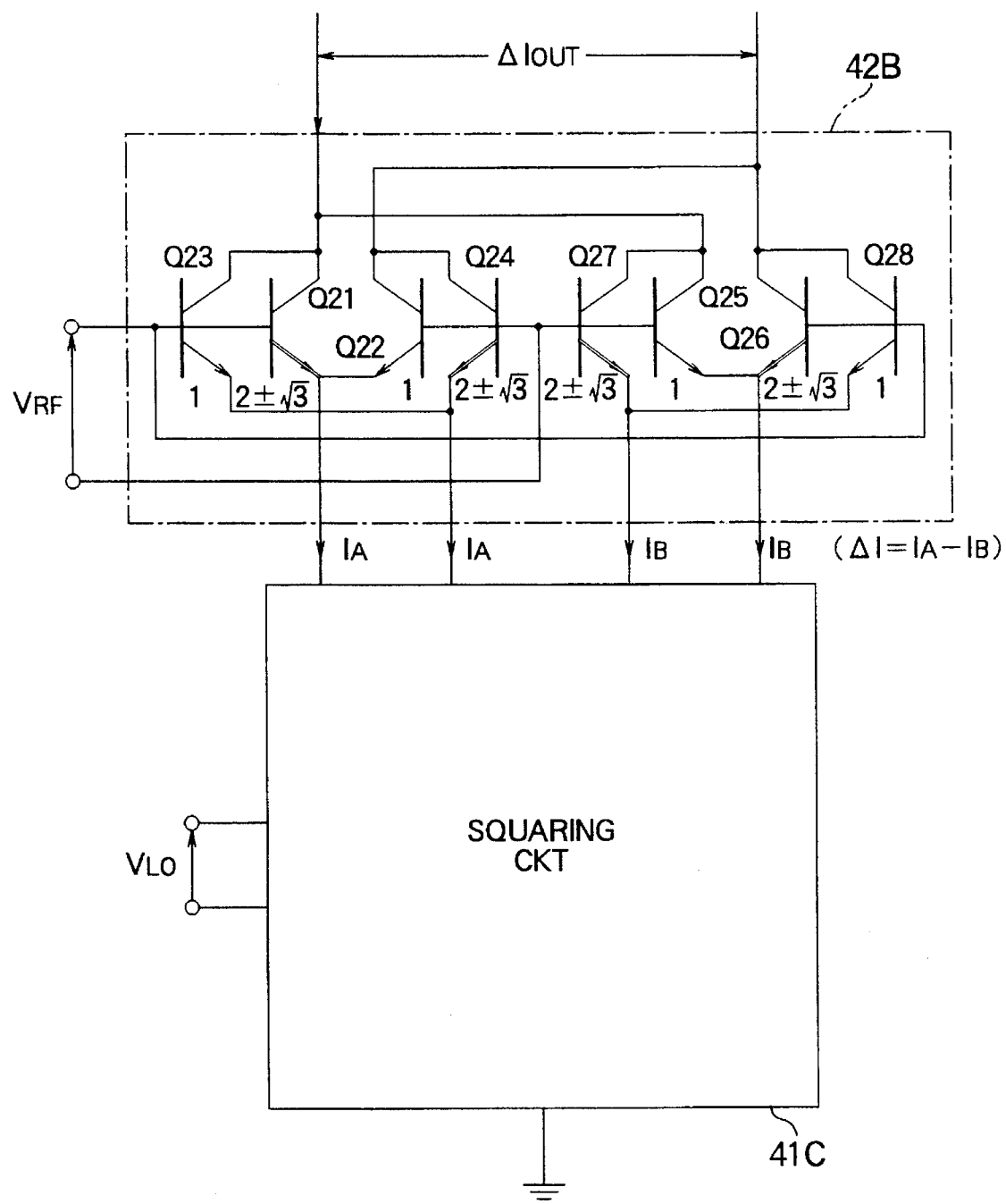
FIG. 20 is a block diagram of an electronic circuit according to a fifth embodiment of this invention.

Referring to FIG. 20, an electronic circuit according to a fifth embodiment of this invention comprises a squaring circuit 41c and a transistor circuit 42B which is different from that illustrated in FIG. 17. More particularly, the illustrated transistor circuit 42B comprises two sets of transistor circuits each of which comprises two cross-connected, emitter-coupled pairs of transistors. Each of the two cross-connected, emitter-coupled pairs comprises a pair of transistors, such as Q22 and Q21, Q23 and Q24, Q25 and Q26, Q28 and Q27, which have an emitter area ratio equal to 1:2±√3. The transistor circuit 42B is driven by a differential circuit output current ΔI (=IA−IB). With this structure, the differential output current $I_{OUT}$ is given by:

$$\Delta I_{OUT} = \alpha_{Fn}(\Delta I)\left[\tanh\left\{\frac{V_{RF}}{2V_T} + \frac{\ln(2\pm\sqrt{3})}{2}\right\} + \tanh\left\{\frac{V_{RF}}{2V_T} - \frac{\ln(2\pm\sqrt{3})}{2}\right\}\right] \quad (29)$$

$$= \alpha_{Fn}(\Delta I) \frac{\sinh\left(\frac{V_{RF}}{V_T}\right)}{\cosh\left(\frac{V_{RF}}{V_T}\right) + 2}.$$

Figure 21:
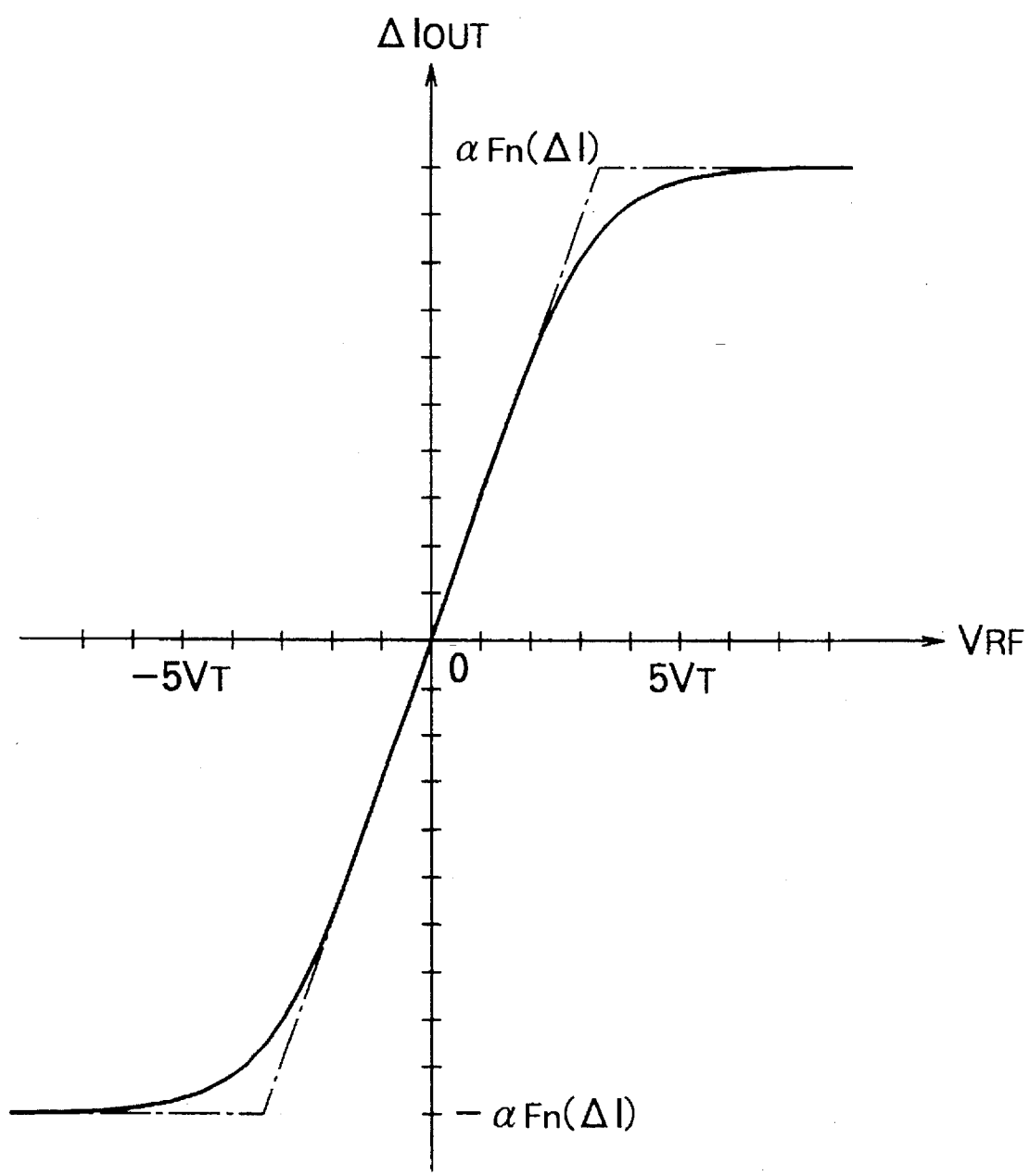
FIG. 21 shows a transfer characteristic of a transistor circuit illustrated in FIG. 20.
Figure 22:
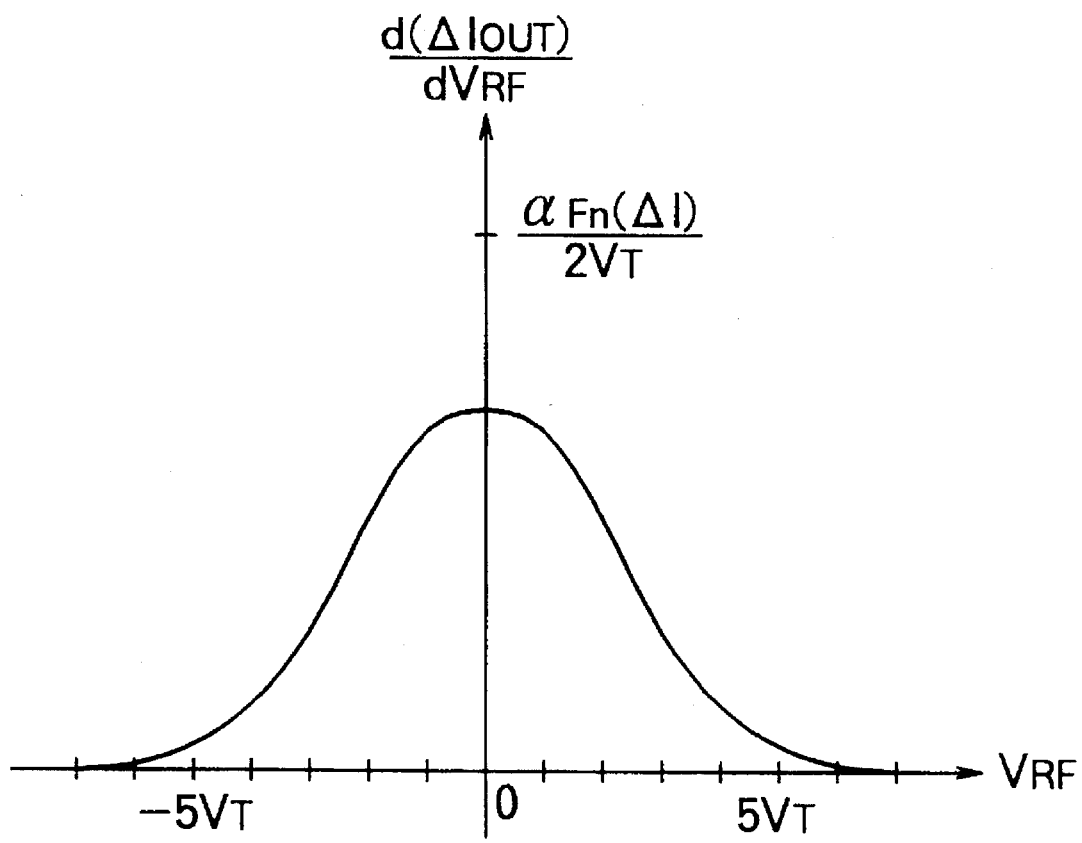
FIG. 22 shows a transconductance characteristic of the transistor circuit illustrated in FIG. 20.

The transistor circuit 42B illustrated in FIG. 20 exhibits a transfer characteristic as shown in FIG. 21 and a transconductance characteristic as shown in FIG. 22. It appears that the transistor circuit 42B of FIG. 20 is excellent in linearity in comparison with the case where the balanced differential pairs are used. This shows that a third-order distortion is improved in the transistor circuit 42 when the electronic circuit shown in FIG. 20 is operable as a mixing circuit.

In FIG. 20, two current mirror circuits are located between the squaring circuit 41C and the transistor circuit 42B like in FIG. 18. This structure is effective to decrease a source voltage, as mentioned in conjunction with FIG. 18.

Figure 23:
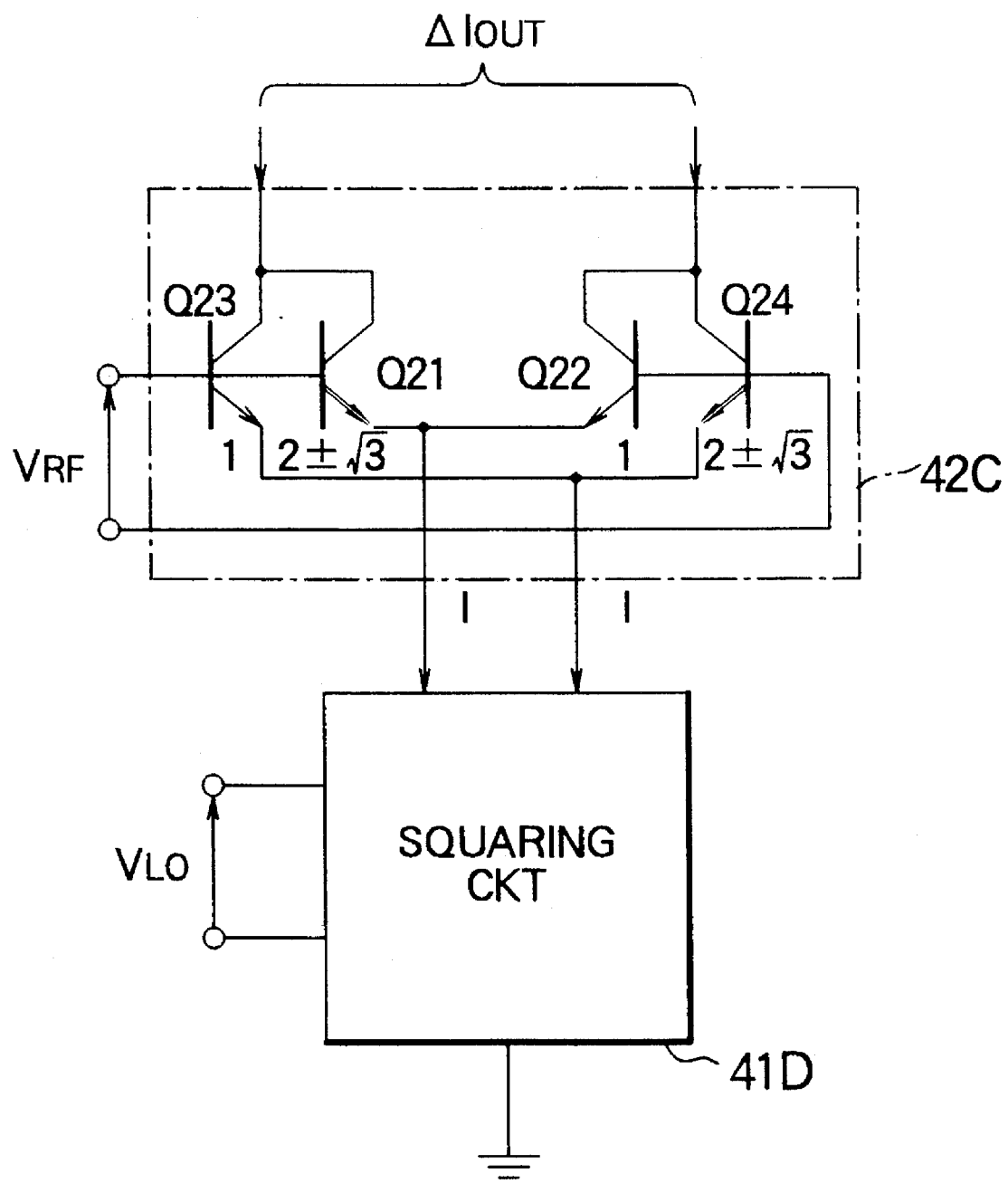
FIG. 23 is a block diagram of an electronic circuit according to a sixth embodiment of this invention.

Referring to FIG. 23, an electronic circuit according to a sixth embodiment of this invention comprises a squaring circuit 41D and a transistor circuit 42C which comprises two pairs of transistors Q21 and Q22; Q23 and Q24. Each pair is composed of a cross-connected, emitter-coupled pair of the transistors, such as Q22 and Q21, Q23 and Q24, which have an emitter area ratio equal to 1:2±√3. In the illustrated example also, it is possible to improve linearity by using the two transistors which have the emitter area ratio equal to 1:2±√3, instead of using the transistors of the emitter area ratio of 1:1.

At any rate, the differential output current $\Delta I_{OUT}$ of the electronic circuit illustrated in FIG. 23 is given by:

$$\Delta I_{OUT} = \alpha_{Fn}I \frac{\sinh\left(\frac{V_{RF}}{V_T}\right)}{\cosh\left(\frac{V_{RF}}{V_T}\right) + 2}, \quad (30)$$

where I is representative of the circuit output current that serves to provide one of the differential circuit output currents.

As is the case with FIG. 20, two current mirror circuits may be located between the squaring circuit 41D and the transistor circuit 42C in a manner similar to FIG. 18. This structure is also effective to decrease a source voltage.

Figure 24:
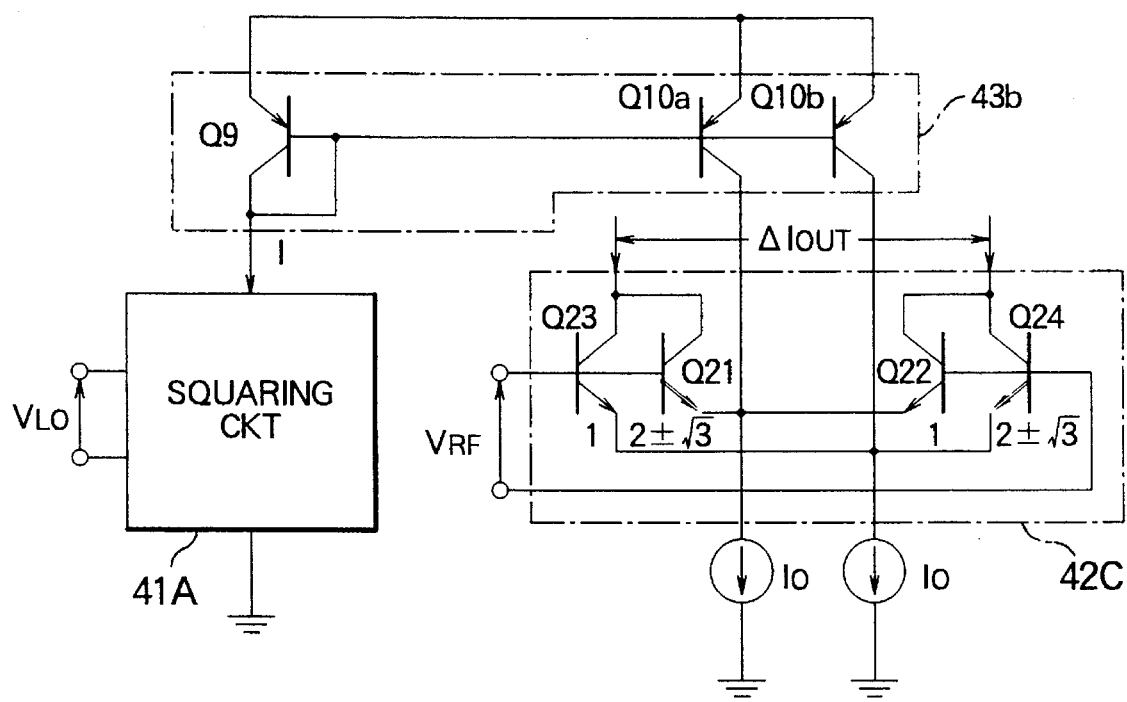
FIG. 24 is a circuit diagram of an electronic circuit according to a seventh embodiment of this invention.

Referring to FIG. 24, an electronic circuit according to a seventh embodiment of this invention comprises a current mirror circuit 43b composed of transistors Q9, Q10a, and Q10b, and a transistor circuit 42C composed of two pairs of cross-connected, emitter-coupled transistors, such as Q21 and Q22, Q23 and Q24. With this structure, the circuit output current (I or ΔI) is caused to flow through the current mirror circuit 43b and the transistor circuit 42C to two constant current sources Io and Io. This electronic circuit has a characteristic equivalent to that of the electronic circuit illustrated in FIG. 18 and is therefore operable as the frequency multiplier and mixing circuit.

Figure 25:
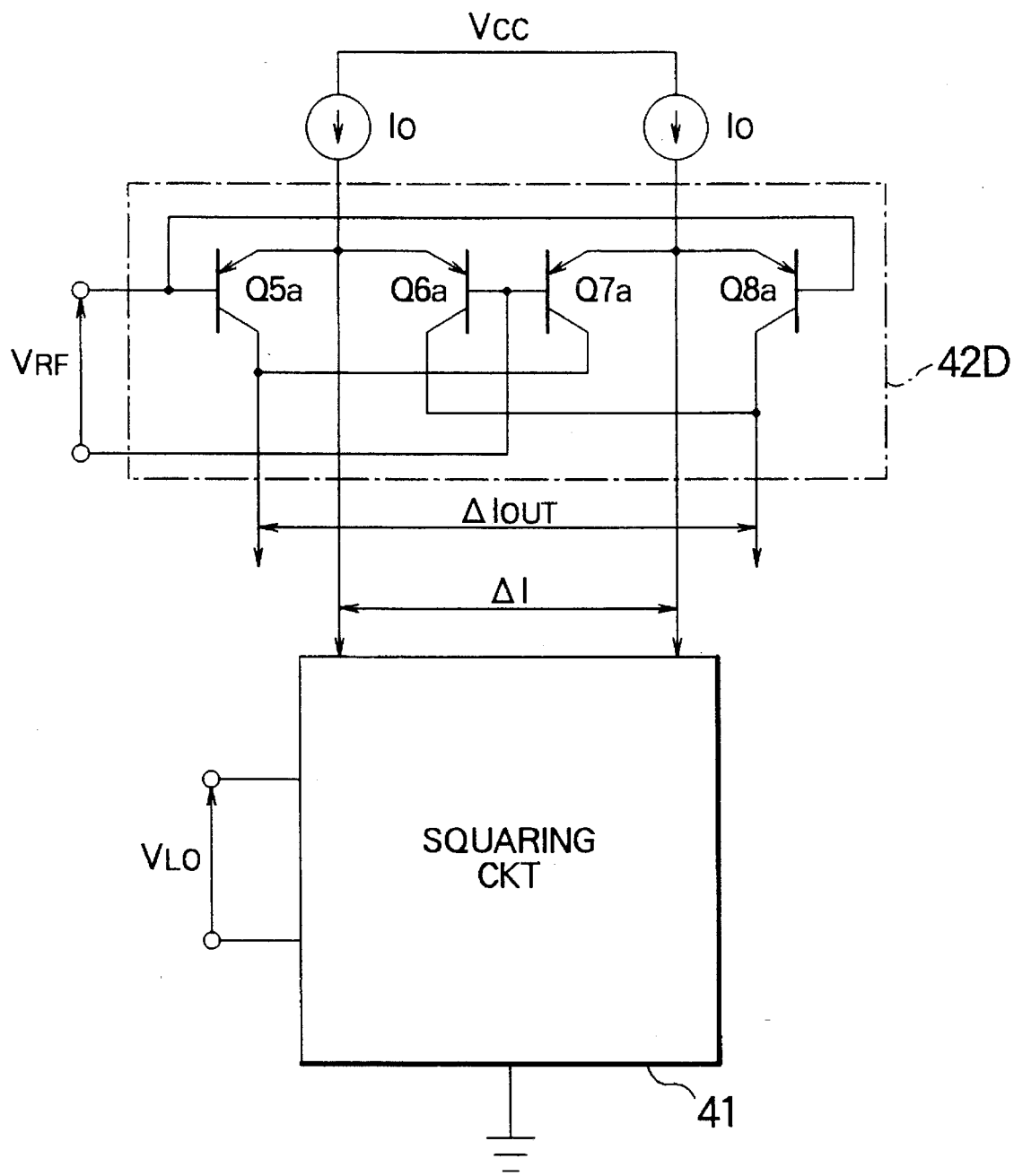
FIG. 25 is a block diagram of an electronic circuit according to an eighth embodiment of this invention.

Referring to FIG. 25, an electronic circuit according to an eighth embodiment of this invention comprises a squaring circuit (depicted at 41) and a transistor circuit 42D which comprises fifth through eighth transistors Q5a to Q8a connected in a manner different from the other figures, as illustrated in FIG. 25. Specifically, the fifth and the sixth transistors Q5a and Q6a have emitters connected in common to each other and connected to a constant current source Io while the seventh and the eighth transistors Q7a and Q8a have emitters connected in common to each other and connected to another constant current source Io. In addition, the bases of the fifth and the eight transistors Q5a and Q8a are connected in common to each other to provide one of input terminals for the high frequency voltage $V_{RF}$ while the bases of the sixth and the seventh transistors Q6a and Q7a are also connected in common to each other to provide another one of the input terminals for the high frequency voltage $V_{RF}$. Furthermore, the collector of the fifth transistor Q5a is connected in common to the collector of the seventh transistor Q7a while the collector of the sixth transistor Q6a is connected to the collector of the eighth transistor Q8a, as illustrated in FIG. 25. The differential output current $\Delta I_{OUT}$ appears across the collectors of the fifth and the eighth transistors Q5a and Q8a.

From this fact, it is readily understood that the fifth and the sixth transistors Q5a and Q6a form a cross-connected, emitter-coupled pair while the seventh and the eighth transistors Q7a and Q8a form another cross-connected, emitter-coupled pair. It is to be noted that the connections of the fifth through the eighth transistors Q5a to Q8a are reversed in polarities relative to those of the transistors Q5 to Q8 illustrated in FIG. 6, because the transistors Q5a to Q8a are formed by pnp transistors.

The squaring circuit 41 is given the local signal voltage $V_{LO}$ and supplies the differential circuit output current ΔI to the constant current sources Io and Io.

Under the circumstances, a relationship between the differential circuit output current ΔI and the differential output current $\Delta I_{OUT}$ is given by:

$$\Delta I_{OUT} = \alpha_{Fp}(\Delta I)\tanh\left(\frac{V_{RF}}{2V_T}\right), \quad (31)$$

where $\alpha_{Fp}$ is representative of a d.c. common-base current gain factor of a pnp transistor.

Figure 26:
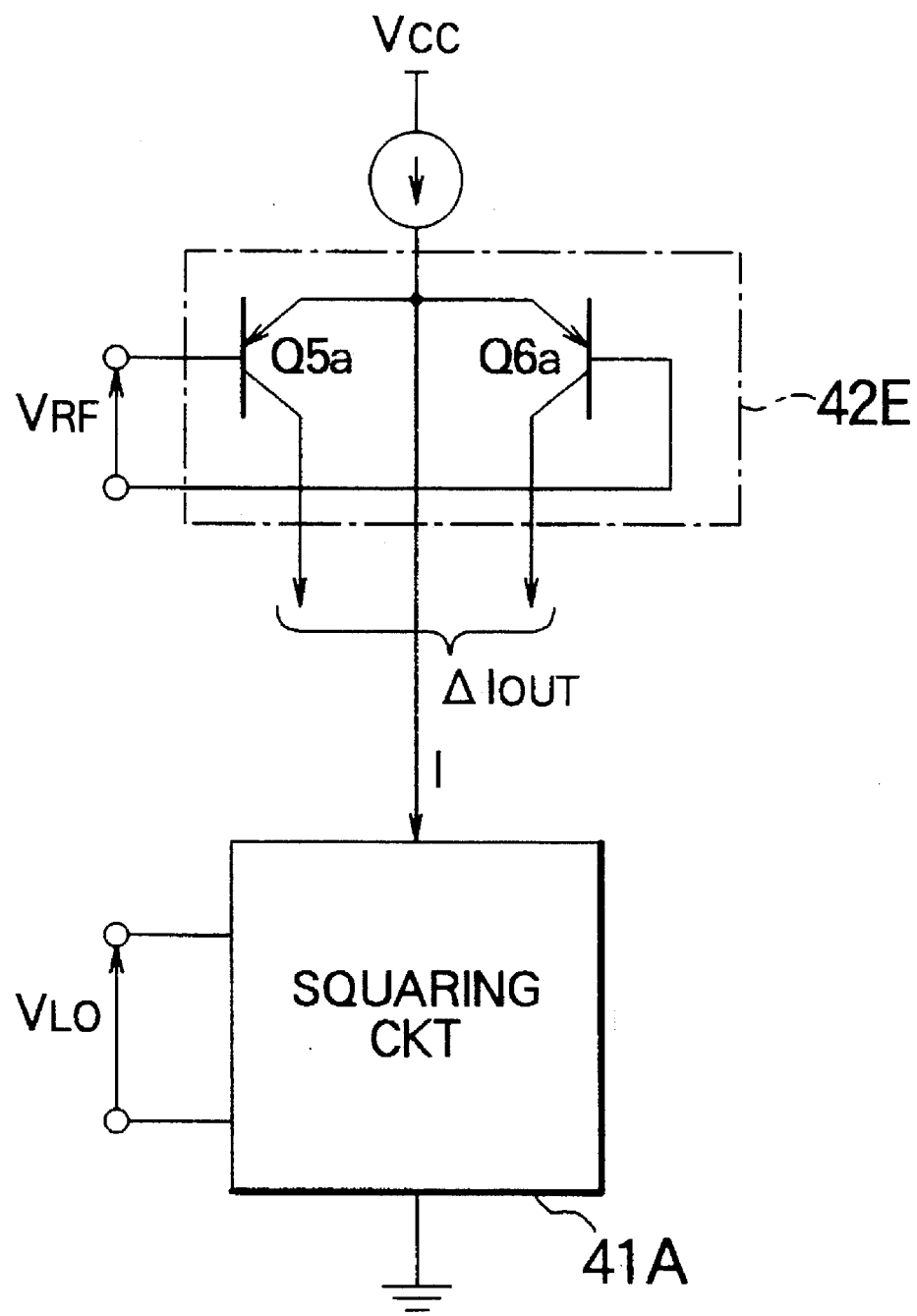
FIG. 26 is a block diagram of an electronic circuit according to a ninth embodiment of this invention.

Referring to FIG. 26, an electronic circuit according to a ninth embodiment of this invention comprises a squaring circuit (depicted at 41A) and a transistor circuit 42E composed of fifth and sixth transistors Q5a and Q6a which have emitters connected in common to each other, collectors across which the differential output current $\Delta I_{OUT}$, and bases given the high frequency voltage $V_{RF}$, as shown in FIG. 26. Thus, the fifth and the sixth transistors Q5a and Q6a form an emitter-coupled pair. In other words, the connections of the transistors Q5a and Q6a are reversed in polarities relative to the connections of the transistors Q5 and Q6 illustrated in FIG. 17.

When the squaring circuit 41A is assumed to produce a circuit output current I, as shown in FIG. 26, the differential output current $\Delta I_{OUT}$ is given by:

$$\Delta I_{OUT} = \alpha_{Fp} I \tanh\left(\frac{V_{RF}}{2V_T}\right). \quad (32)$$

Figure 27:
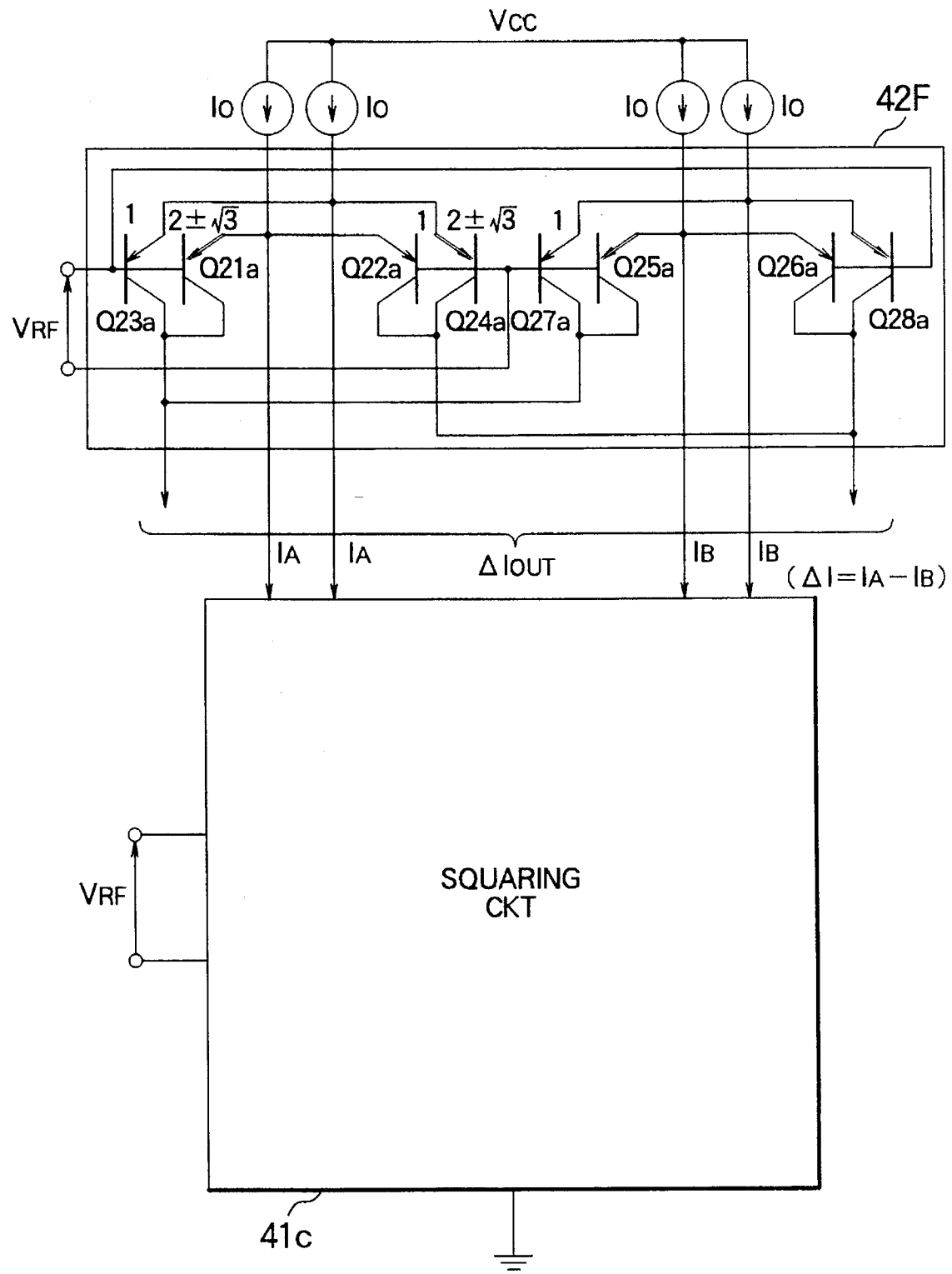
FIG. 27 is a block diagram of an electronic circuit according to a tenth embodiment of this invention.

Referring to FIG. 27, an electronic circuit according to a tenth embodiment of this invention comprises a squaring circuit (depicted at 41C) and a transistor circuit 42F. The squaring circuit 41C is formed by the MOS transistors shown in FIG. 8 while the transistor circuit 42F is formed by transistors Q21a to Q28a. Each emitter area ratio between each of the transistors Q22a, 23a, 26a, and 27a and each of the transistors Q21a, Q24a, Q25a, and Q28a is equal to $1:2\pm\sqrt{3}$. The illustrated transistor circuit 42F is similar to that illustrated in FIG. 20 except that the transistors Q21a to Q28a are different in polarities or conductivity from those illustrated in FIG. 20.

When the circuit output current is supplied from the squaring circuit 41C in the form of a differential circuit output current $\Delta I$, the differential output current $\Delta I_{OUT}$ is given by:

$$\Delta I_{OUT} = \alpha_{Fp}(Io - \Delta I)\frac{\sinh\left(\frac{V_{RF}}{V_T}\right)}{\cosh\left(\frac{V_{RF}}{V_T}\right)+2}. \quad (33)$$

On the other hand, when the circuit output current is given by I, the differential output current $\Delta I_{OUT}$ is represented by:

$$\Delta I_{OUT} = \alpha_{Fp}(Io - I)\frac{\sinh\left(\frac{V_{RF}}{V_T}\right)}{\cosh\left(\frac{V_{RF}}{V_T}\right)+2}. \quad (34)$$

Figure 28:
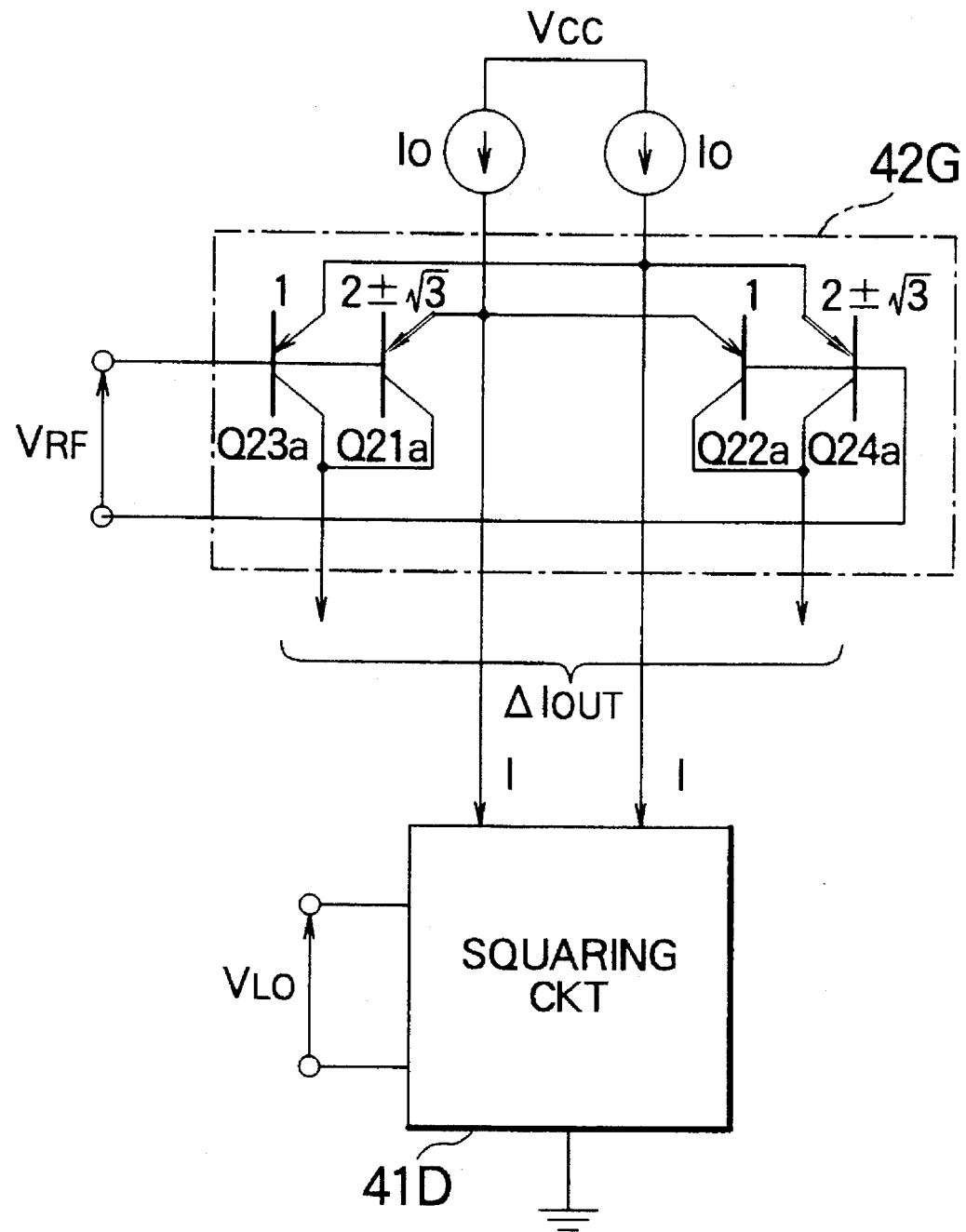
FIG. 28 is a similar diagram of an electronic circuit according to an eleventh embodiment of this invention.

Referring to FIG. 28, an electronic circuit according to an eleventh embodiment of this invention comprises a squaring circuit (depicted at 41D) and a transistor circuit 42G composed of pnp transistors Q21a to Q24a. Each emitter area ratio between the transistors Q22a and Q23a and the transistors Q21a and Q24a is given by $1:2\pm\sqrt{3}$. This shows that the transistors Q21a to Q24a have conductivity different from that of the transistors Q21 to Q24 illustrated in FIG. 23. With this structure, the differential output current $\Delta I_{OUT}$ is represented by:

$$\Delta I_{OUT} = \alpha_{Fp}(\Delta I)\frac{\sinh\left(\frac{V_{RF}}{V_T}\right)}{\cosh\left(\frac{V_{RF}}{V_T}\right)+2}. \quad (35)$$

In FIGS. 25 through 28, it is assumed that the squaring circuit 41 (suffixes omitted) is formed by npn transistors while the transistor circuit 42 (suffixes omitted) is formed by pnp transistors. However, the squaring circuit 41 may be composed of pnp transistors while the transistor circuit 42 may be composed of npn transistors.

Figure 29:
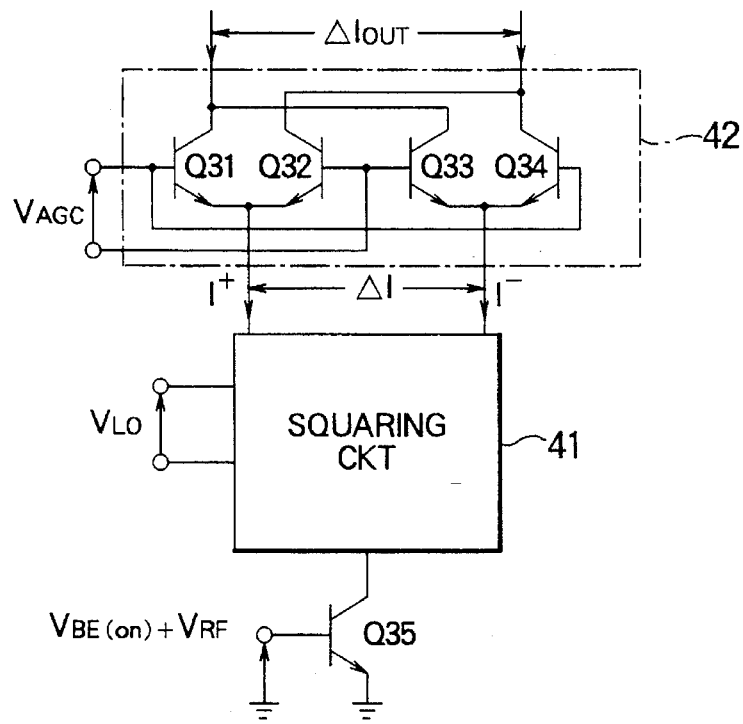
FIG. 29 is a similar diagram of an electronic circuit according to a twelfth embodiment of this invention.

Referring to FIG. 29, an electronic circuit according to a twelfth embodiment of this invention is operable as a frequency multiplier and mixing circuit which has an automatic gain control (AGC) function and which will be referred to as a frequency multiplier and mixing circuit with AGC. This shows that the electronic circuit illustrated in FIG. 29 is tunable by an AGC control voltage $V_{AGC}$ and may be referred to as a tunable electronic circuit.

In FIG. 29, the illustrated electronic circuit is supplied with the AGC control voltage $V_{AGC}$ in addition to the high frequency voltage $V_{RF}$ and the local signal voltage $V_{LO}$. The electronic circuit comprises a transistor circuit (depicted at 42) supplied with the AGC control voltage $V_{AGC}$, a squaring circuit 41 supplied with the local signal voltage $V_{LO}$, and a constant current source circuit specified by a single transistor Q35.

In the constant current source circuit, the high frequency voltage $V_{RF}$ is superposed on a base voltage $V_{BE(on)}$ and a superposed voltage is given across the emitter and the base of the transistor Q35.

Connected to the collector of the transistor Q35, the squaring circuit 41 is formed in a manner to be described later and produces a differential circuit output current $\Delta I$ in response to the local signal voltage $V_{LO}$ to drive the transistor circuit 41.

The illustrated transistor circuit 41 comprises a pair of emitter-coupled transistors, namely, Q31 and Q32; Q33 and Q34. In other words, the transistors Q31 and Q32 have the emitters connected in common to each other. This applies to the transistors Q33 and Q34. The differential circuit output current $\Delta I$ is given between the common-connected emitters of the transistors Q31 and Q32 and the transistors Q33 and Q34.

In addition, the collectors of the transistors Q31 and Q32 are connected to the collectors of the transistors Q33 and Q34, respectively. This shows that output terminals of the transistors Q31 and Q32 are cross connected to output terminals of the transistors Q33 and Q34 to form output terminals, respectively. Accordingly, the illustrated transistor circuit 42 may be called a cross-connected, emitter-coupled circuit.

The bases of the transistors Q31 and Q34 are connected in common to each other while the bases of the transistors Q32 and Q33 are also connected in common to each other. In the illustrated example, the transistor circuit, namely, the cross-connected, emitter-coupled circuit 42 produces a differential output current $\Delta I_{OUT}$ across the output terminals in response to the differential circuit output current $\Delta I$ and the AGC control voltage $V_{AGC}$.

Although the constant current source circuit (Q35) and the transistor circuit 42 are given the high frequency voltage $V_{RF}$ and the AGC control voltage $V_{AGC}$, respectively, in the illustrated example, the high frequency voltage $V_{RF}$ and the AGC control voltage $V_{AGC}$ may be given to the transistor circuit 42 and the constant current source circuit, (Q35), respectively.

In the illustrated example, the differential output current $\Delta I_{OUT}$ is given by the use of the differential circuit output current $\Delta I$ by:

$$\Delta I_{OUT} = \alpha_F (\Delta I) \tanh\left(\frac{V_{AGC}}{2V_T}\right), \quad (36)$$

where $\alpha_F$ is representative of a d.c. common-base current gain factor of each transistor included in the squaring circuit 41.

Herein, it is to be noted that the differential circuit output current $\Delta I$ is determined by a structure of the squaring circuit 41.

Figure 30:
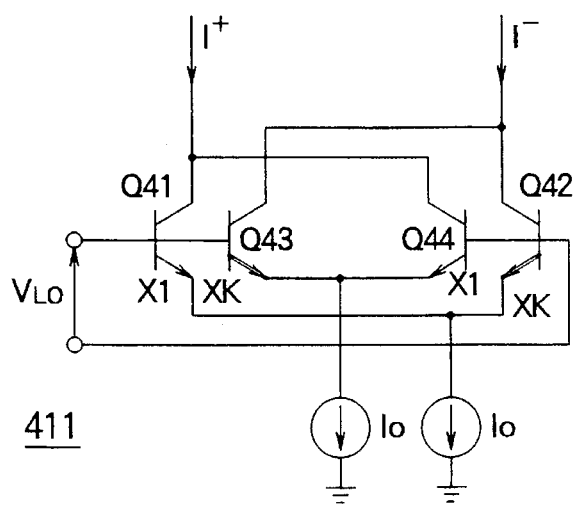
FIG. 30 is a circuit diagram of a squaring circuit which is usable in the electronic circuit illustrated in FIG. 29.

Referring to FIG. 30, an example of the squaring circuit 41 is illustrated which is used in the electronic circuit of FIG. 29 and which is depicted at 411 in FIG. 30. Specifically, the illustrated squaring circuit 411 is composed of a combination of unbalanced differential transistor pairs, such as Q41 and Q42; Q43 and Q44. The transistors Q41 and Q42; Q43 and Q44 of each pair have emitters connected in common to each other and connected to a constant current source depicted at Io. As illustrated in FIG. 30, an emitter area ratio of the transistors, such as Q42 and Q41; Q43 and Q44, of each pair is represented by K:1. Between the two transistor pairs, the transistors, such as Q41 and Q44, having an emitter area of 1 have the bases connected to the bases of the transistors, such as Q43 and Q42 having an emitter area of K, respectively. In other words, the bases of the transistors Q41 and Q43 which are specified by the emitter area ratio of K:1 are connected in common to each other to provide a circuit input terminal while the bases of the transistors Q42 and Q44 which are specified by the emitter area ratio of K:1 are connected in common to each other to provide another circuit input terminal.

On the other hand, the collectors of the transistors Q41 and Q44 which have the emitter area of 1 are connected in common to each other to provide a circuit output terminal while the collectors of the transistors Q43 and Q42 which have the emitter area of K are also connected in common to each other to provide another circuit output terminal. Thus, the collectors of the transistors Q41 and Q42 in one emitter coupled pair are cross connected to the collectors of the transistors Q44 and Q43 in the other emitter coupled pair, respectively. Accordingly, the squaring circuit 411 shown in FIG. 30 may be also called a cross-connected, emitter-coupled circuit.

With this structure, circuit output currents I+ and I− are caused to flow through the one and the other circuit output terminals connected to the common-connected collectors of the transistors Q41 and Q44 and the transistors Q42 and Q43, as shown in FIG. 30. In other words, the differential circuit output current $\Delta I$ is equal to I+−I− and is given by:

$$\Delta I = \alpha_F I_o \left\{ \tanh\left(\frac{V_{LO}}{2V_T} - \frac{\ln K}{2}\right) - \tanh\left(\frac{V_{LO}}{2V_T} + \frac{\ln K}{2}\right) \right\} \quad (37)$$

$$= -2\alpha_F I_o \left\{ \frac{K - \frac{1}{K}}{2\cosh\left(\frac{V_{LO}}{V_T}\right) + K + \frac{1}{K}} \right\}.$$

Figure 31:
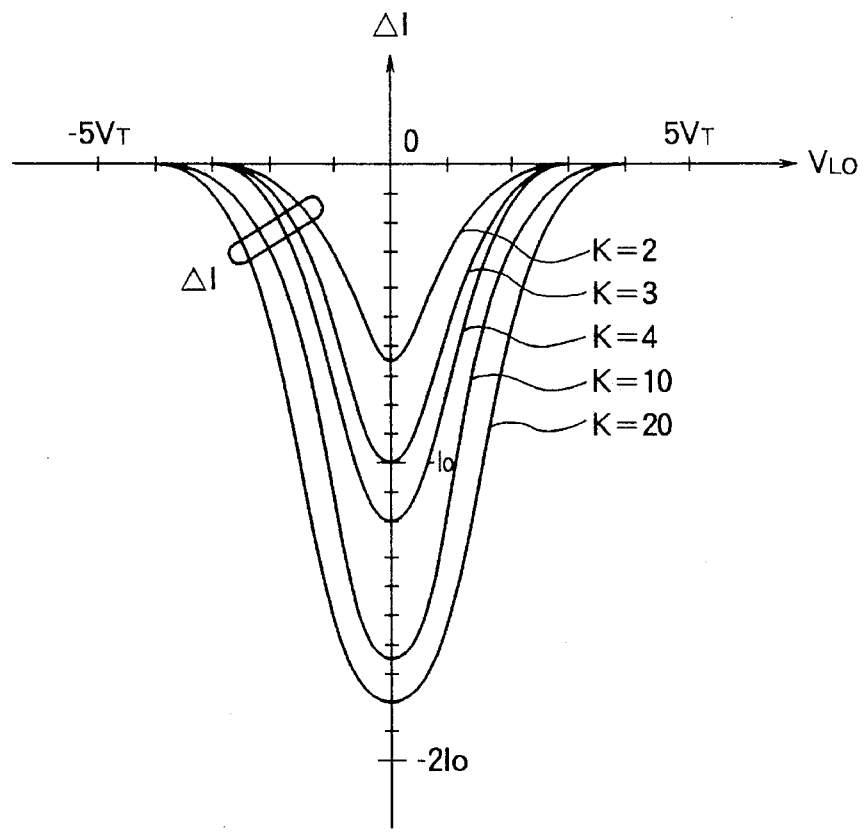
FIG. 31 shows transfer characteristics of the squaring circuit illustrated in FIG. 30.

In FIG. 31, transfer characteristics of the square circuit 411 are illustrated by using the emitter area ratios as parameters. Specifically, FIG. 31 shows a relationship between the local signal voltage $V_{LO}$ and the differential circuit output current $\Delta I$ taken along the abscissa and the ordinate, respectively. It has been confirmed that the squaring circuit 411 has a widest input voltage range in relation to the local signal voltage $V_{LO}$ when K is about 9.9. Under the circumstances, if the input voltage range is restricted within a range of $\pm 2V_T$, the squaring circuit 411 exhibits an excellent squaring characteristic. This means that the local oscillator frequency $f_{LO}$ is doubled by the squaring circuit 411 to obtain an output frequency $(2f_{LO})$ equal to twice the local oscillator frequency $f_{LO}$. Moreover, when the local signal voltage $V_{LO}$ is restricted within the range of $\pm 2V_T$, it is possible to obtain the output frequency $(2f_{LO})$ equal to twice the local oscillator frequency without using any filter. This enables direct connection of the electronic circuit to the other circuit. Accordingly, it is said that the electronic circuit is suitable to be formed by the use of a large scale integration technique.

More specifically, let the local signal voltage $V_{LO}$ be given by:

$$V_{LO} = |V_{LO}| \cos(2\pi f_{LO} t). \quad (38)$$

In this event, a squared voltage $V_{LO}^2$ is represented by:

$$V_{LO}^2 = |V_{LO}|^2 \frac{1 - \cos\{2\pi(2f_{LO})t\}}{2}. \quad (39)$$

Under the circumstances, the differential circuit output current $\Delta I$ of the squaring circuit 411 is given by:

$$\Delta I \approx -\alpha_F I_o |V_{LO}|^2 \left\{ \frac{K - \frac{1}{K}}{2 + K + \frac{1}{K}} \right\} \times [1 - \cos\{2\pi(2f_{LO})t\}], \quad (40)$$

where $|V_{LO}| < 2V_T$.

As a result, the differential output current $\Delta I_{OUT}$ of the transistor circuit 42 is represented by:

$$\Delta I_{OUT} \approx -\alpha_F^2 I_o |V_{LO}|^2 \left\{ \frac{K - \frac{1}{K}}{2 + K + \frac{1}{K}} \right\} \times \quad (41)$$

$$[1 - \cos\{2\pi(2f_{LO})t\}] \tanh\left(\frac{V_{AGC}}{2V_T}\right),$$

where $|V_{LO}| < 2V_T$.

In FIG. 29, since the high frequency voltage $V_{RF}$ is superposed on the constant current Io produced by the constant current circuit specified by the transistor Q35, the following equation (42) holds:

$$I_o = I_s \exp\left[\frac{V_{BE(on)} + |V_{RF}|\cos(2\pi f_{RF} t)}{V_T}\right] \quad (42)$$

$$= I_{oo} \exp\left[\frac{|V_{RF}|\cos(2\pi f_{RF} t)}{V_T}\right].$$

Equation (42) can be expanded into a series which is given by:

$$I_o = I_{oo}\left[1 + \frac{|V_{RF}|}{V_T}\cos(2\pi f_{RF} t) + \frac{1}{2}\frac{|V_{RF}|^2}{V_T^2}\cos^2(2\pi f_{RF} t) + \frac{1}{6}\frac{|V_{RF}|^3}{V_T^3}\cos^3(2\pi f_{RF} t) + \ldots\right]. \quad (43)$$

When the second order term and its higher order terms are neglected on the assumption that $|V_{RF}|$ is very smaller than $V_T$, Equation (43) is rewritten into Equation (44) which is approximately given by:

$$I_o \approx I_{oo}\left\{1 + \frac{|V_{RF}|}{V_T}\cos(2\pi f_{RF} t)\right\}. \quad (44)$$

Consequently, the differential output current $\Delta I_{OUT}$ of FIG. 29 is approximated by:

$$\Delta I_{OUT} \approx -\alpha_F^2 I_{oo} \tanh\left(\frac{V_{AGC}}{2V_T}\right) |V_{LO}|^2 \left\{ \frac{K - \frac{1}{K}}{2 + K + \frac{1}{K}} \right\} \times \quad (45)$$

$$[1 - \cos\{2\pi(2f_{LO})t\}] \times \left\{ 1 + \frac{|V_{RF}|}{V_T} \cos(2\pi f_{RF} t) \right\},$$

on the assumption that $|V_{RF}| \ll V_T$ and $|V_{LO}| < 2 V_T$.

Equation (45) includes a product of twice the local oscillator frequency $f_{LO}$ and the high frequency $f_{RF}$, as represented by:

$$\cos(2\pi(2f_{LO})t) \cos(2\pi f_{RF}). \quad (46)$$

The formula (46) can be rewritten into:

$$\cos(2\pi(2f_{LO})t) \cos(2\pi f_{RF}t) = \cos(2\pi(2f_{LO}+f_{RF})t) + \cos(2\pi(2f_{LO}-f_{RF})t). \quad (47)$$

From Equations (45) and (47), it is understood that the electronic circuit illustrated in FIG. 29 is operable as the frequency multiplier and mixing circuit tunable by the AGC control voltage $V_{AGC}$ because a sum frequency component and a difference frequency component between $2f_{LO}$ and $f_{RF}$ are produced in the differential output current $\Delta I_{OUT}$ along with the AGC control voltage $V_{AGC}$.

Herein, it is to be noted that the constant current circuit may be usually structured by a current mirror circuit which has emitters grounded. However, emitter resistors may be practically connected to the emitters so as to improve a third order distortion which might appear when the electronic circuit is operated as a mixing circuit. Alternatively, the emitters may be grounded through capacitors so as to augment a high frequency gain and to reduce ground resistances on impressing the high frequency voltage $V_{RF}$ superposed on the base voltage $V_{BE(on)}$.

When the AGC control voltage $V_{AGC}$ and the high frequency voltage $V_{RF}$ are given to the transistor circuit 42 and the constant current circuit, respectively, as shown in FIG. 29, it is to be noted that positive feedback which might occur on supply of the AGC control voltage $V_{AGC}$ to the cross-connected, emitter-coupled circuit should be avoided in the transistor circuit 42. To this end, the AGC control voltage $V_{AGC}$ must be produced so that either a positive or a negative one of the AGC control voltage $V_{AGC}$ should be supplied to the cross-connected, emitter-coupled circuit.

On the other hand, when the AGC control voltage $V_{AGC}$ is supplied to the constant current circuit, a square of the AGC control voltage $V_{AGC}$ may be given to the constant current circuit because the constant current circuit itself is operated by a positive voltage alone.

Figure 32:
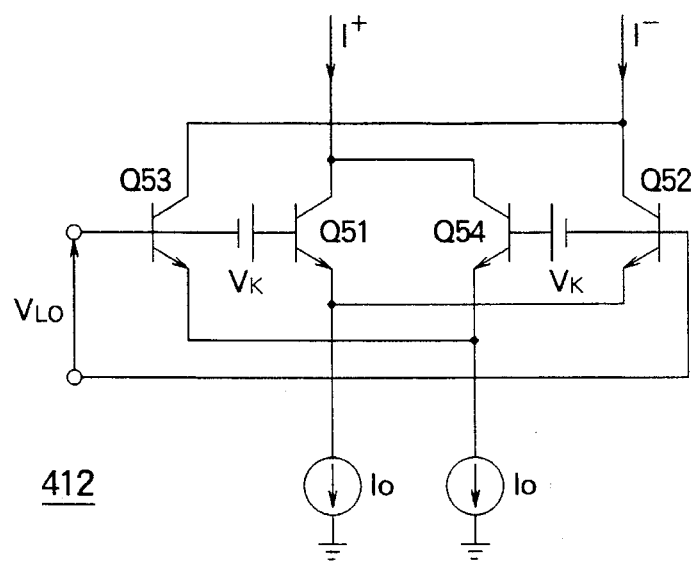
FIG. 32 is a circuit diagram of another squaring circuit that is usable in the electronic circuit illustrated in FIG. 29.

Referring to FIG. 32, another squaring circuit 412 is also applicable to the electronic circuit illustrated in FIG. 29 and comprises four transistors Q51 to Q54 each of which has the same emitter area. Instead, an offset voltage $V_K$ is impressed on each base of the transistors Q51 and Q54 which have the emitters connected to the emitters of the transistors Q52 and Q53 to which no offset voltage is given, respectively. Thus, an emitter-coupled pair is formed by the transistors Q51 and Q52 supplied with the offset voltage $V_K$ and no offset voltage, respectively, while another emitter-coupled pair is formed by the transistors Q54 and Q53 supplied with the offset voltage $V_K$ and no offset voltage, respectively. In addition, the collector of the transistor Q51 in the one emitter-coupled pair is cross connected to the collector of the transistor Q54 in another emitter-coupled pair to provide one of circuit output terminals. Likewise, the collector of the transistor Q52 in the one emitter-coupled pair is cross-connected to the collector of the transistor Q53 in another emitter-coupled pair to provide another circuit output terminal. Therefore, the illustrated squaring circuit 412 also forms a cross-connected emitter-coupled circuit. The emitters of the transistors Q51 and Q52 are connected to a constant current source Io while the emitters of the transistors Q53 and Q54 are connected to another constant current source Io. Both the constant current sources Io and Io form the constant current circuit like in FIG. 29.

A circuit output current I+ is caused to flow through the collectors of the transistors Q51 and Q54 while another circuit output current I− is caused to flow through the collectors of the transistors Q52 and Q53. As a result, a differential circuit output current $\Delta I$ appears across the circuit output terminals.

With this structure, the differential circuit output current $\Delta I$ is represented by:

$$\Delta I = \alpha_F I_o \left\{ \tanh\left(\frac{V_{LO} - V_K}{2V_T}\right) - \tanh\left(\frac{V_{LO} - V_K}{2V_T}\right) \right\}. \quad (48)$$

If $V_K = V_T \ln K$, it is found out that the squaring circuit 412 is equivalent to the squaring circuit 411 illustrated in FIG. 30.

Figure 33:
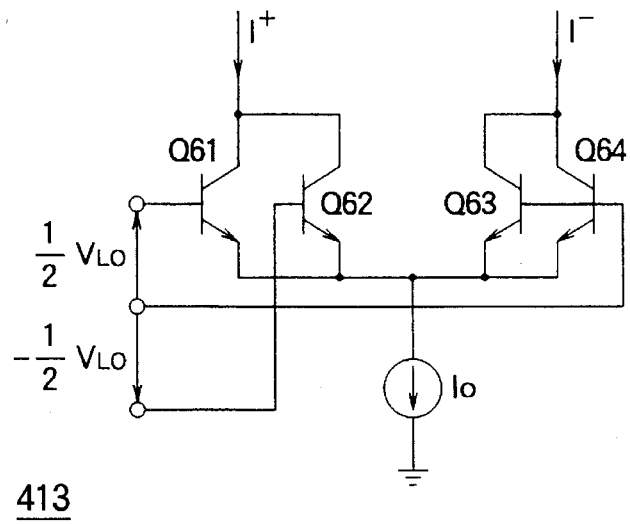
FIG. 33 is a similar diagram of still another squaring circuit that is usable in the electronic circuit illustrated in FIG. 29.

Referring to FIG. 33, a squaring circuit 413 is also used as the squaring circuit 41 illustrated in FIG. 29 and comprises four transistors Q61 to Q64 having emitters which are connected in common to one another and which are driven by a single tail current Io. In this connection, the illustrated squaring circuit 413 may be referred to as a quadritail cell. As shown in FIG. 33, the collectors of the transistors Q61 and Q62 are connected in common to each other to provide one of the circuit output terminals while the collectors of the transistors Q63 and Q64 are connected in common to each other to provide the other one of the circuit output terminals. The circuit output currents I+ and I− are caused to flow through the one and the other circuit output terminals, respectively.

The bases of the transistors Q63 and Q64 are connected in common to each other to provide a reference input terminal. The transistor Q61 has the base connected to one circuit input terminal while the transistor Q62 has the base connected to the other circuit input terminal.

A half voltage (½)$V_{LO}$ of the local signal voltage $V_{LO}$ is given across the one circuit input terminal and the reference input terminal while a half voltage (−½)$V_{LO}$ of the local signal voltage $V_{LO}$ is supplied between the other circuit input terminal and the reference input terminal.

The differential circuit output current $\Delta I$ which is represented by (I+−I−) is given by:

$$\Delta I = \alpha_F I_o \left\{ 1 - \text{sech}^2\left(\frac{V_{LO}}{4V_T}\right) \right\}. \quad (49)$$

Figure 34:
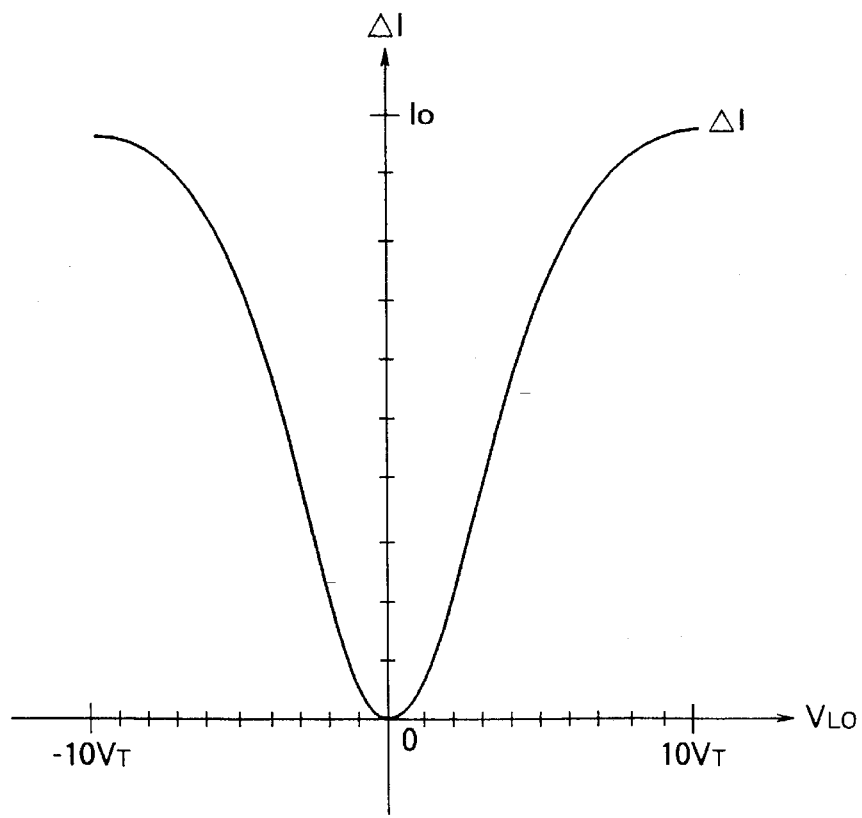
FIG. 34 shows a transfer characteristic of the squaring circuit illustrated in FIG. 33.

In FIG. 34, a transfer characteristic of the squaring circuit 413 is illustrated which exhibits a relationship between the local signal voltage $V_{LO}$ and the differential circuit output current $\Delta I$ taken along the abscissa and the ordinate, respectively. As is apparent from FIG. 34, a squaring characteristic can be obtained by the squaring circuit 413 when the local signal voltage $V_{LO}$ is restricted within a range of $\pm 2V_T$. Therefore, the quadritail cell illustrated in FIG. 32 can be used as the squaring circuit 41 illustrated in FIG. 29 and serves to form the frequency multiplier and mixing circuit with AGC when the transistor circuit 42 and the constant current circuit are combined with the quadritail cell.

Figure 35:
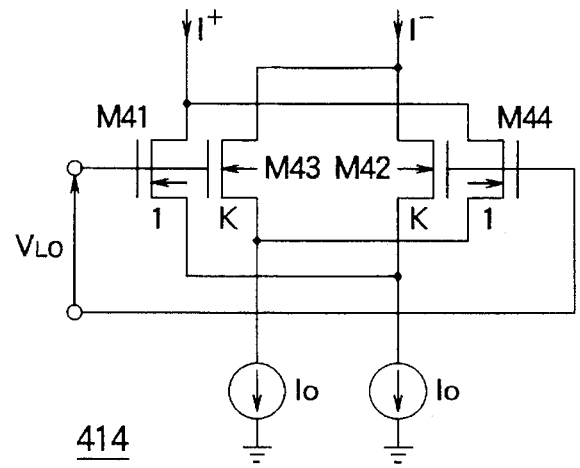
FIG. 35 is a circuit diagram of a squaring circuit which is usable in the electronic circuit illustrated in FIG. 29.

Referring to FIG. 35, a squaring circuit 414 is also used as the squaring circuit 41 illustrated in FIG. 29 and comprises four MOS transistors M41, M42, M43, and M44 which form a combination of unbalanced differential transistor pairs, as shown in FIG. 35, and which are manufactured by the use of a Bi-CMOS process. More particularly, the illustrated squaring circuit 414 substantially becomes equal to that illustrated in FIG. 30 by replacing the bipolar transistors Q41 to Q44 of FIG. 30 by the MOS transistors M41 to M44. One of the unbalanced differential transistor pairs comprises the MOS transistors M41 and M42 having drains which are connected in common to each other and which are also connected to one constant current source Io while the other one of the unbalanced differential transistor pairs comprises the MOS transistors M43 and M44 having the drains which are connected in common to each other and which are connected to another constant current source Io. In addition, the gates of the MOS transistors M41 and M43 are connected in common to each other to provide a circuit input terminal while the gates of the MOS transistors M42 and M44 are connected in common to each other to provide another circuit input terminal. The local signal voltage $V_{LO}$ is given across both the circuit input terminals.

In FIG. 35, it is to be noted that the gates of the transistors M42 and M43 are specified by a factor of K while the gates of the transistors M41 and M44 are specified by a factor of unity. Herein, the factor is representative of a ratio (W/L) of a gate width (W) to a gate length (L).

Furthermore, the source of the MOS transistor M41 is connected to the source of the MOS transistor M44 to provide one circuit output terminal. Likewise, the source of the MOS transistor M42 is connected to the source of the MOS transistor M43 to provide another circuit output terminal. With this structure, circuit output currents I+ and I− are caused to flow through the circuit output terminals, respectively, and a differential circuit output current $\Delta I$ (=I+−I−) is caused to flow across the circuit output terminals. Within a restricted range of the local signal voltage $V_{LO}$, the differential circuit output current $\Delta I$ is given by:

$$\Delta I = -2\frac{K-1}{K+1} Io + 4\frac{K(K-1)\beta}{(K+1)^2} V_{LO}^2, \quad (50)$$

where $|V_{LO}|$ is not greater than $\sqrt{Io/K\beta}$ and where in turn $\beta$ is representative of a conductance parameter and is given by:

$$\beta = \mu(C_{OX}/2)(W/L),$$

where $\mu$ represents an effective mobility; $C_{OX}$, a capacitance per unit area in a gate oxide film used in each MOS transistors M41 to M44.

Figure 36:
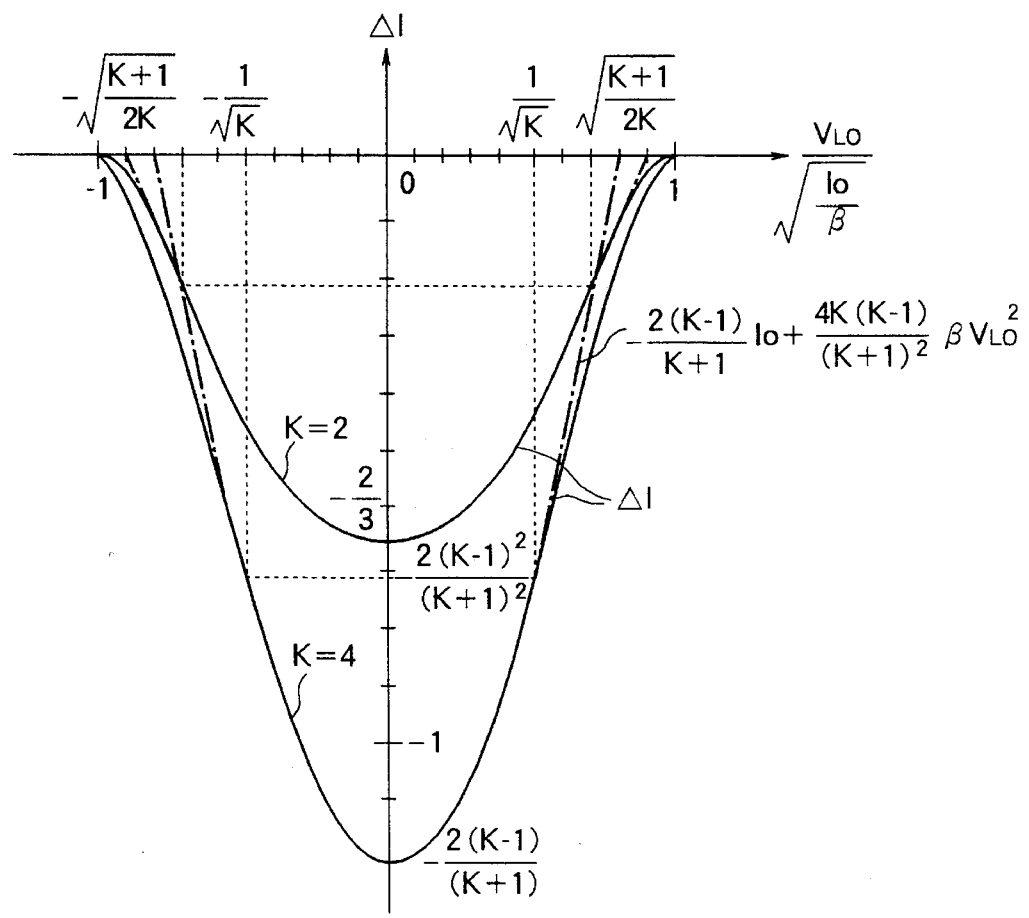
FIG. 36 shows transfer characteristics of the squaring circuit illustrated in FIG. 35.

In FIG. 36, transfer characteristics of the squaring circuit 414 are shown by using the factor K as a parameter. When the MOS transistors are used in the squaring circuit 414, an input range of the local signal voltage $V_{LO}$ for an ideal squaring characteristic is determined by selecting the transconductance parameter $\beta$, namely, a product of K and the current Io. By using the MOS transistors, it is possible to widen the input range of a small approximate error in comparison with the squaring characteristic obtained by the squaring circuit illustrated in FIG. 30. Thus, the squaring circuit 414 also serves to form the frequency multiplier and mixing circuit with AGC by a combination of the transistor circuit 42 and the constant current circuit illustrated in FIG. 29.

Figure 37:
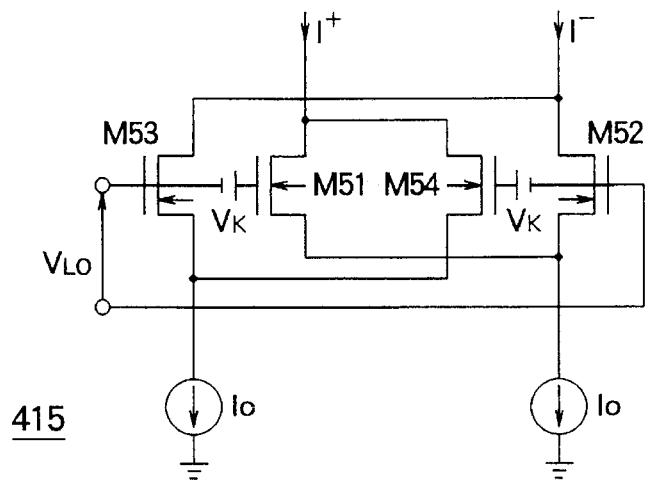
FIG. 37 is a circuit diagram of yet another squaring circuit that is also usable in the electronic circuit illustrated in FIG. 29.

Referring to FIG. 37, a squaring circuit 415 is also used as the squaring circuit 41 illustrated in FIG. 29. In FIG. 37, it is noted that MOS transistors M51 to M54 are substituted for the bipolar transistors Q51 to Q54 illustrated in FIG. 32 and that the squaring circuit 415 is operated in a manner similar to that illustrated in FIG. 32 and can be established by a Bi-CMOS process.

Specifically, the offset voltage $V_K$ is impressed on the gates of the MOS transistors M51 and M54 while no offset voltage is impressed on the gates of the MOS transistors M52 and M53. The MOS transistors M51 and M52 which are supplied with the offset voltage $V_K$ and no offset voltage, respectively, have the sources connected in common to each other to provide a coupled transistor pair. Likewise, the MOS transistors M54 and M53 have the sources connected in common to each other to provide another coupled transistor pair. The drains of the MOS transistors M51 and M52 in one transistor pair are cross connected to the drains of the MOS transistors M54 and M53 in another transistor pair.

At any rate, the differential circuit output current $\Delta I$ appears across circuit output terminals like in the remaining figures.

Figure 38:
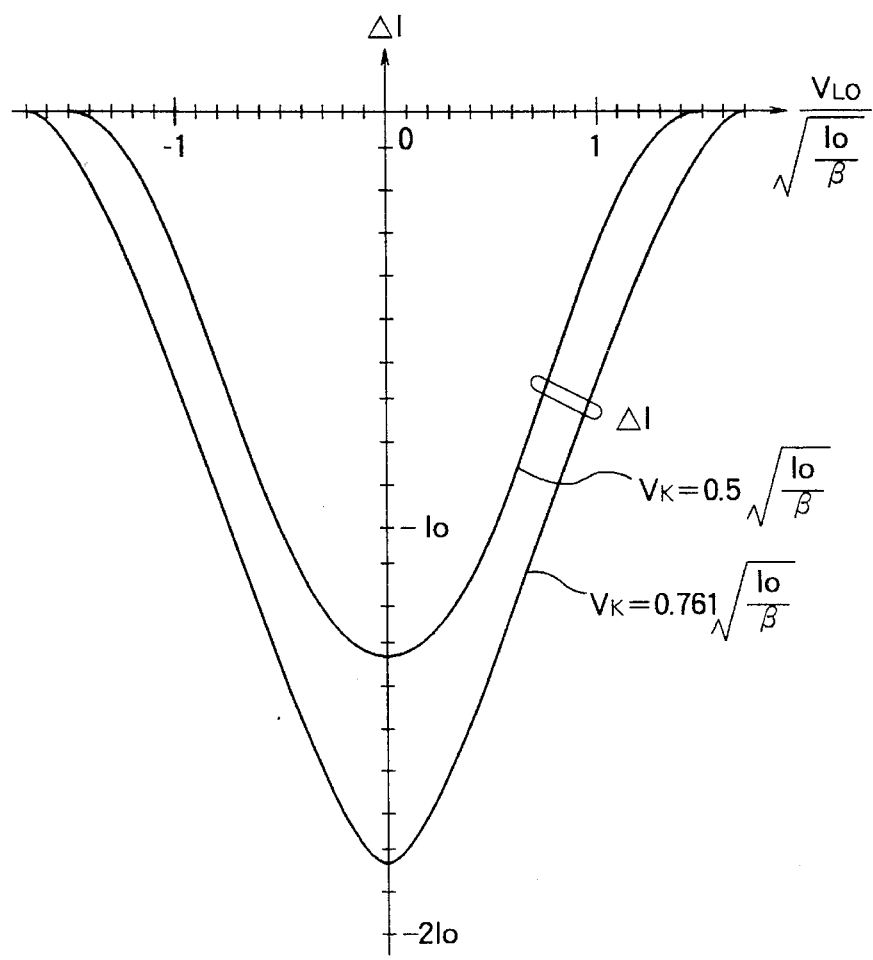
FIG. 38 shows transfer characteristics of the squaring circuit illustrated in FIG. 37.

In FIG. 38, the differential circuit output current $\Delta I$ of the squaring circuit 415 is given by:

$$\Delta I = \beta(V_{LO} - V_K)\sqrt{\frac{2Io}{\beta} - (V_{LO} - V_K)^2} - \quad (51)$$

$$\beta(V_{LO} + V_K)\sqrt{\frac{2Io}{\beta} - (V_{LO} + V_K)^2},$$

on the assumption that the local signal voltage $V_{LO}$ falls within the input range wherein $|V_{LO}|$ is not greater than $\sqrt{Io/K\beta} - V_K$.

In addition, Equation (51) is approximately rewritten into:

$$\Delta I \approx -2\sqrt{2\beta Io}\ V_K \left\{ 1 - \left(1 - \frac{1}{\sqrt{2}}\right)\frac{\beta}{Io}(V_K^2 + V_{LO}^2) \right\}. \quad (52)$$

From Equation (52), it is readily understood that the differential circuit output current $\Delta I$ exhibits a squaring characteristic in relation to the input or local signal voltage $V_{LO}$. According to Equation (52), it is possible to obtain an excellent approximation characteristic because an approximation error is very small.

In FIG. 38, the transfer characteristic of the squaring circuit 415 is illustrated wherein the factor K is used as a parameter. Thus, it is possible to form the frequency multiplier and mixing circuit with AGC by using the squaring circuit 415 illustrated in FIG. 37.

Figure 39:
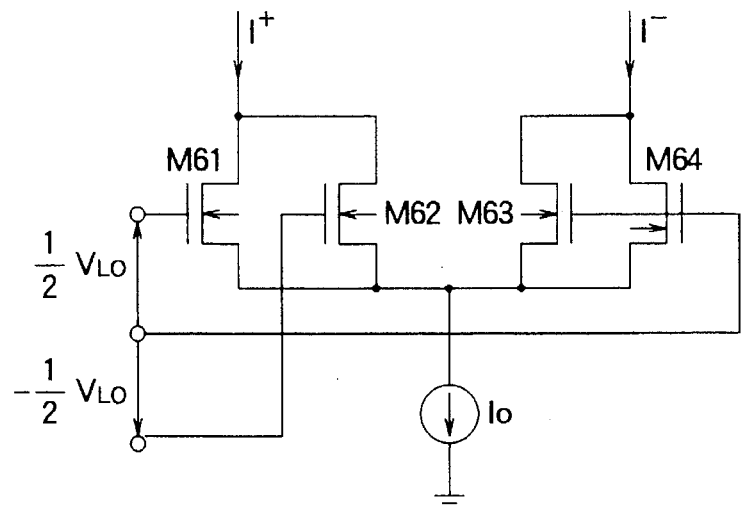
FIG. 39 is a circuit diagram of still another squaring circuit that is usable in the electronic circuit illustrated in FIG. 29.

Referring to FIG. 39, another squaring circuit 416 is formed by substituting MOS transistors M61 to M64 for the bipolar transistors Q61 to Q64 and is realized by a Bi-CMOS process. Specifically, the MOS transistors M61 to M64 have the sources which are connected in common to one another and which are connected to a single constant current source operable as the constant current circuit. Thus, the four MOS transistors M61 to M64 are driven by a single constant current Io sent from the constant current source and form a quadritail cell. In addition, the drains of the MOS transistors M61 and M62 are connected in common to each other to provide one of the circuit output terminals while the drains of the MOS transistors M63 and M64 are connected in common to each other to provide another circuit output terminal. Like in the other figures, circuit output currents I+ and I− are caused to flow through both the circuit output terminals. In this connection, the differential circuit output current $\Delta I$ is caused to flow across the circuit output terminals.

Furthermore, the gate of the MOS transistor M61 is connected to one of the circuit input terminals while the gate of the MOS transistor M62 is connected to another one of the circuit input terminals. Additionally, the gates of the transistors M63 and M64 are connected in common to each other to be connected to the reference input terminal.

A half voltage (½ $V_{LO}$) of the local signal voltage $V_{LO}$ is given across the reference input terminal and the one of the circuit input terminals while another half voltage (−½ $V_{LO}$) of the local signal voltage $V_{LO}$ is given across another circuit input terminal and the reference input terminal.

With this structure, the differential circuit output current $\Delta I$ is given by:

$$\Delta I = \frac{\beta}{2} V_{LO}^2 \left( \text{where } |V_{LO}| \leq \sqrt{\frac{2I_o}{3\beta}} \right), \quad (53)$$

when an absolute value of the local signal voltage $V_{LO}$ is not greater than $\sqrt{2I_o/3\beta}$.

Figure 40:
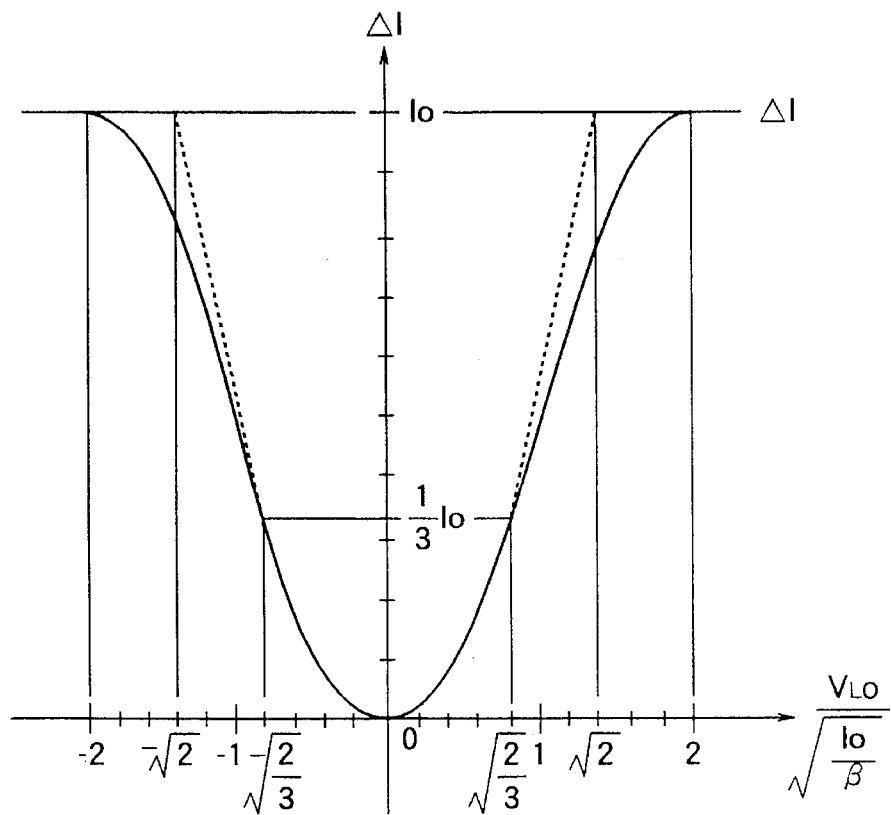
FIG. 40 shows a transfer characteristic of the squaring circuit illustrated in FIG. 39.

FIG. 40 shows the transfer characteristic represented by Equation (53). From FIG. 40, a squaring characteristic can be also obtained by the squaring circuit 416 illustrated in FIG. 39 when the input range is restricted. Thus, the illustrated quadritail cell serves to form the frequency multiplier and mixing circuit when it is combined with the transistor circuit 42 and the constant current circuit.

Figure 41:
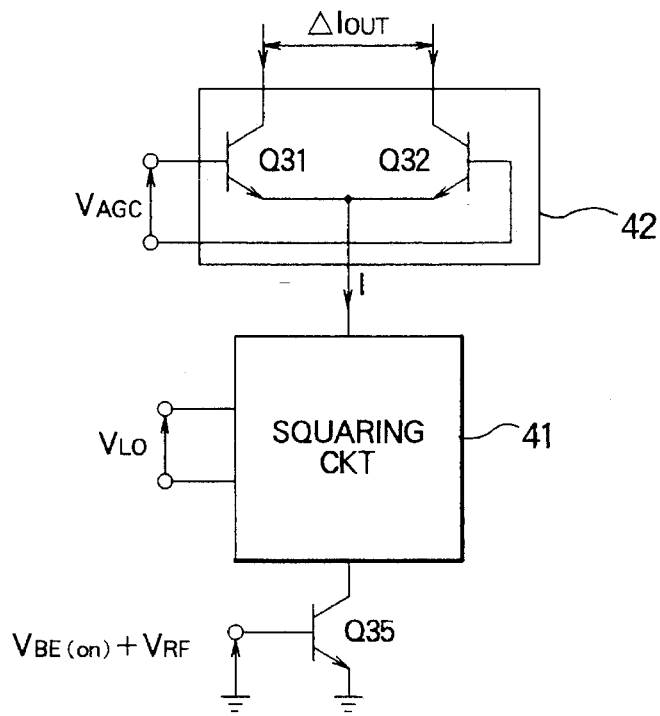
FIG. 41 is a block diagram of an electronic circuit according to a thirteenth embodiment of this invention.

Referring to FIG. 41, an electronic circuit according to a thirteenth embodiment of this invention is operable as the frequency multiplier and mixing circuit with AGC and is similar in structure to that illustrated in FIG. 29 except that the transistor circuit 42 is composed of a pair of transistors Q31 and Q32 having the emitters connected in common to each other. In the illustrated example, the AGC control voltage $V_{AGC}$ is supplied between both the bases of the transistors Q31 and Q32 while the differential output current $\Delta I_{OUT}$ is developed across both the collectors of the transistors Q31 and Q32. The illustrated transistor circuit 42 is driven by a circuit output current I produced by the squaring circuit 41 connected to the constant current circuit specified by the single transistor Q35. Like in FIG. 29, the base of the single transistor Q35 is given the base voltage $V_{BE(on)}$ and the high frequency voltage $V_{RF}$ superposed on the base voltage $V_{BE(on)}$.

With this structure, the differential output current $\Delta I_{OUT}$ is given by:

$$\Delta I_{OUT} = \alpha_F I \tanh \left( \frac{V_{AGC}}{2V_T} \right). \quad (54)$$

Herein, it is to be noted that the circuit output current I of the squaring circuit 41 is given by either one of the circuit output currents I+ and I− shown in FIGS. 30, 32, 33, 35, 37, and 39 and is represented by:

$$I = \frac{I_E \pm \Delta I}{2}, \quad (55)$$

where $I_E$ representative of a total sum of tail currents and $\Delta I$, the differential circuit output current.

Since the circuit output current $\Delta I$ dominantly includes a frequency component ($2f_{LO}$) equal to twice the local oscillator frequency $f_{LO}$, as mentioned before, the circuit output current $\Delta I$ is specified by the term of:

$$\cos(2\pi(2f_{LO})t) \cos(2\pi f_{RF} t). \quad (56)$$

As already described before, the formula 56 can be represented by Equation (47) which is composed of the sum and the difference frequency components between the double frequency ($2f_{LO}$) of the local oscillator frequency and the high frequency ($f_{RF}$). Thus, the electronic circuit illustrated in FIG. 41 is also operable as the frequency multiplier and mixing circuit with AGC.

Figure 42:
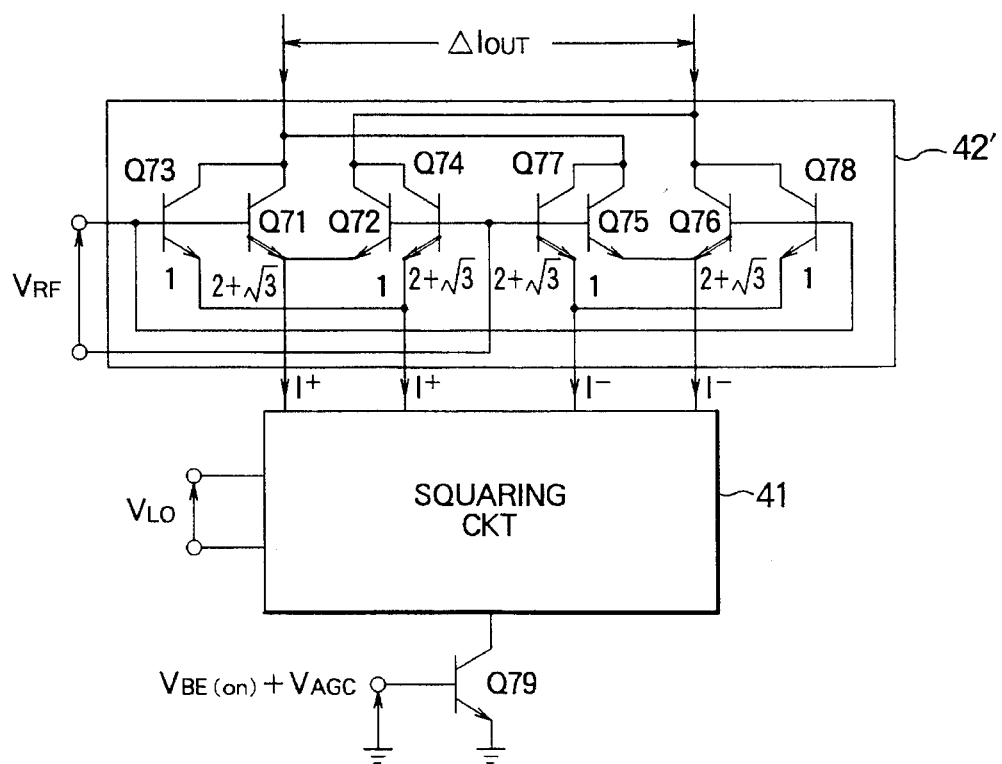
FIG. 42 is a block diagram of an electronic circuit according to a fourteenth embodiment of this invention.

Referring to FIG. 42, an electronic circuit according to a fourteenth embodiment of this invention is also operated as the frequency multiplier and mixing circuit with AGC and comprises a transistor circuit 41' different from that illustrated in FIGS. 29 and 41. The illustrated transistor circuit 42' is supplied with the high frequency voltage $V_{RF}$ to produce the differential output current $\Delta I_{OUT}$ across output terminals. Specifically, the transistor circuit 42' comprises four emitter-coupled bipolar transistor pairs, such as Q71 and Q72; Q73 and Q74; Q75 and Q76; and Q77 and Q78. The transistors Q71 and Q72; Q73 and Q74; Q75 and Q76; and Q77 and Q78 of each transistor pair have the emitter area of 1:2±√3, as shown in FIG. 42. Precisely, each emitter area ratio of the transistors Q72 and Q71; Q73 and Q74; Q75 and Q76; and Q78 and Q77 is represented by 1:2±√3. In two of the emitter-coupled pairs, for example, (Q71 and Q72) and (Q73 and Q74), selected from the four emitter-coupled pairs, the bases of the transistors, such as Q71 and Q73; Q72 and Q74, which belong to different emitter-coupled pairs and which have different emitter areas are connected in common to each other. Likewise, the collectors of the transistors, such as Q71 and Q73; Q72 and Q74, as mentioned above, are also connected in common to each other. This means that a pair of common input and a pair of output terminals formed by the bases and the collectors of the transistors Q71 and Q73; Q72 and Q74 are connected in common to each other, as shown in FIG. 42. Thus, a first set of the four transistors Q71 to Q74 is formed in the above-mentioned manner.

Like in the first set of the transistors Q71 and Q73; Q72 and Q74, the bases and the collectors of the transistors Q75 and Q77; Q76 and Q78 are connected in common to each other to provide a second set of the four transistors Q75 to Q78 and to consequently provide a pair of common input terminals and a pair of common output terminals of the second set.

In addition, one of the common input terminals in the first set is connected to one of the common input terminals in the second set while the other one of the common input terminals in the first set is connected to the other one of the common input terminals in the second set. Specifically, the bases of the transistors Q71 and Q73 in the first set are connected to the bases of the transistors Q76 and Q78 in the second set to provide a first high frequency input terminal while the bases of the transistors Q72 and Q74 are connected to the bases of the transistors Q75 and Q77 to provide a second high frequency input terminal. The high frequency voltage $V_{RF}$ is given across the first and the second high frequency input terminals.

On the other hand, the common output terminals, namely, the collectors of the transistors Q71 and Q73 are connected to the collectors of the transistors Q75 and Q77 to provide one of the output terminals while the collectors of the transistors Q72 and Q74 in the first set are connected to the collectors of the transistors Q76 and Q78 to provide the other one of the output terminals. This shows that the output terminals of the first set are cross connected to the output terminals of the second set to provide a pair of the output terminals across which the output current $\Delta I_{OUT}$ appears.

The common connected emitters of the four emitter-connected transistor pairs are connected to the squaring circuit 41 which is connected to the constant current circuit specified by a single bipolar transistor Q79. In FIG. 42, the squaring circuit 41 is given the local signal voltage $V_{LO}$ to supply circuit output currents to the common connected emitters of the four emitter-connected transistor pairs. The squaring circuit 41 may be structured either by the use of a pair of the squaring circuits selected from those illustrated in FIGS. 30, 32, 33, 35, 37, and 39 or by the use of a single squaring circuit selected from the above-mentioned squaring circuits. At any rate, it is assumed that the differential circuit output current ΔI given by I+−I− is supplied to the transistor circuit 42' structured by the transistors Q71 to Q78.

In the constant current circuit, the illustrated transistor Q79 has the emitter grounded, the collector connected to the squaring circuit 41, and the base which is supplied with the base voltage $V_{BE(on)}$ and the AGC control voltage $V_{AGC}$ superposed on the base voltage $V_{BE(on)}$.

With this structure, when the differential circuit output current ΔI is given to the transistor circuit 42', the differential output current $\Delta I_{OUT}$ is represented by:

$$\Delta I_{OUT} = \alpha_F(\Delta I)\left[\tanh\left\{\frac{V_{RF}}{2V_T} + \frac{\ln(2\pm\sqrt{3})}{2}\right\} + \tanh\left\{\frac{V_{RF}}{2V_T} - \frac{\ln(2\pm\sqrt{3})}{2}\right\}\right] \quad (57)$$

$$= \frac{\sinh\left(\frac{V_{RF}}{V_T}\right)\alpha_F\Delta I}{\cosh\left(\frac{V_{AGC}}{V_T}\right)+2}.$$

From Equation (57), it is understood that the electronic circuit shown in FIG. 42 is also operable as the frequency multiplier and mixing circuit with AGC.

Figure 43:
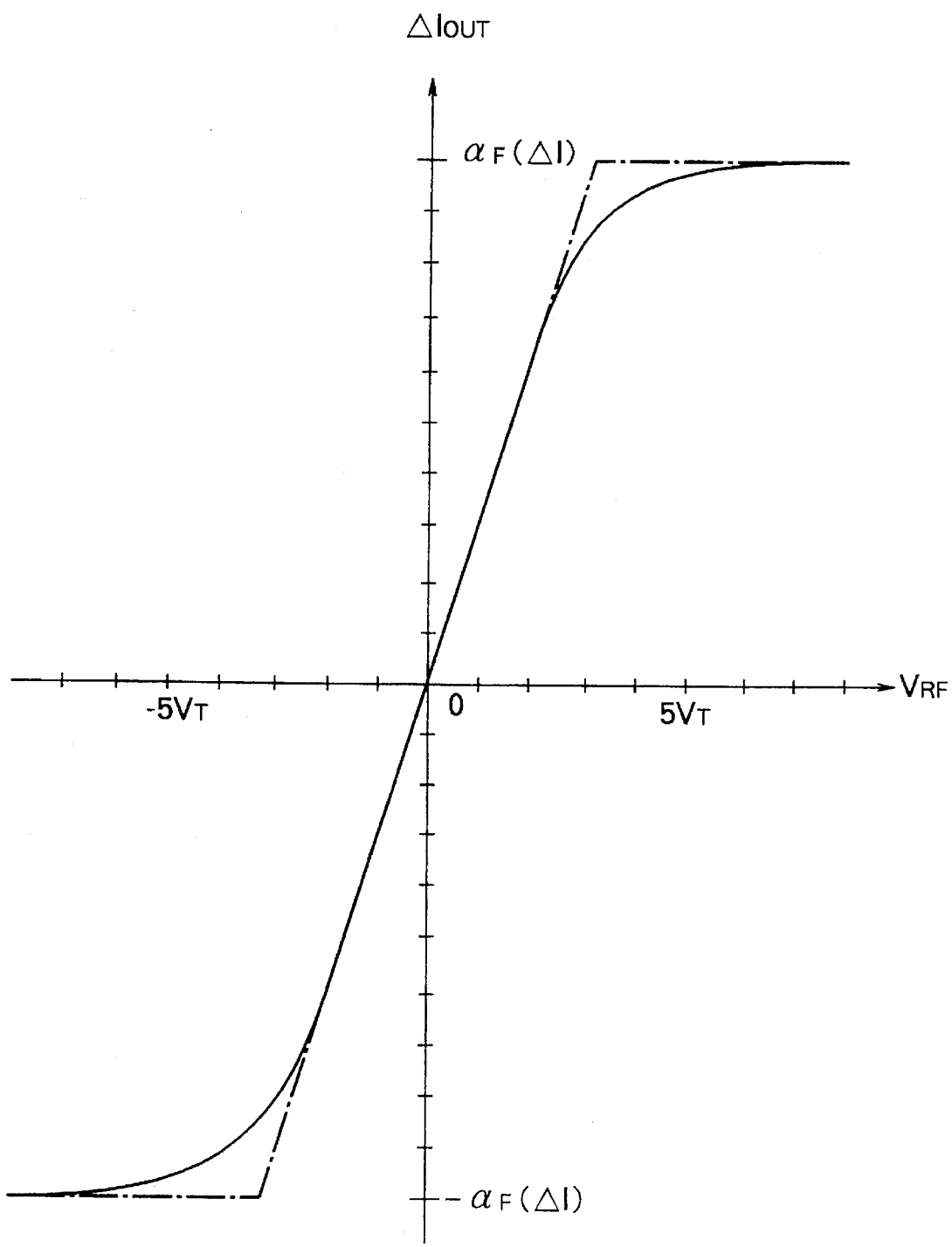
FIG. 43 shows a transfer characteristic of a transistor circuit illustrated in FIG. 42.
Figure 44:
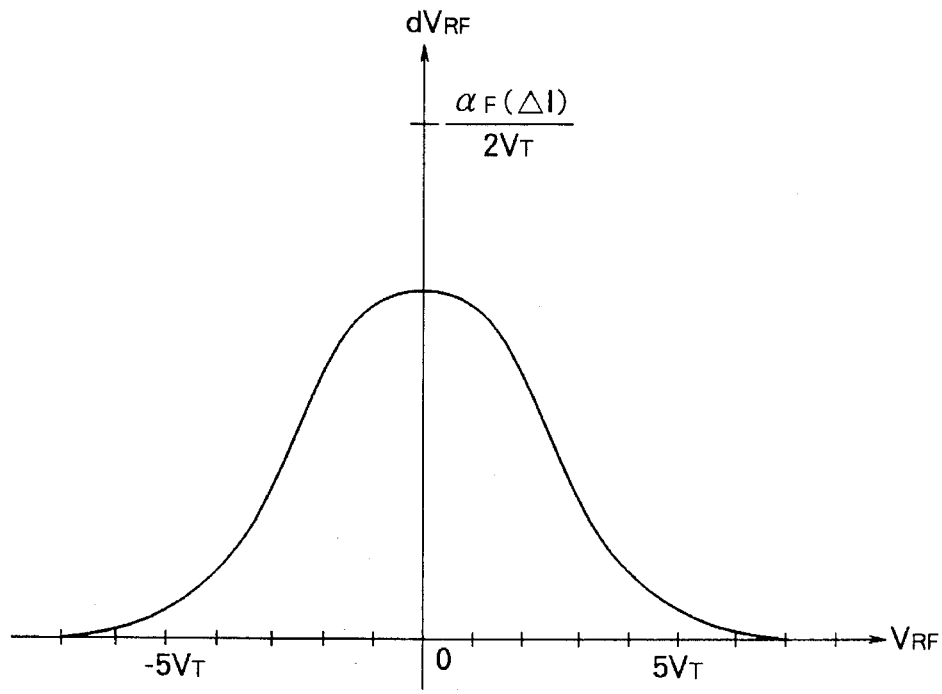
FIG. 44 shows a transconductance characteristic of the transistor circuit, illustrated in FIG. 42.

In FIG. 43, illustration is made as regards an transfer characteristic of the transistor circuit 42' which is composed of two sets of four cross-connected, emitter-coupled transistor pairs each of which has the emitter area ratio of 1:2± √3. In FIG. 44, a transconductance characteristic is shown in connection with the electronic circuit 42'. As readily understood from FIGS. 43 and 44, the transfer characteristics and the transconductance characteristic are improved in linearity in comparison with the electronic circuit formed by balanced differential pairs. Therefore, when the high frequency voltage $f_{RF}$ is supplied to the transistor circuit 42', a third order distortion can be improved on operating the electronic circuit as a mixer.

The AGC control voltage $V_{AGC}$ and the high frequency voltage $V_{RF}$ may be given to the transistor circuit 42' and the constant current circuit, respectively, like in the other figures.

Figure 45:
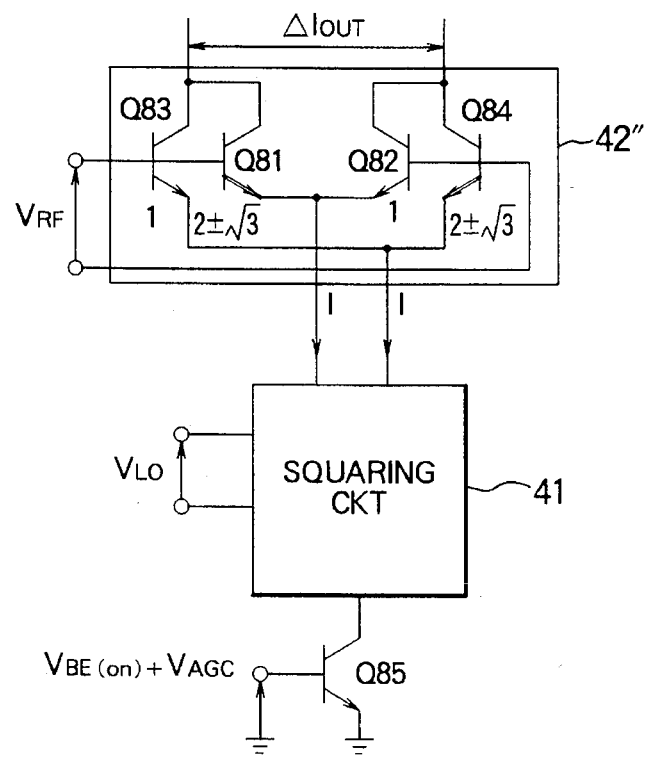
FIG. 45 is a block diagram of an electronic circuit according to an eighteenth embodiment of this invention.

Referring to FIG. 45, an electronic circuit according to an eighteenth embodiment of this invention also serves as the frequency multiplier and mixing circuit with AGC and comprises a single set of four transistors Q81 to Q84 composed of two emitter-coupled transistor pairs (Q81 and Q82); (Q83 and Q84). Like in FIG. 42, each transistor pair Q81 and Q82; Q83 and Q84 is formed by the transistors Q81 and Q82 specified by the emitter area ratio of 2±√3:1 and by the transistors Q83 and Q84 specified by the emitter area ratio of 1:2±√3. The common connected emitters of the transistors Q81 and Q82 and the transistors Q83 and Q84 are connected to the squaring circuit 41. The bases and the collectors of the transistors, such as Q81 and Q83; Q82 and Q84, which belong to different transistor pairs are connected in common to each other, as shown in FIG. 45. The high frequency voltage $V_{RF}$ is given between the common connected bases of the transistors Q81 and Q83 and the common connected bases of the transistors Q82 and Q84.

The illustrated transistor circuit 42'' is driven by the circuit output currents produced by the squaring circuit 41 to produce the differential output current ΔI. The squaring circuit 41 which is supplied with the local signal voltage $V_{LO}$ may be implemented by each of the squaring circuits illustrated before, like in FIG. 42. The squaring circuit 41 is connected to a constant current circuit specified by a single transistor Q85 given a superposition of the base voltage $V_{BE(on)}$ and the AGC control voltage $V_{AGC}$.

With this structure, when the circuit output current I is given from the squaring circuit 41 to the transistor circuit 42'', the differential output current $\Delta I_{OUT}$ is represented by:

$$\Delta I_{OUT} = \frac{\sinh\left(\frac{V_{RF}}{V_T}\right)\alpha_F I}{\cosh\left(\frac{V_{AGC}}{V_T}\right)+2}. \quad (58)$$

From Equation (58), it is apparent that the illustrated electronic circuit can act as the frequency multiplier and mixing circuit with AGC. In addition, the electronic circuit illustrated in FIG. 45 enables improvement of linearity, like in FIG. 42.

As shown in FIGS. 29 to 45, the transistor circuit and the squaring circuit are structured by stacking only two stages of transistors except the constant current circuit. This brings about a reduction of a source voltage. Specifically, it has been confirmed that the electronic circuits are operated by the source voltage less than 3 volts.

While this invention has thus far been described in conjunction with more than ten embodiments thereof, it will be readily possible for those skilled in the art to put this invention into practice in various other manners. For example, the MOS transistors may be substituted for the bipolar transistors in the transistor circuits 42 illustrated in FIGS. 29, 41, 42, and 45. In addition, a cubic circuit, a biquadratic circuit, and the like might be used to obtain a frequency component equal to three times, four times, and the like the local oscillator frequency signal or the high frequency signal. Another control signal except the AGC control voltage $V_{AGC}$ may be impressed to form a tunable electronic circuit.

What is claimed is:

1. A frequency multiplier and mixing circuit supplied with a local oscillator frequency signal of a local oscillator frequency and an input signal of an input frequency to produce an output signal which includes a frequency component specified by at least one of a sum and a difference between an integral multiple of said local oscillator frequency and said input frequency, said circuit comprising:

a squaring circuit supplied with said local oscillator frequency signal for squaring said local oscillator frequency signal to produce a circuit output signal in the form of a differential circuit output signal; and a cross-connected, emitter-coupled transistor circuit which is connected to said squaring circuit and supplied with said input signal and driven by said differential circuit output signal for producing said output signal in the form of a differential output current.

2. A frequency multiplier and mixing circuit as claimed in claim 1, wherein said cross-connected, emitter-coupled transistor circuit comprises:

first and second transistors having first and second emitters connected in common to each other to form one of common emitter terminals, first and second bases, and first and second collectors;

third and fourth transistors having third and fourth emitters connected in common to each other to form another one of the common emitter terminals, third and fourth bases, and third and fourth collectors;

the first and the third collectors being cross-connected in common to each other to provide one of output terminals while the second and the fourth collectors are cross-connected in common to each other to provide another one of the output terminals;

the first and the fourth bases being connected in common to each other to form an input terminal while the second and the third bases are connected in common to each other to form another input terminal;

said circuit output signal being given between the common emitter terminals while the input signal is given across the input terminals to produce said output signal between said output terminals.

3. A frequency multiplier and mixing circuit as claimed in claim 2, wherein said squaring circuit comprises:

first and second transistors which have first and second emitters connected in common to each other and specified by an emitter area ratio of K:1 and which have first and second bases and first and second collectors; and third and fourth transistors which have third and fourth emitters connected in common to each other and specified by an emitter area ratio of 1:K and which have third and fourth bases and third and fourth collectors;

said first and said third bases being connected in common to each other to provide one of input terminals while said second and said fourth bases are connected in common to each other to provide another one of said input terminals, said local oscillator frequency signal being given across said input terminals, said first and said fourth collectors being connected in common to the one of the common emitter terminals while said second and said third collectors are connected in common to the other one of the common-emitter terminals, said circuit output signal appearing across the common-emitter terminals while said output signal is developed across said output terminals in the form of a differential output current.

4. A frequency multiplier and mixing circuit as claimed in claim 2, wherein said squaring circuit comprises:

first, second, third, and fourth MOS transistors each of which has a gate, a source, and a drain, said gates of the first and the third MOS transistors being specified by a gate width to length of K:1 and connected in common to each other to provide one of circuit input terminals while the gates of the second and the fourth MOS transistors are specified by a gate width to length of 1:K and connected in common to each other to provide another circuit input terminal, said local oscillator frequency signal being given across the circuit input terminals, the drains of the first and the fourth MOS transistors being connected in common to each other while the drains of the second and the third MOS transistors are connected in common to each other, the sources of the first and the second MOS transistors are connected in common to one of the common-emitter terminals of the transistor circuit while the sources of the third and the fourth MOS transistors are connected in common to another common-emitter terminal to be given the circuit output signal across the common-emitter terminals.

5. A frequency multiplier and mixing circuit supplied with a local oscillator frequency signal of a local oscillator frequency and an input signal of an input frequency to produce an output signal which includes a frequency component specified by at least one of a sum and a difference between an integral multiple of said local oscillator frequency and said input frequency, said circuit comprising:

a squaring circuit supplied with said local oscillator frequency signal for squaring said local oscillator frequency signal to produce a circuit output signal in the form of a differential circuit output signal; and an emitter-coupled transistor circuit which is connected to said squaring circuit and supplied with said input signal and which is driven by said differential circuit output signal for producing said output signal in the form of a differential output current.

6. A frequency multiplier and mixing circuit as claimed in claim 5, wherein said emitter-coupled transistor circuit comprises:

first and second transistors which have first and second emitters connected in common to each other and specified by an emitter area ratio of $2\pm\sqrt{3}$ to provide a first emitter-common terminal and to form a first unbalanced transistor pair, first and second bases, and first and second collectors;

third and fourth transistors which have third and fourth emitters connected in common to each other and specified by the emitter area ratio of $1:2\pm\sqrt{3}$ to provide a second emitter-common terminal and to form a second unbalanced transistor pair, third and fourth bases, and third and fourth collectors;

the first and the third bases being connected in common to each other to provide one of input terminals while the second and the fourth terminals are connected in common to each other to provide another input terminal, said input signal being given between said input terminals, the first and the third collectors being connected in common to each other while the second and the fourth collectors are connected in common to each other to produce said output signal between the common-connected collectors.

7. A frequency multiplier and mixing circuit as claimed in claim 5, wherein said emitter-coupled transistor circuit comprises:

a first emitter-coupled transistor unit which comprises two pairs of unbalanced cross-connected, emitter-coupled transistors to provide first and second common-emitter terminals, each pair of the unbalanced cross-connected, emitter-coupled transistors being specified by an emitter area ratio of $1:2\pm\sqrt{3}$;

a second emitter-coupled transistor unit which comprises two pairs of unbalanced cross-connected, emitter-coupled transistors to provide third and fourth common-emitter terminals, each pair of the unbalanced cross-connected, emitter-coupled transistors being specified by the emitter area ratio of $1:2\pm\sqrt{3}$;

at least one of the first and the second common-emitter terminals and at least one of the third and the fourth common-emitter terminals being connected to the squaring circuit to drive said first and said second cross-connected, emitter-coupled transistor units by said differential circuit output current supplied from said squaring circuit.

8. A frequency multiplier and mixing circuit as claimed in claim 5, wherein said squaring circuit comprises transistors of a predetermined conductivity while the emitter-coupled transistor circuit comprises transistors of an inverse conductivity relative to the transistors of said squaring circuit.

9. A frequency multiplier and mixing circuit supplied with a local oscillator frequency signal of a local oscillator frequency and an input signal of an input frequency to produce an output signal which includes a frequency component specified by at least one of a sum and a difference between an integral multiple of said local oscillator frequency and said input frequency, said circuit comprising:

a squaring circuit supplied with said local oscillator frequency signal for squaring said local oscillator frequency signal to produce a circuit output signal; and first and second transistors having first and second emitters connected in common to said squaring circuit, first and second bases supplied with the input signal, and first and second collectors across which said output signal is produced in the form of a differential output signal.

10. A frequency multiplier and mixing circuit supplied with a local oscillator frequency signal of a local oscillator frequency and an input signal of an input frequency to produce an output signal which includes a frequency component specified by at least one of a sum and a difference between an integral multiple of said local oscillator frequency and said input frequency, said circuit being also tunable in response to a predetermined control signal and comprising:

a constant current circuit supplied with a bias signal and a selected one of said input signal and said predetermined control signal;

a squaring circuit supplied with said local oscillator frequency signal and connected to said constant current circuit for producing a circuit output current; and a transistor circuit supplied with the remaining one of said input signal and said predetermined control signal for producing said output signal controlled by said predetermined control signal.

11. A frequency multiplier and mixing circuit as claimed in claim 10, wherein said squaring circuit produces said circuit output current in the form of a differential circuit output current which appears across circuit output terminals.

12. A frequency multiplier and mixing circuit as claimed in claim 11, wherein said transistor circuit comprises:

a cross-connected, emitter-coupled transistor circuit supplied with the remaining one of the input signal and the predetermined control signal for producing said output signal in the form of a differential output current depending on said predetermined control signal.

13. A frequency multiplier and mixing circuit as claimed in claim 12, wherein said cross-connected, emitter-coupled transistor circuit comprises:

first and second transistors having first and second emitters connected in common to one of the circuit output terminals, first and second bases, and first and second collectors; and third and fourth transistors having third and fourth emitters connected in common to the other one of the circuit output terminals, third and fourth bases, and third and fourth collectors;

the first and the fourth bases being connected in common to each other to provide one of input terminals while the second and the third bases are connected in common to each other to provide the other one of the input terminals, the first and the third collectors being connected in common to each other to provide one of the output terminals while the second and the fourth collectors are connected in common to each other to provide the other one of the output terminals, the remaining one of the input signal and the predetermined control signal being given across said input terminals while said differential output current is produced between the output terminals.

14. A frequency multiplier and mixing circuit as claimed in claim 11, wherein said transistor circuit comprises:

first and second transistors having first and second emitters connected in common to the one of the circuit output terminals and specified by an emitter area ratio of $2\pm\sqrt{3}:1$, first and second bases, and first and second collectors; and third and fourth transistors having third and fourth emitters connected in common to the other one of the circuit output terminals and specified by the emitter area ratio of $1:2\pm\sqrt{3}$, third and fourth bases, and third and fourth collectors;

the first and the third bases being connected in common to each other while the first and the third collectors are also connected in common to each other to provide one of the output terminals, the third and the fourth bases being connected in common to each other while the third and the fourth collectors are also connected in common to each other to provide the other output terminal, said output signal appearing across the output terminals in the form of a differential output current.

15. A frequency multiplier and mixing circuit as claimed in claim 10, wherein said squaring circuit has first, second, third, and fourth circuit output terminals through which said circuit output current is caused to flow as first, second, third, and fourth circuit output currents, respectively.

16. A frequency multiplier and mixing circuit as claimed in claim 15, wherein said transistor circuit comprises:

a first emitter-coupled transistor unit comprising first and second emitter-coupled transistor pairs which are connected to said first and said second circuit output terminals and which define one of output terminals; and a second emitter-coupled transistor unit comprising third and fourth emitter-coupled transistor pairs which are connected to said third and said fourth circuit output terminals and which define another output terminal.

17. A frequency multiplier and mixing circuit as claimed in claim 16, wherein said first emitter-coupled transistor pair comprises:

first and second transistors which have first and second emitters connected in common to said first circuit output terminal and specified by an emitter area ratio of $2\pm\sqrt{3}$, first and second bases, and first and second collectors; and third and fourth transistors which have third and fourth emitters connected in common to said second circuit output terminal and specified by the emitter area ratio of $1:2\pm\sqrt{3}$, third and fourth bases connected in common to said first and said second bases to provide one and the other input terminals, respectively, and third and fourth collectors connected in common to said first and said second collectors, respectively;

said second emitter-coupled transistor pair comprising:

fifth and sixth transistors which have fifth and sixth emitters connected in common to said fourth circuit output terminal and specified by the emitter area ratio of $1:2\pm\sqrt{3}$, fifth and sixth bases, and fifth and sixth collectors; and seventh and eighth transistors which have seventh and eighth emitters connected in common to said third circuit output terminal and specified by the emitter area ratio of $2\pm\sqrt{3}$, seventh and eighth bases connected in common to said fifth and said sixth bases, respectively, and seventh and eighth collectors connected in common to said fifth and said sixth collectors, respectively;

the seventh and the fifth bases being connected to the other input terminal while the sixth and the eighth bases are connected to the one input terminal, the first and the third collectors being connected to the fifth and the seventh collectors to provide the one output terminal while the second and the fourth collectors are connected to the sixth and the eighth collectors to provide another output terminal.

18. A frequency multiplier and mixing circuit as claimed in claim 10, wherein said predetermined control signal is an automatic gain control signal.

19. A frequency multiplier and mixing circuit as claimed in claim 10, wherein said squaring circuit is supplied with said local oscillator frequency signal to produce the output signal through a circuit output terminal.

20. A frequency multiplier and mixing circuit as claimed in claim 15, wherein said transistor circuit comprises:

first and second transistors which have first and second emitters connected in common to said circuit output terminal, first and second bases supplied with the remaining one of the input signal and the predetermined control signal, and first and second collectors across which the output signal appears in the form of a differential output current.

21. A frequency multiplier and mixing circuit supplied with a local oscillator frequency signal of a local oscillator frequency and an input frequency signal of an input frequency to produce an output signal which includes a frequency component specified by at least one of a sum and a difference between an integral multiple of said local oscillator frequency and said input frequency, said circuit comprising:

a constant current circuit which is supplied with a bias voltage and said input frequency signal superposed on said bias voltage; and a squaring circuit connected to said constant current circuit and supplied with said local oscillator frequency signal for squaring said local oscillator frequency signal to produce said output signal;

said squaring circuit comprising:

first, second, third and fourth transistors having first, second, third and fourth emitters connected in common to said constant current circuit, first, second, third and fourth bases, and first, second, third and fourth collectors;

the first and the second collectors being connected in common to each other to provide one of output terminals while the third and the fourth collectors are connected in common to each other to provide another one of the output terminals;

said output signal being developed across said output terminals in the form of a differential output current;

the third and the fourth bases being connected in common to each other to provide a reference input terminal while the first base and the second base provide one and the other reference input terminals;

the one and the reference input terminals being given a half of a local oscillator frequency voltage while the other and the reference input terminals are given another half of the local frequency voltage.

22. A frequency multiplier and mixing circuit as claimed in claim 21, wherein said integral multiple of the local oscillator frequency is equal to two.

23. A frequency multiplier and mixing circuit as claimed in claim 21, wherein said constant current circuit comprises a transistor which has an emitter grounded, a base supplied with the bias voltage and the input signal superposed on said bias voltage.

\* \* \* \* \*